(12) United States Patent
Akune et al.

(10) Patent No.: US 6,941,333 B2
(45) Date of Patent: Sep. 6, 2005

(54) DIGITAL SIGNAL PROCESSING APPARATUS AND METHOD

(75) Inventors: Makoto Akune, Tokyo (JP); Yasuhiro Ogura, Kanagawa (JP)

(73) Assignee: Sony Corporation, Tokyo (JP)

( * ) Notice: Subject to any disclaimer, the term of this patent is extended or adjusted under 35 U.S.C. 154(b) by 624 days.

(21) Appl. No.: 10/079,800

(22) Filed: Feb. 20, 2002

(65) Prior Publication Data

US 2002/0121999 A1 Sep. 5, 2002

(30) Foreign Application Priority Data

Feb. 23, 2001 (JP) .................................. P2001-049268

(51) Int. Cl.[7] .......................... G06F 17/17; G06F 17/10
(52) U.S. Cl. .................................... 708/313; 708/300
(58) Field of Search ................................. 708/300, 313, 708/306, 270, 290

(56) References Cited

U.S. PATENT DOCUMENTS

| | | | | |
|---|---|---|---|---|
| 5,212,659 A | * | 5/1993 | Scott et al. | 708/313 |
| 5,541,866 A | * | 7/1996 | Sato et al. | 708/323 |
| 5,719,571 A | * | 2/1998 | Akune et al. | 708/313 |
| 5,786,778 A | * | 7/1998 | Adams et al. | 708/313 |
| 5,892,694 A | * | 4/1999 | Ott | 708/313 |
| 5,903,857 A | * | 5/1999 | Behrens et al. | 708/300 |
| 6,255,975 B1 | * | 7/2001 | Swanson | 341/143 |

OTHER PUBLICATIONS

Adrian et al., A two-path bandpass delta-sum modulartor for digital IF extraction at 20 MHz, Dec. 1997, IEEE Journal of solid-state circuits, vol. 32, No. 12, pp. 1920-1934.*

Krzysztof et al., Effects of noise dither signals on differential linearity and effective resolution of sigma-delta A/C converters in measuring applications, May 1998, IEEE Instrumentation and Measurement Technology Conference, pp. 1229-1232.*

* cited by examiner

Primary Examiner—Todd Ingberg
Assistant Examiner—Chat C Do
(74) Attorney, Agent, or Firm—Jay H. Maioli

(57) ABSTRACT

A normalizer normalizes the power of a dither signal calculated by a power calculator based on the average power of a PCM signal in the range of 18 kHz to 20 kHz, wherein the average power is calculated by the power calculator. An oversampling processor oversamples the PCM signal with a quantization frequency of 44.1 kHz and a quantization word length of 16 bits, wherein the PCM signal is inputted from an input terminal at a sampling frequency of 2×44.1 kHz, and then supplies an output of the oversampling process to an adder. The adder adds the normalized output from the normalizer to the oversampling output from the oversampling processor, and then supplies the addition output to an oversampling processor.

25 Claims, 50 Drawing Sheets

DIGITAL SIGNAL PROCESSING APPARATUS AND METHOD

BACKGROUND OF THE INVENTION

The present invention relates to an apparatus and a method for digital signal processing that convert a PCM digital signal having a sampling frequency of fs (Hz) and a multi-bit as a quantization bit into a high-speed 1-bit digital signal having a sampling frequency of m (m is a positive integer ≧2)×n (n is a positive integer ≧2)×fs (Hz) and one bit as a quantization bit.

A ΔΣ modulated high-speed 1-bit audio signal has a format including a very high sampling frequency and a short data word length (for example a sampling frequency of 64 times 44.1 kHz and a data word length of 1 bit) as compared with a format of a PCM signal used in conventional digital audio (for example a sampling frequency of 44.1 kHz and a data word length of 16 bits). The ΔΣ modulated high-speed 1-bit audio signal has an advantage of a wide transmissible frequency range. Even with the 1-bit signal, the ΔΣ modulation makes it possible to obtain a wide dynamic range in an audio range of low frequencies relative to the 64× oversampling frequency. Taking advantage of this feature, the ΔΣ modulation can be applied to a recorder and data transmission for high-quality sound.

A ΔΣ modulator itself is not an especially novel technique; a ΔΣ modulator is a commonly used circuit within a conventional A/D converter or the like, because the circuit configuration is suitable for integration into an IC and the circuit can achieve a high A/D conversion precision relatively easily.

The ΔΣ modulated signal can be restored to an analog audio signal by passing the ΔΣ modulated signal through a simple analog low-pass filter.

Conventionally, when converting a PCM musical sound signal with a quantization frequency of 44.1 kHz and a quantization word length of 16 bits into a high-speed 1-bit audio signal with a quantization frequency of 2822.4 kHz (64×44.1 kHz) and a quantization word length of 1 bit, for example, only a PCM frequency range of up to 22.05 kHz is converted into a high-speed 1-bit audio signal by oversampling and ΔΣ modulation. Hence, a frequency range of the musical sound signal after the conversion is also up to 22.05 kHz, and thus a frequency range of the high-speed 1-bit audio signal of up to about 100 kHz is not used.

SUMMARY OF THE INVENTION

The present invention has been made in view of the above, and it is accordingly an object of the present invention to provide an apparatus and a method for digital signal processing that make it possible to make full use of the ample frequency range of the high-speed 1-bit audio signal and thereby obtain a high-quality audio signal.

In order to solve the above problem, according to the first aspect of the present invention, there is provided a digital signal processing apparatus for converting a first digital signal having a sampling frequency of fs (Hz) and a multi-bit as a quantization bit into a second digital signal having a sampling frequency of m (m is a positive integer ≧2)×n (n is a positive integer ≧2)×fs (Hz) and one bit as a quantization bit, the digital signal processing apparatus including a frequency analyzing means for subjecting the first digital signal inputted thereto to frequency analysis processing, a first noise level calculating means for calculating an average noise level of a predetermined range of the first digital signal on the basis of a result of the frequency analysis obtained by the frequency analyzing means, a dither generating means for generating a dither signal, which is a signal of high frequencies beyond an audible range, a second noise level calculating means for calculating a noise level of the dither signal generated by the dither generating means, a normalizing means for normalizing the noise level calculated by the second noise level calculating means on the basis of the average noise level calculated by the first noise level calculating means, a first oversampling means for oversampling the first digital signal at a sampling frequency of m (m is the positive integer ≧2)×fs (Hz, an adding means for adding the multi-bit digital signal oversampled by the first oversampling means to the dither signal whose noise level has been normalized by the normalizing means, a second oversampling means for oversampling an addition output of the adding means at a sampling frequency of n (n is the positive integer ≧2)×fs (Hz) and a ΔΣ modulating means for converting a multi-bit digital signal oversampled by the second oversampling means into a 1-bit digital signal.

Thus, the adding means supplies the second oversampling means with the addition output obtained by adding in a smooth manner the dither signal having the normalized noise level as the signal of high frequencies beyond the audible range to the multi-bit digital signal from the first oversampling means.

In order to solve the above problem, according to the second aspect of the present invention, there is provided a digital signal processing method for converting a first digital signal having a sampling frequency of fs (Hz) and a multi-bit as a quantization bit into a second digital signal having a sampling frequency of m (m is a positive integer ≧2)×n (n is a positive integer ≧2)×fs (Hz) and one bit as a quantization bit, the digital signal processing method including a frequency analyzing step for subjecting the inputted first digital signal to frequency analysis processing, a first noise level calculating step for calculating an average noise level of a predetermined range of the first digital signal on the basis of a result of the frequency analysis obtained by the frequency analyzing step, a second noise level calculating step for calculating a noise level of a dither signal generated by a dither generating means for generating the dither signal, which is a signal of high frequencies beyond an audible range, a normalizing step for normalizing the noise level calculated by the second noise level calculating step on the basis of the average noise level calculated by the first noise level calculating step, a first oversampling step for oversampling the first digital signal at a sampling frequency of m (m is the positive integer ≧2)×fs (Hz), an adding step for adding the multi-bit digital signal oversampled by the first oversampling step to the dither signal whose noise level has been normalized by the normalizing step, a second oversampling step for oversampling an addition output of the adding step at a sampling frequency of n (n is the positive integer ≧2)×fs (Hz) and a ΔΣ modulating step for converting a multi-bit digital signal oversampled by the second oversampling step into a 1-bit digital signal.

Thus, the adding step supplies the second oversampling step with the addition output obtained by adding in a smooth manner the signal of high frequencies beyond the audible range which signal has the normalized noise level to the multi-bit digital signal from the first oversampling step.

In order to solve the above problem, according to the third aspect of the present invention, there is provided a digital signal processing apparatus for converting a first digital signal having a sampling frequency of fs (Hz) and a multi-bit as a quantization bit into a second digital signal having a sampling frequency of m (m is a positive integer ≧2)×n (n is a positive integer ≧2)×fs (Hz) and one bit as a quantization bit, the digital signal processing apparatus including a frequency analyzing means for subjecting the first digital signal inputted thereto to frequency analysis processing, a first noise level calculating means for calculating an average noise level of a predetermined range of the first digital signal on the basis of a result of the frequency analysis obtained by the frequency analyzing means, spectrum generating means for generating a spectrum of a signal of high frequencies beyond an audible range on the basis of the result of the frequency analysis obtained by the frequency analyzing means, a second noise level calculating means for calculating a noise level of the spectrum generated by the spectrum generating means, a normalizing and waveform synthesizing means for normalizing the noise level of the spectrum calculated by the second noise level calculating means on the basis of the average noise level calculated by the first noise level calculating means, and synthesizing a temporal waveform signal based on the spectrum, a first oversampling means for oversampling the first digital signal at a sampling frequency of m (m is the positive integer ≧2)×fs (Hz), an adding means for adding the multi-bit digital signal oversampled by the first oversampling means to the signal of high frequencies beyond the audible range, the signal of high frequencies beyond the audible range having the noise level normalized by the normalizing and waveform synthesizing means and being synthesized into a waveform by the normalizing and waveform synthesizing means, a second oversampling means for oversampling an addition output of the adding means at a sampling frequency of n (n is the positive integer ≧2)×fs (Hz) and a ΔΣ modulating means for converting a multi-bit digital signal oversampled by the second oversampling means into a 1-bit digital signal.

In order to solve the above problem, according to the fourth aspect of the present invention, there is provided a digital signal processing method for converting a first digital signal having a sampling frequency of fs (Hz) and a multi-bit as a quantization bit into a second digital signal having a sampling frequency of m (m is a positive integer ≧2)×n (n is a positive integer ≧2)×fs (Hz) and one bit as a quantization bit, the digital signal processing method including a frequency analyzing step for subjecting the inputted first digital signal to frequency analysis processing, a first noise level calculating step for calculating an average noise level of a predetermined range of the first digital signal on the basis of a result of the frequency analysis obtained by the frequency analyzing step, a spectrum generating step for generating a spectrum of a signal of high frequencies beyond an audible range on the basis of the result of the frequency analysis obtained by the frequency analyzing step, a second noise level calculating step for calculating a noise level of the spectrum generated by the spectrum generating step, a normalizing and waveform synthesizing step for normalizing the noise level of the spectrum calculated by the second noise level calculating step on the basis of the average noise level calculated by the first noise level calculating step, and synthesizing a temporal waveform signal based on the spectrum, a first oversampling step for oversampling the first digital signal at a sampling frequency of m (m is the positive integer ≧2)×fs (Hz), an adding step for adding the multi-bit digital signal oversampled by the first oversampling step to the signal of high frequencies beyond the audible range, the signal of high frequencies beyond the audible range having the noise level normalized by the normalizing and waveform synthesizing step and being synthesized into a waveform by the normalizing and waveform synthesizing step, a second oversampling step for oversampling an addition output of the adding step at a sampling frequency of n (n is the positive integer ≧2)×fs (Hz) and a ΔΣ modulating step for converting a multi-bit digital signal oversampled by the second oversampling step into a 1-bit digital signal.

In order to solve the above problem, according to the fifth aspect of the present invention, there is provided a digital signal processing apparatus for converting a first digital signal having a sampling frequency of fs (Hz) and a multi-bit as a quantization bit into a second digital signal having a sampling frequency of m (m is a positive integer ≧2)×n (n is a positive integer ≧2)×fs (Hz) and one bit as a quantization bit, the digital signal processing apparatus including a frequency analyzing means for subjecting the first digital signal inputted thereto to frequency analysis processing, a high-frequency signal generating means for generating a signal of high frequencies beyond an audible range on the basis of a result of the frequency analysis obtained by the frequency analyzing means, a first oversampling means for oversampling the first digital signal at a sampling frequency of m (m is the positive integer ≧2)×fs (Hz), an adding means for adding the multi-bit digital signal oversampled by the first oversampling means to the signal of high frequencies generated by the high-frequency signal generating means, a second oversampling means for oversampling an addition output of the adding means at a sampling frequency of n (n is the positive integer ≧2)×fs (Hz) and a ΔΣ modulating means for converting a multi-bit digital signal oversampled by the second oversampling means into a 1-bit digital signal.

In order to solve the above problem, according to the sixth aspect of the present invention, there is provided a digital signal processing method for converting a first digital signal having a sampling frequency of fs (Hz) and a multi-bit as a quantization bit into a second digital signal having a sampling frequency of m (m is a positive integer ≧2)×n (n is a positive integer ≧2)×fs (Hz) and one bit as a quantization bit, the digital signal processing method including a frequency analyzing step for subjecting the inputted first digital signal to frequency analysis processing, a high-frequency signal generating step for generating a signal of high frequencies beyond an audible range on the basis of a result of the frequency analysis obtained by the frequency analyzing step, a first oversampling step for oversampling the first digital signal at a sampling frequency of m (m is the positive integer ≧2)×fs (Hz), an adding step for adding the multi-bit digital signal oversampled by the first oversampling step to the signal of high frequencies generated by the high-frequency signal generating step, a second oversampling step for oversampling an addition output of the adding step at a sampling frequency of n (n is the positive integer ≧2)×fs (Hz) and a ΔΣ modulating step for converting a multi-bit digital signal oversampled by the second oversampling step into a 1-bit digital signal.

The above and other objects, features and advantages of the present invention will become apparent from the following description and the appended claims, taken in conjunction with the accompanying drawings in which like parts or elements denoted by like reference symbols.

DETAILED DESCRIPTION OF THE PREFERRED EMBODIMENT

Preferred embodiments of apparatus and methods for digital signal processing according to the present invention will hereinafter be described with reference to the drawings.

Figure 1:
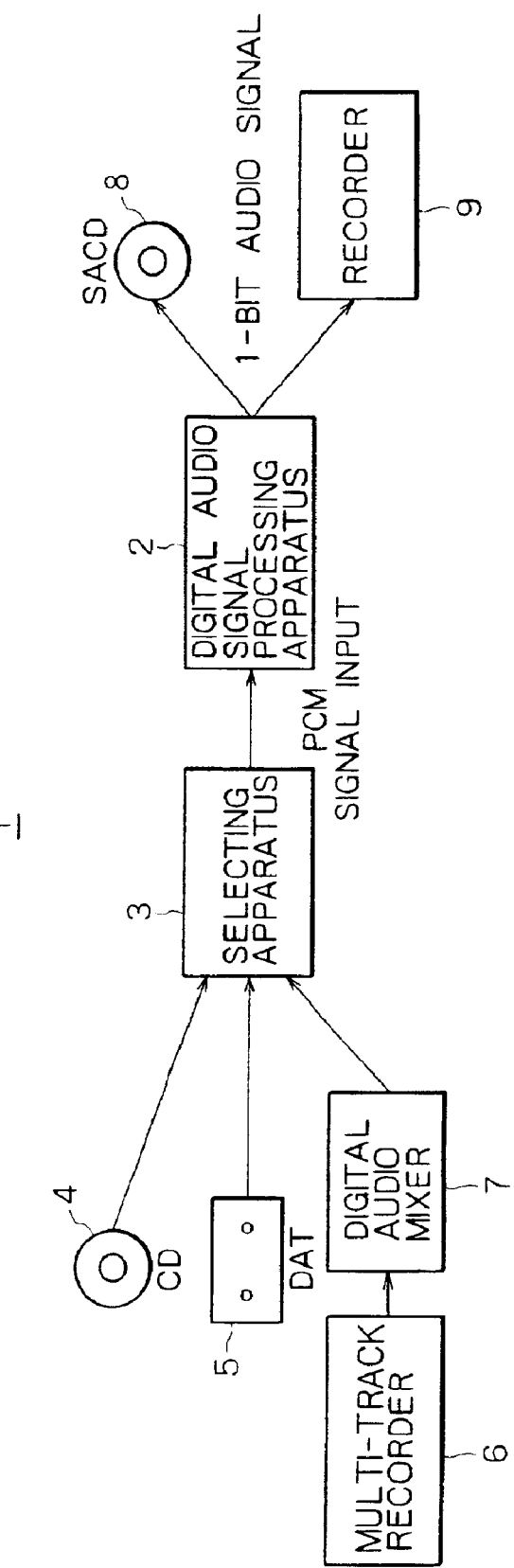
FIG. 1 is a block diagram showing a configuration of a high-speed 1-bit audio signal generating system including a first embodiment of the present invention.

To begin with, a first embodiment will be described. The first embodiment is a digital audio signal processing apparatus 2 included in a high-speed 1-bit audio signal generating system 1 as shown in FIG. 1. The digital audio signal processing apparatus 2 is supplied with an input of either a PCM signal reproduced from a compact disk (CD) 4 or a digital audio tape (DAT) 5 or a PCM signal from a digital audio mixer 7 or the like, which input is selected by a selecting apparatus 3. The digital audio signal processing apparatus 2 converts the PCM signal into a high-speed 1-bit audio signal to be recorded on a Super Audio CD (SACD: product name of Sony Corporation) 8 or supplied to a recorder 9 or the like. The digital audio mixer 7 outputs the PCM signal obtained by mixing digital audio signals recorded by a multi-track recorder 6.

Thus, the high-speed 1-bit audio signal generating system 1 shown in FIG. 1 can generate a high-speed 1-bit audio signal from the PCM signal reproduced from the compact disk (CD) 4 or the digital audio tape (DAT) 5 or the PCM signal of the digital audio mixer 7, and then record the high-speed 1-bit audio signal on a medium such as an optical disk or supply the high-speed 1-bit audio signal to a recorder.

Figure 2:
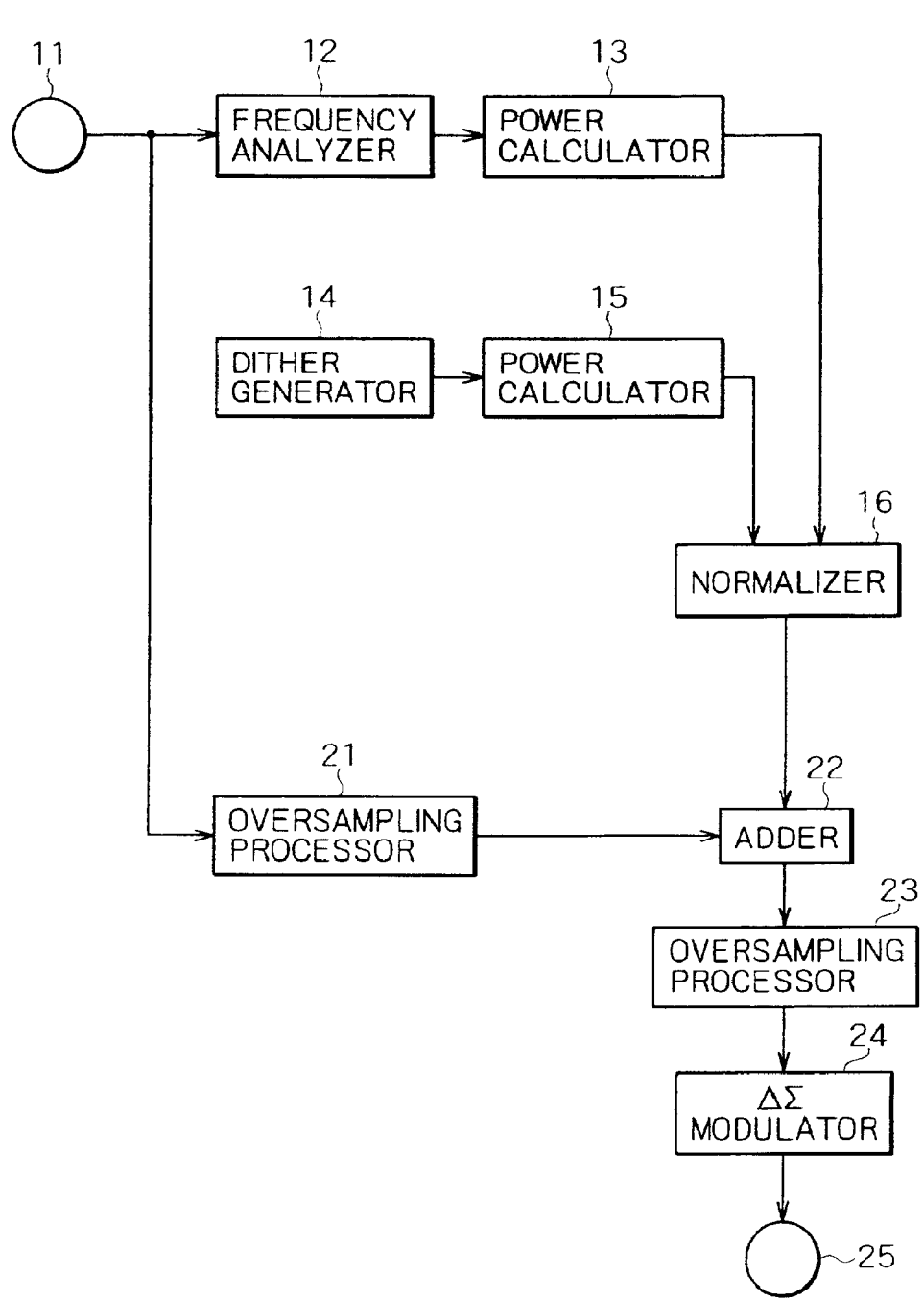
FIG. 2 is a block diagram showing a configuration of a digital audio signal processing apparatus according to the first embodiment.

A configuration of the digital audio signal processing apparatus 2 is shown in FIG. 2. The digital audio signal processing apparatus 2 includes: a frequency analyzer 12 for subjecting a PCM musical sound signal (PCM signal) with a quantization frequency of 44.1 kHz and a quantization word length of 16 bits, which signal is inputted from an input terminal 11, to frequency analysis processing; and a power calculator 13 for calculating an average noise level of a predetermined range of the PCM signal from a result of the frequency analysis of the frequency analyzer 12.

The digital signal processing apparatus 2 further includes: a dither generator 14 for generating a dither signal, or a signal of high frequencies beyond an audible range; a power calculator 15 for calculating an average noise level of the predetermined range of the dither signal generated by the dither generator 14; and a normalizer 16 for normalizing the average noise level calculated by the power calculator 15.

The digital audio signal processing apparatus 2 further includes: an oversampling processor 21 for oversampling the PCM signal at a sampling frequency of m (m is a positive integer $\geq 2$)×fs (Hz); an adder 22 for adding the PCM signal oversampled by the oversampling processor 21 to the dither signal normalized by the normalizer 16; an oversampling processor 23 for oversampling an addition output of the adder 22 at a sampling frequency of n (n is a positive integer $\geq 2$)×fs (Hz); and a $\Delta\Sigma$ modulator 24 for converting the multi-bit digital signal oversampled by the oversampling processor 23 into a 1-bit digital signal, and outputting the 1-bit digital signal from an output terminal 25.

The frequency analyzer 12 subjects the PCM signal inputted from the input terminal 11 to frequency analysis processing in a range of DC to 22.05 kHz using a fast Fourier transformation (FFT), for example, and then supplies a result of the frequency analysis to the power calculator 13.

The power calculator 13 calculates an average power in a range of 18 kHz to 20 kHz, for example, from the result of the frequency analysis supplied by the frequency analyzer 12. The average power calculated by the power calculator 13 is sent to the normalizer 16.

The dither generator 14 generates a dither signal, or a signal of high frequencies beyond an audible range. In generating the dither signal, a generation interval of the dither signal is made equal to a signal cycle after oversampling processing by the oversampling processor 21 to be described later. When the oversampling processor 21 performs 2(=m)×oversampling, for example, the generation interval of the dither signal is a generation cycle based on 2 fs=88.2 kHz. Also, word length of the dither signal is set so as to be sufficient for the adder 22 to be described later to add a result of normalization of the normalizer 16 to an output of the oversampling processing. When it is assumed that word length of a coefficient of a digital filter used by the oversampling processor 21 is 16 bits, for example, a 16-bit PCM signal is supplied to the input terminal 11, and therefore the word length after oversampling is 31 bits. Accordingly, the word length of the dither signal needs to be 31 bits.

The power calculator 15 calculates power of the dither signal generated by the dither generator 14. The power calculated by the power calculator 15 is sent to the normalizer 16.

The normalizer 16 normalizes the power of the dither signal calculated by the power calculator 15 on the basis of the average power of the PCM signal in a range of 18 kHz to 20 kHz, which average power has been calculated by the power calculator 13. The normalizer 16 then supplies a normalized output to the adder 22.

The oversampling processor 21 oversamples the PCM signal with a quantization frequency of 44.1 kHz and a quantization word length of 16 bits, which signal is inputted from the input terminal 11, at a sampling frequency of 2×44.1 kHz, and then supplies an output of the oversampling processing to the adder 22.

The adder 22 adds the normalized output from the normalizer 16 to the oversampling output from the oversampling processor 21, and then supplies the addition output to the oversampling processor 23.

The oversampling processor 23 oversamples the addition output at a sampling frequency of 32×44.1 kHz. Thus, an oversampling output from the oversampling processor 23 is an output of 64x oversampling of the PCM signal with the quantization frequency of 44.1 kHz and the quantization word length of 16 bits.

The 64x oversampling output is sent to the ΔΣ modulator 24 to be subjected to delta sigma modulation processing to be described later and thereby converted into a 1-bit audio signal. The 1-bit audio signal is then supplied to the output terminal 25.

The digital audio signal processing apparatus 2 according to the first embodiment may be classified into several examples by forming the normalizer 16 in different manners. The examples will be described in the following.

To begin with, a digital audio signal processing apparatus $2_1$ according to a first example of the first embodiment (hereinafter referred to as an example 1-1) will be described with reference to FIGS. 3 to 9. A normalizer $16_1$ of the digital audio signal processing apparatus $2_1$ according to the example 1-1 includes a gain calculator 31, a band-pass (BP) filter characteristic producer 32, a filter coefficient calculator 33, a filter processor 34, and a gain adjuster 35.

Figure 4:
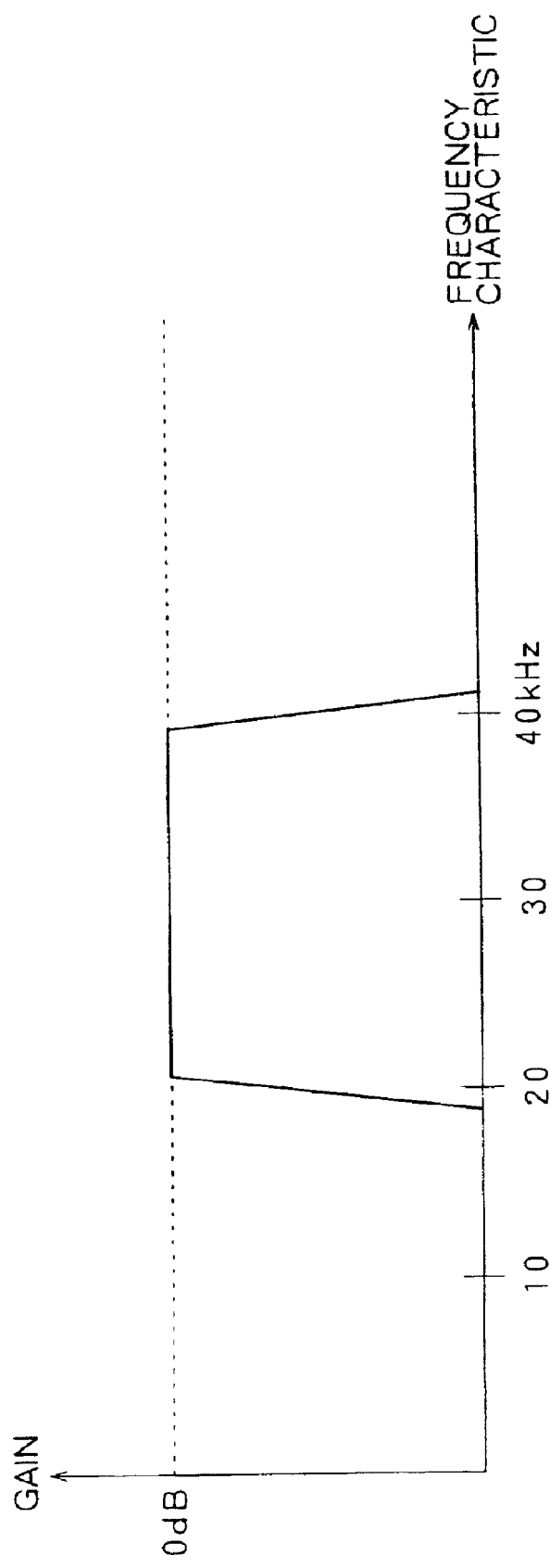
FIG. 4 is a frequency characteristic diagram showing a BP filter characteristic produced by a BP filter characteristic producer forming the digital audio signal processing apparatus according to the example 1-1.

The band-pass (BP) filter characteristic producer 32 produces a filter characteristic that passes a range of more than 20 kHz to less than 40 kHz as shown in FIG. 4 at 0 dB when the oversampling processor 21 performs 2x oversampling processing, for example.

The filter coefficient calculator 33 converts the filter characteristic produced by the BP filter characteristic producer 32 into a filter coefficient to be used in the filter processor 34.

The filter processor 34 subjects the dither signal from the dither generator 14 to filter processing on the basis of the filter coefficient calculated by the filter coefficient calculator 33, and then supplies the filter processing output to the gain adjuster 35.

The gain calculator 31 calculates a coefficient that renders the power of the dither signal calculated by the power calculator 15 equal to the average power of the PCM signal in a range of 18 kHz to 20 kHz, which average power has been calculated by the power calculator 13. The coefficient calculated by the gain calculator 31 is sent to the gain adjuster 35.

The gain adjuster 35 renders the power of the dither signal, or the filter processing output of the filter processor 34, equal to the average power of the PCM signal in a range of 18 kHz to 20 kHz by using the coefficient from the gain calculator 31, and then sends the result to the adder 22.

The adder 22 adds the dither signal whose power has been subjected to gain adjustment by the gain adjuster 35 of the normalizer $16_1$ to the PCM signal that has been subjected to the 2x oversampling processing by the oversampling processor 21. Thus, in spectral terms, frequency spectra are combined with each other in a smooth manner, as shown in FIG. 5.

Specifically, the dither signal 38 resulting from power adjustment by the gain adjuster 35 of the filter processing output 37 obtained by subjecting the dither signal of the dither generator 14 to the filter processing by the filter processor 34 is combined in a smooth manner with the result 36 obtained by subjecting the PCM signal inputted from the input terminal 11 to frequency analysis processing by the frequency analyzer 12.

Figure 5:
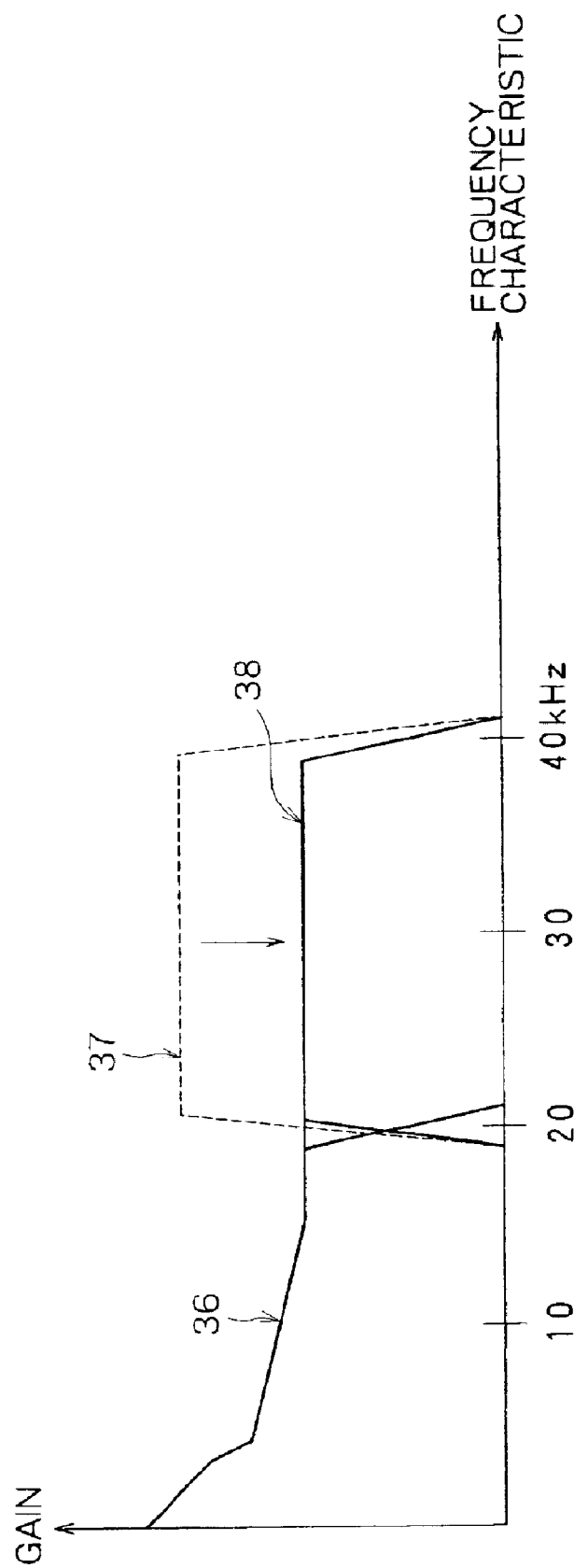
FIG. 5 is a frequency characteristic diagram showing, in the form of frequency spectra, an addition output of an adder forming the digital audio signal processing apparatus according to the example 1-1.

The addition output of the adder 22 whose frequency characteristics are shown in FIG. 5 is then oversampled by the oversampling processor 23 at a sampling frequency of 32×44.1 kHz. Thus, the ΔΣ modulator 24 is supplied with the output of 64x oversampling of the PCM signal with the frequency characteristics shown in FIG. 5 and the sampling frequency of 44.1 kHz.

Figure 6:
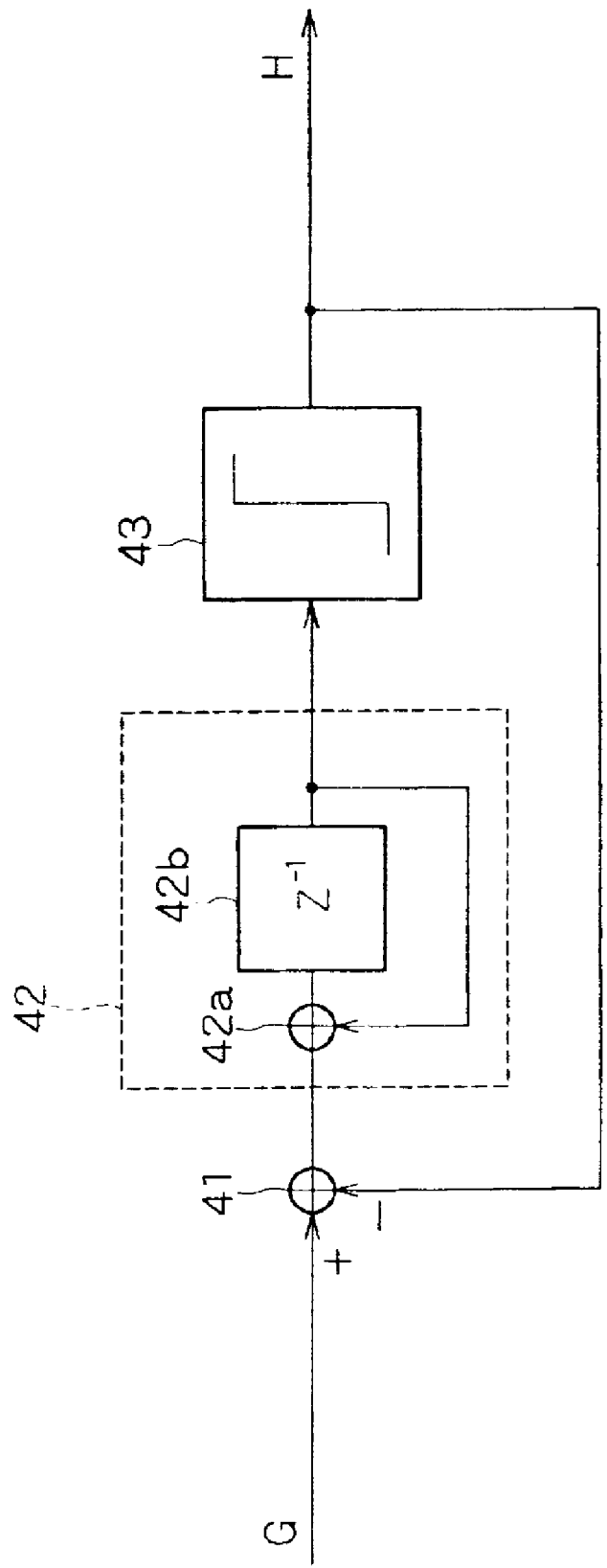
FIG. 6 is a block diagram of a $\Delta\Sigma$ modulator forming all examples including the digital audio signal processing apparatus according to the example 1-1.

The ΔΣ modulator 24 employs a fundamental configuration as shown in FIG. 6. Specifically, the ΔΣ modulator 24 is formed by a combination of an integrator 42, a 1-bit quantizer 43, and a system for feeding back the quantized output. More specifically, the ΔΣ modulator 24 includes: an adder 41 having a positive input terminal supplied with an input signal G and a negative input terminal supplied with a feedback output to be described later; the integrator 42 for subjecting the addition output of the adder 41 to integration processing; and the 1-bit quantizer 43 for quantizing the integrated output of the integrator 42 into a 1-bit digital signal in each sampling cycle. The quantized output H of the 1-bit quantizer 43 is provided with a minus sign and then fed back to the adder 41 to be added to (consequently subtracted from) the input signal G. Also, the 1-bit digital signal H is outputted from the 1-bit quantizer 43 to the outside as the quantized output. The integrator 42 includes an adder 42a and a delayer 42b.

The 1-bit quantizer 43 generates a 1-bit output signal H by subjecting the input signal G to quantization processing while referring to a threshold value of 0, which is constant at all times with respect to time. Thus, the 1-bit quantizer 43 performs quantization processing on the input signal G by determining two value levels using the threshold of 0, that is, determining whether the input signal G is 0 or more, or less than 0.

Figure 7:
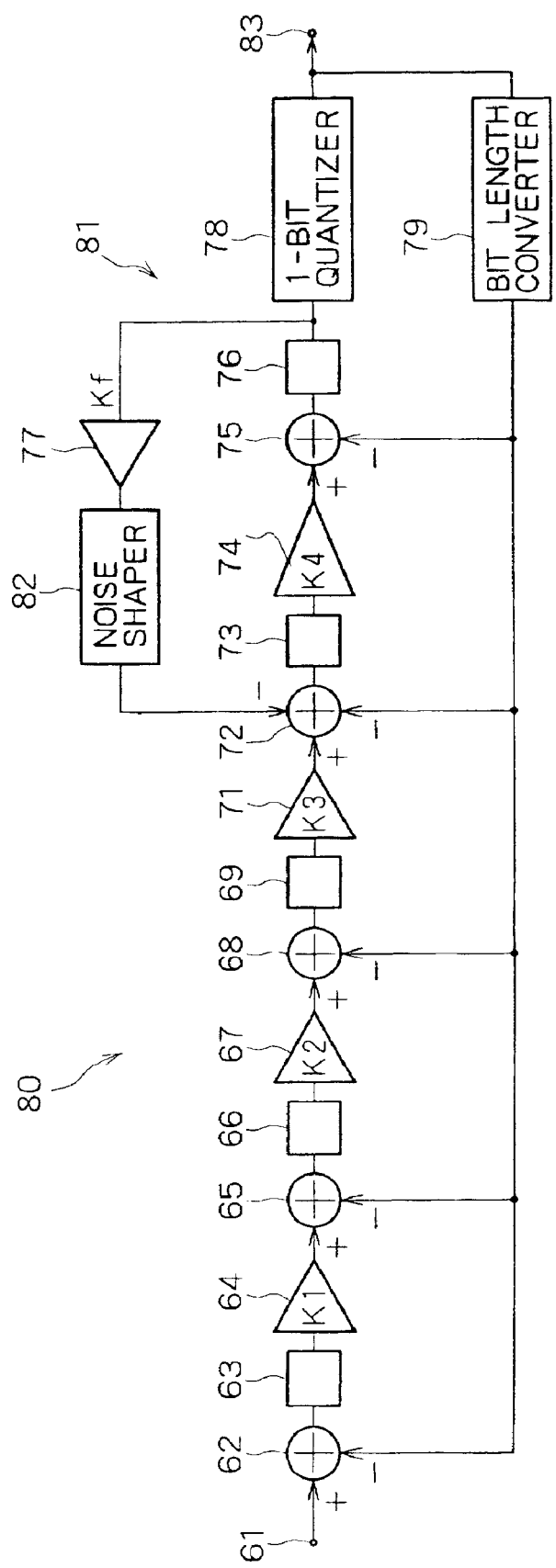
FIG. 7 is a circuit diagram showing a fifth-order $\Delta\Sigma$ modulator.

FIG. 7 shows a configuration of a ΔΣ modulating apparatus 80 including the ΔΣ modulating apparatus shown in FIG. 6 and a plurality of integrators. In FIG. 7, the adder 41, the integrator 42, and the 1-bit quantizer 43 forming the ΔΣ modulating apparatus of FIG. 6 correspond to an adder 75, an integrator 76, and a 1-bit quantizer 78 having different reference numerals. In addition, a bit length converter 79 is disposed in a negative feedback path from the 1-bit quantizer 78.

The ΔΣ modulating apparatus 80 shown in FIG. 7 is a fifth-order ΔΣ modulating apparatus having five integrators 63, 66, 69, 73, and 76. The fifth-order ΔΣ modulating apparatus has a local feedback loop unit 81 that attenuates and requantizes an output of the fifth integrator 76, and feeds back the output to an input of the preceding integrator 73.

The local feedback loop unit 81 includes a local feedback attenuator 77 and a noise shaper 82.

The ΔΣ modulating apparatus 80 further includes: adders 62, 65, 68, 72, and 75 connected to the front of the five integrators 63, 66, 69, 73, and 76 for supplying a multi-bit digital signal to the integrators 63, 66, 69, 73, and 76, respectively; four attenuators 64, 67, 71, and 74 connected to the rear of the first to fourth integrators 63, 66, 69, and 73, respectively, of the five integrators; the 1-bit quantizer 78 similar to the foregoing 1-bit quantizer 43 connected to the rear of the fifth integrator 76; and the bit length converter 79 for converting bit length of a 1-bit digital signal from the 1-bit quantizer 78 into multi-bit length and supplying the adders 62, 65, 68, 72, and 75 with the multi-bit signal to form an input to the five integrators 63, 66, 69, 73, and 76.

The first integrator 63 integrates an input signal supplied via an input terminal 61 and the adder 62. Thus, the first integrator 63 has a configuration in which an output from an adder similar to the adder 42a shown in FIG. 6 is delayed by a delayer similar to the delayer 42b, and then fed back to the adder. The second to fifth integrators 66, 69, 73, and 76 have the same configuration.

An integrated output from the fifth integrator 76 is supplied to the 1-bit quantizer 78 and the local feedback attenuator 77 of the local feedback loop unit 81.

The 1-bit quantizer 78 is a quantizer in which a threshold level to be referred to in quantization processing is fixed with respect to a time axis. The 1-bit output signal is derived from an output terminal 83 and also supplied to the bit length converter 79.

The bit length converter 79 converts the 1-bit signal from the 1-bit quantizer 78 into a multi-bit digital signal, adds a minus sign to the multi-bit digital signal, and then feeds back the multi-bit digital signal to the adders 62, 65, 68, 72, and 75. Hence, the adders 62, 65, 68, 72, and 75 subtract the output signal of the bit length converter 79 from signals supplied from the input terminal 61 and the integrators 63, 66, 69, and 73 via the attenuators 64, 67, 71, and 74 in the preceding stages, respectively.

The attenuators 64, 67, 71, and 74 attenuate the integrated outputs of the integrators 63, 66, 69, and 73 using coefficients K1, K2, K3, and K4, respectively, and then supply the results to the adders 65, 68, 72, and 75, respectively.

The local feedback attenuator 77 of the local feedback loop unit 81 attenuates the integrated output from the fifth integrator 76 using a coefficient Kf, and then supplies the result to the noise shaper 82.

The noise shaper 82 has an adder, a delayer, and a multi-bit quantizer not shown in the figure. The noise shaper 82 requantizes the attenuated output from the local feedback attenuator 77 without cutting data word length. More specifically, the noise shaper 82 shifts a requantization error to the outside of the audible range.

Thus, the ΔΣ modulating apparatus 80 has the local feedback loop, and therefore is capable of outputting a high-quality 1-bit audio signal. The high-quality 1-bit audio signal is outputted via the output terminal 25 as an output of the digital audio signal processing apparatus $2_1$.

The digital audio signal processing apparatus $2_1$ according to the example 1-1 described above generates a signal of high frequencies beyond the audible range by means of the dither generator 14, limits a band by means of the BP filter characteristic producer 32 of the normalizer $16_1$, normalizes the power of the signal with the power of a PCM signal, adds the resulting signal to an oversampled PCM signal such that the signals are combined with each other in a smooth manner as shown in FIG. 5, further oversamples the addition output, and then subjects the oversampled addition output to ΔΣ modulation, whereby a 1-bit audio signal is generated. Since the 1-bit audio signal includes the signal beyond the frequency range of the PCM signal, it is possible to provide a natural sound such that perceived depth of the acoustic sound image is extended in a front to rear direction.

While the oversampling processor 21 in the digital audio signal processing apparatus $2_1$ according to the example 1-1 performs 2x oversampling processing and the oversampling processor 23 performs 32x oversampling processing, the oversampling processor 21 may perform 4x oversampling processing and the oversampling processor 23 may perform 16x oversampling processing.

Figure 8:
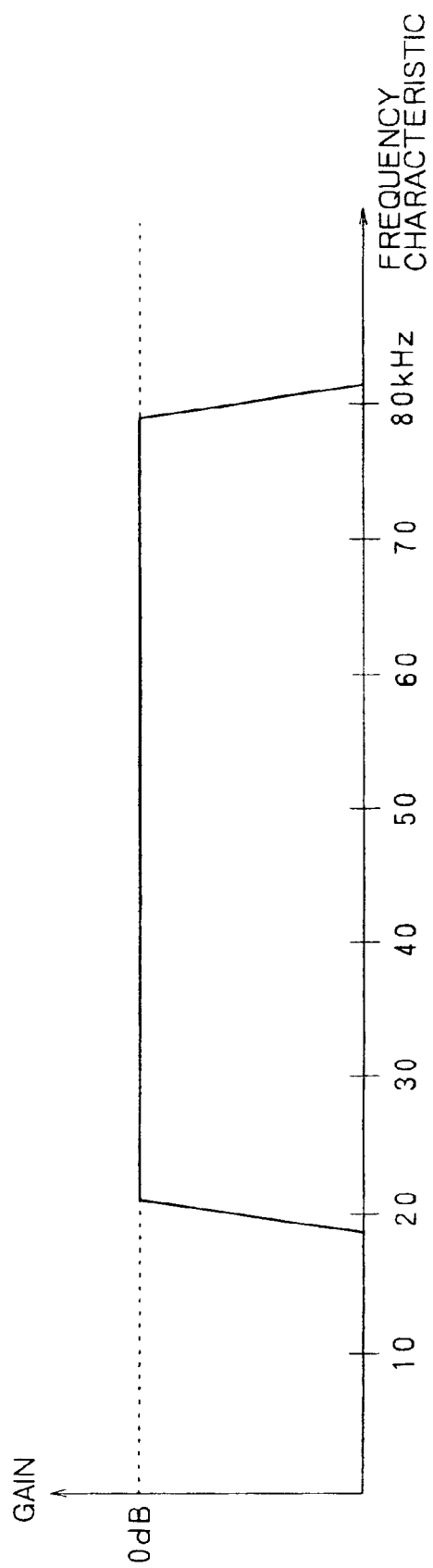
FIG. 8 is a frequency characteristic diagram showing a BP filter characteristic produced by the BP filter characteristic producer when sampling frequencies of two oversampling processors forming the digital audio signal processing apparatus according to the example 1-1 are changed.
Figure 9:
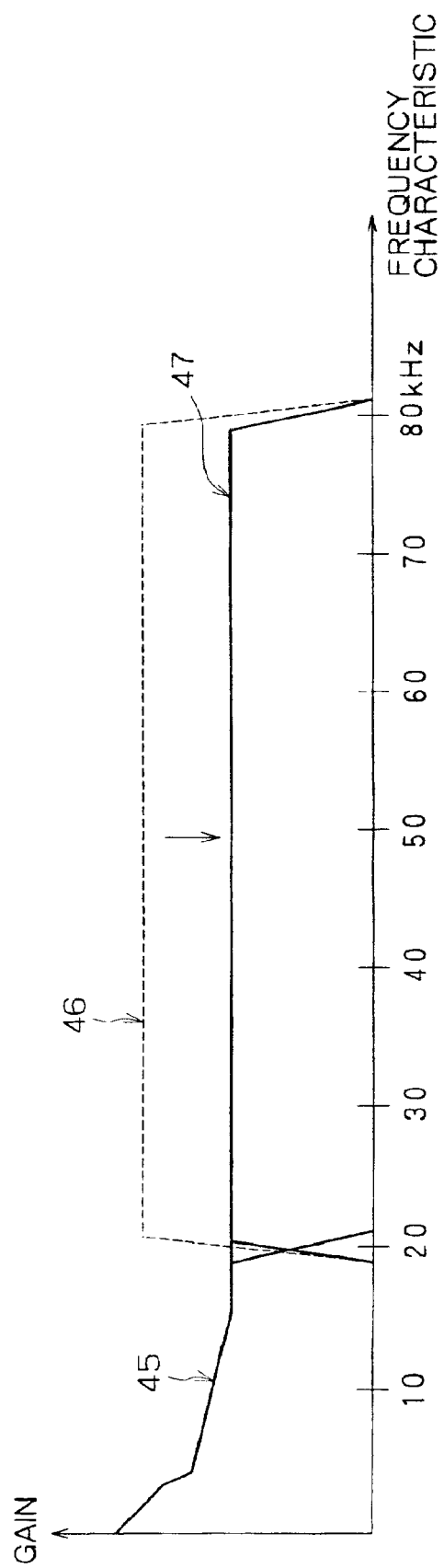
FIG. 9 is a frequency characteristic diagram showing, in the form of frequency spectra, an addition output of the adder forming the digital audio signal processing apparatus according to the example 1-1 in the case shown in FIG. 8.
Figure 10:
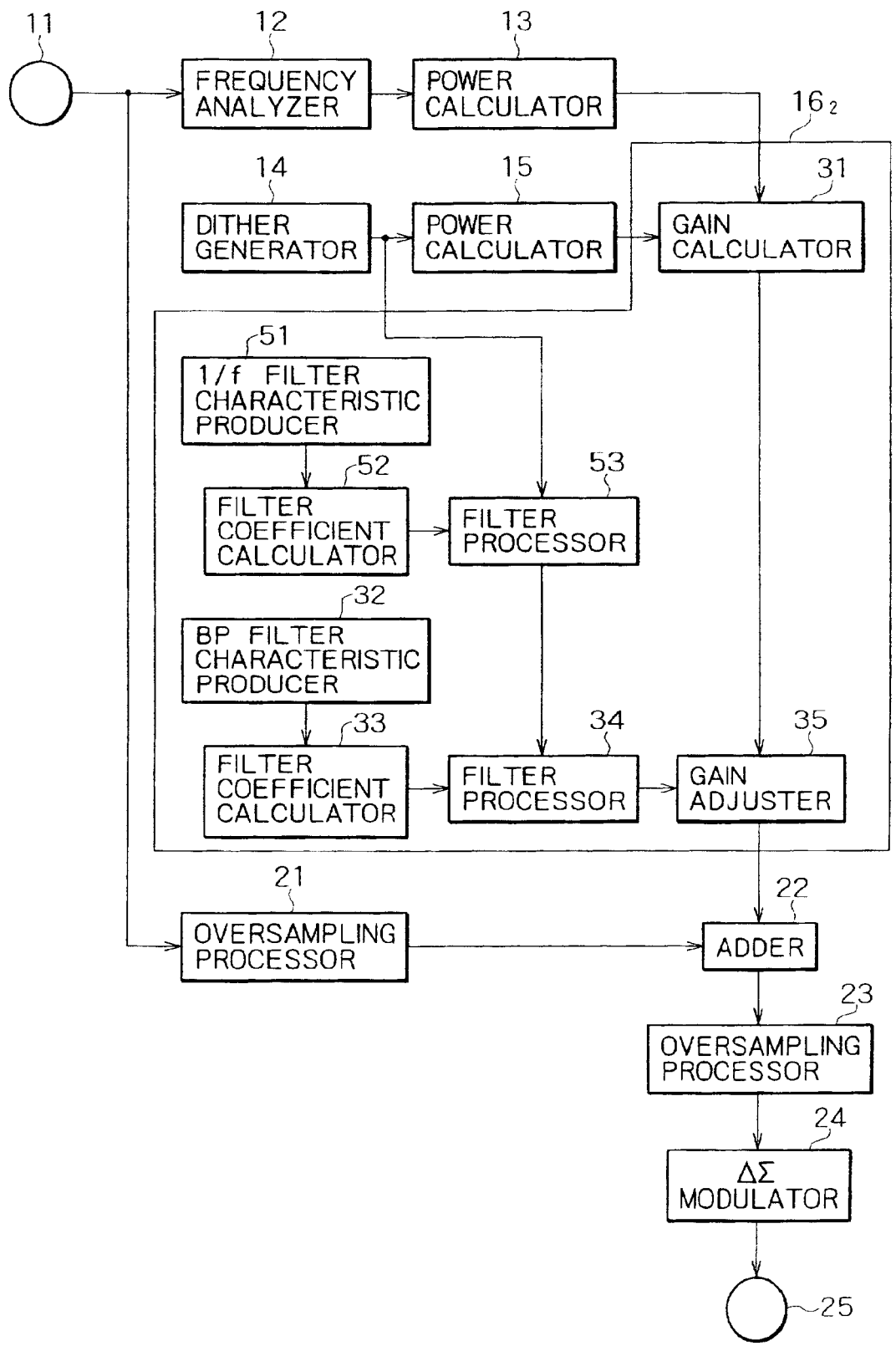
FIG. 10 is a block diagram showing a configuration of a digital audio signal processing apparatus according to a second example of the first embodiment (example 1-2)

A BP filter characteristic of the BP filter characteristic producer 32 in that case is shown in FIG. 8. Also, an input signal to the ΔΣ modulator 24 is shown in FIG. 9. Specifically, since the oversampling processor 21 performs 4x oversampling processing, the BP filter characteristic producer 32 produces a filter characteristic for passing a range of more than 20 kHz to less than 80 kHz at 0 dB, as shown in FIG. 8. The filter coefficient calculator 33 converts the filter characteristic produced by the BP filter characteristic producer 32 into a filter coefficient to be used in the filter processor 34.

The filter processor 34 subjects the dither signal from the dither generator 14 to filter processing on the basis of the filter coefficient, and then supplies the filter processing output to the gain adjuster 35.

The gain adjuster 35 renders the power of the dither signal, or the filter processing output of the filter processor 34, equal to the average power of the PCM signal in a range of 18 kHz to 20 kHz by using the coefficient from the gain calculator 31, and then sends the result to the adder 22.

The adder 22 adds the dither signal that has been subjected to gain adjustment by the gain adjuster 35 to the PCM signal that has been subjected to the 4x oversampling processing by the oversampling processor 21. Thus, in spectral terms, frequency spectra are combined with each other in a smooth manner, as shown in FIG. 9. Specifically, the dither signal 47 resulting from power adjustment by the gain adjuster 35 of the filter processing output 46 obtained by subjecting the dither signal of the dither generator 14 to the filter processing by the filter processor 34 is combined in a smooth manner with the result 45 obtained by subjecting the PCM signal inputted from the input terminal 11 to frequency analysis processing by the frequency analyzer 12.

The addition output of the adder 22 whose frequency characteristics are shown in FIG. 9 is then oversampled by the oversampling processor 23 at a sampling frequency of 16×44.1 kHz. Thus, the ΔΣ modulator 24 is supplied with the output of 64x oversampling of the PCM signal with the frequency characteristics shown in FIG. 9 and the sampling frequency of 44.1 kHz.

Thus, when the oversampling processor 21 performs 4x oversampling processing and the oversampling processor 23 performs 16x oversampling processing, the adder 22 adds the dither signal 47 extending to 80 kHz after the power adjustment as shown in FIG. 9 to the oversampled PCM signal. Hence a 1-bit audio signal obtained by further oversampling the addition output and then subjecting the oversampled addition output to ΔΣ modulation includes the signal way beyond the frequency range of the PCM signal. It is therefore possible to provide a natural sound such that perceived depth of the acoustic sound image is extended in a front to rear direction.

Next, a digital audio signal processing apparatus 22 according to a second example of the first embodiment (hereinafter referred to as an example 1-2) will be described with reference to FIGS. 10 to 15. Differences in configuration between the foregoing example 1-1 and the example 1-2 will first be described. A normalizer $16_2$ of the digital audio signal processing apparatus $2_2$ according to the example 1-2 includes the gain calculator 31, the band-pass (BP) filter characteristic producer 32, the filter coefficient calculator 33, the filter processor 34, and the gain adjuster 35, which formed the normalizer $16_1$ in FIG. 3, as well as a 1/f filter characteristic producer 51, a filter coefficient calculator 52, and a filter processor 53.

Figure 11:
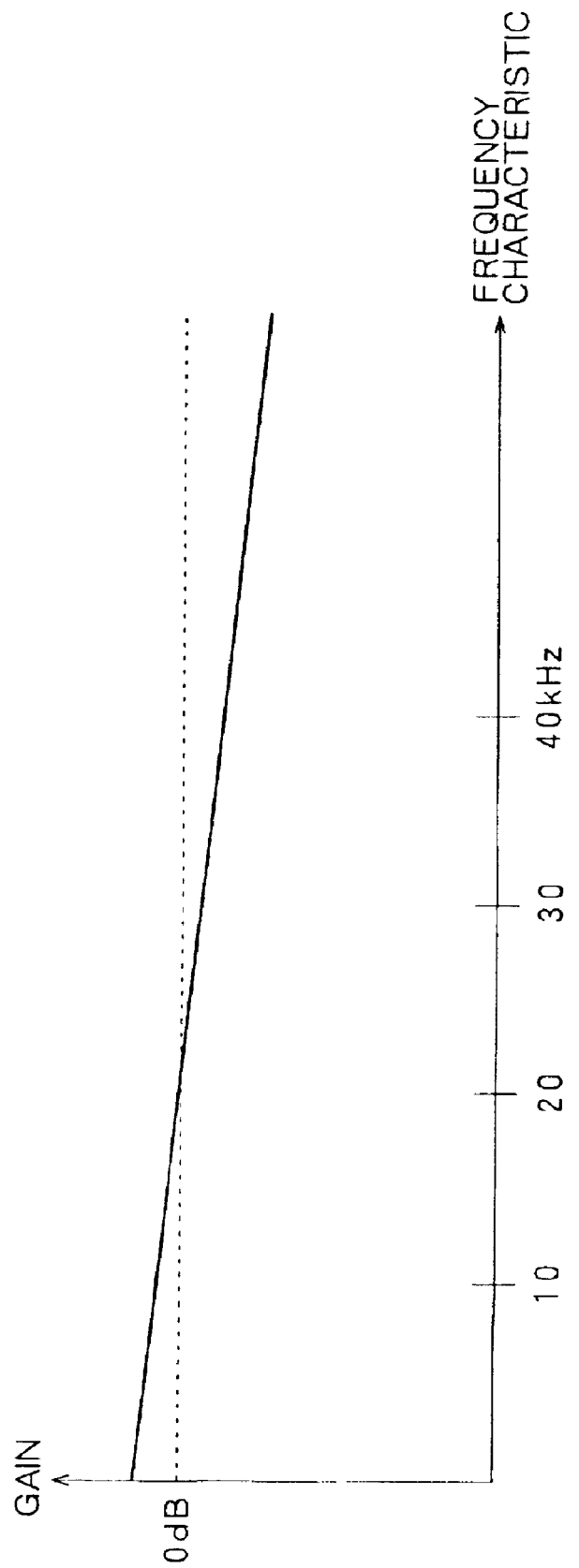
FIG. 11 is a frequency characteristic diagram showing a 1/f filter characteristic produced by a 1/f filter characteristic producer forming the digital audio signal processing apparatus according to the example 1-2.

Operation of the normalizer $16_2$ of the digital audio signal processing apparatus $2_2$ according to the example 1-2 will next be described. The 1/f filter characteristic producer 51 produces a filter characteristic such that an amplitude [GAIN] is reduced with increasing frequency, and amplitudes around 20 kHz before and after filter processing are equal to each other, as shown in FIG. 11.

The filter coefficient calculator 52 converts the filter characteristic produced by the 1/f filter characteristic producer 51 into a 1/f filter coefficient to be used in the filter processor 53.

The filter processor 53 subjects a dither signal from a dither generator 14 to filter processing on the basis of the 1/f filter coefficient calculated by the filter coefficient calculator 52, and then supplies the filter processing output to the filter processor 34.

Figure 12:
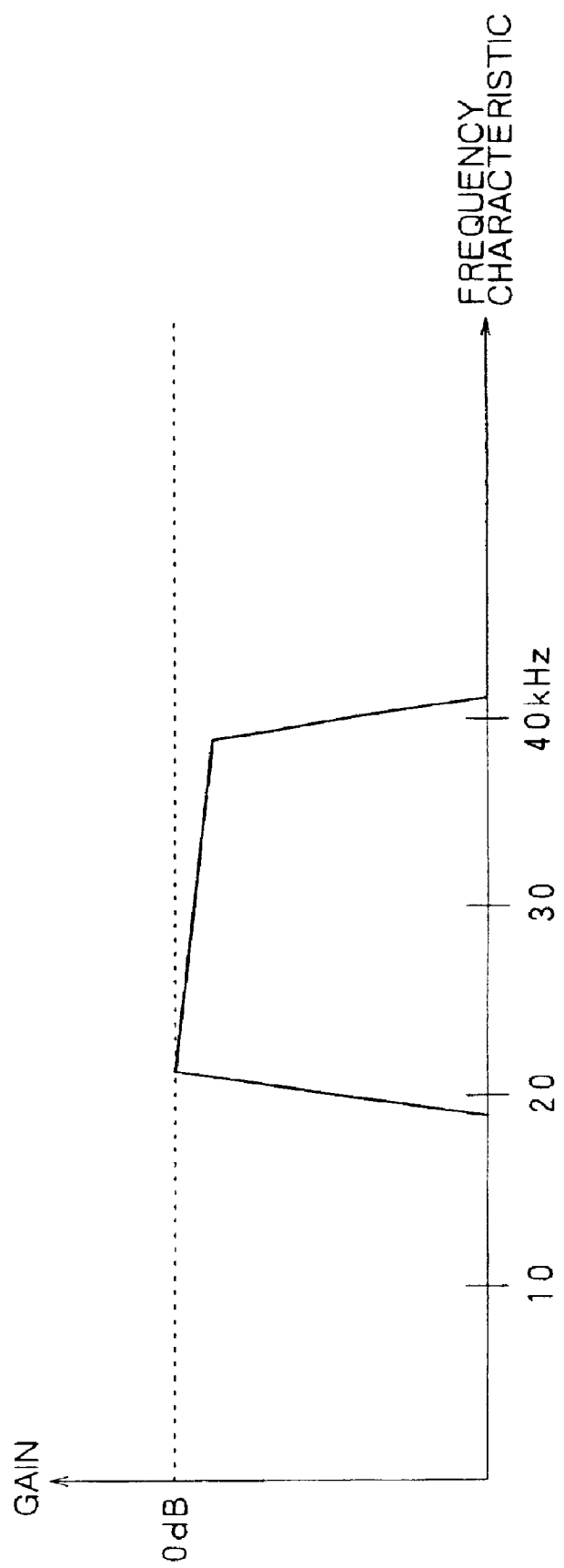
FIG. 12 is a frequency characteristic diagram showing a filter processing output of a filter processor forming the digital audio signal processing apparatus according to the example 1-2.

The filter processor 34 subjects the dither signal, which has been subjected to the filter processing by the filter processor 53 on the basis of the 1/f filter coefficient, to filter processing using a BPF filter coefficient calculated by the filter coefficient calculator 33. The filter processor 34 thereby generates a BPF filter output as shown in FIG. 12, and then supplies the BPF filter output to the gain adjuster 35.

The gain adjuster 35 renders power of the dither signal, or the filter processing output (FIG. 12) of the filter processor 34, equal to average power of the PCM signal in a range of 18 kHz to 20 kHz by using a coefficient from the gain calculator 31, and then sends the result to an adder 22.

The adder 22 adds the dither signal that has been subjected to gain adjustment by the gain adjuster 35 to the PCM signal that has been subjected to 2x oversampling processing by an oversampling processor 21. Thus, in spectral terms, frequency spectra are combined with each other in a smooth manner, as shown in FIG. 13.

Specifically, the dither signal 58 resulting from power adjustment by the gain adjuster 35 of the filter processing output 57 obtained by subjecting the dither signal of the dither generator 14 to the filter processing by the filter processor 34 is combined in a smooth manner with the result 56 obtained by subjecting the PCM signal inputted from an input terminal 11 to frequency analysis processing by a frequency analyzer 12.

Figure 13:
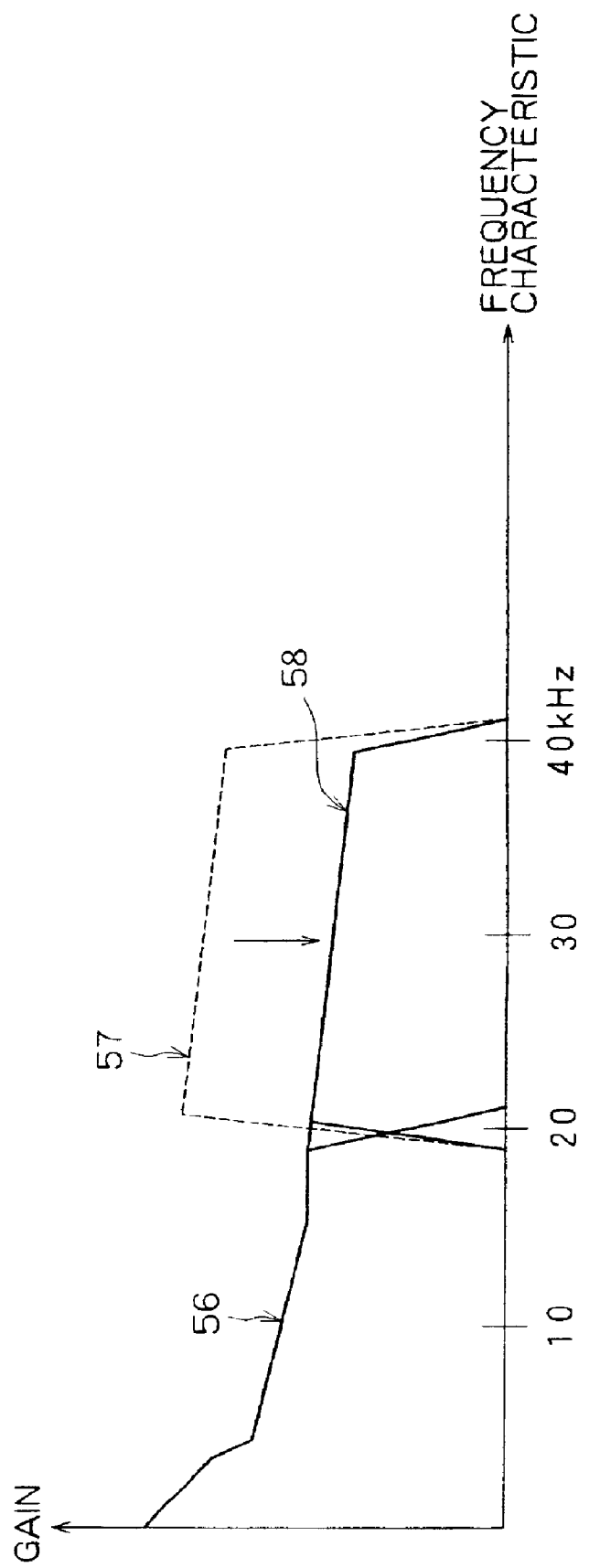
FIG. 13 is a frequency characteristic diagram showing, in the form of frequency spectra, an addition output of an adder forming the digital audio signal processing apparatus according to the example 1-2.

The addition output of the adder 22 whose frequency characteristics are shown in FIG. 13 is then oversampled by an oversampling processor 23 at a sampling frequency of 32×44.1 kHz. Thus, a ΔΣ modulator 24 is supplied with an output of 64x oversampling of the PCM signal with the frequency characteristics shown in FIG. 13 and a sampling frequency of 44.1 kHz.

The ΔΣ modulator 24 employs the fundamental configuration shown in FIG. 6. In practice, the ΔΣ modulator 24 employs a fifth-order configuration as shown in FIG. 7, and is capable of outputting a high-quality 1-bit audio signal. The high-quality 1-bit audio signal is outputted via an output terminal 25 as an output of the digital audio signal processing apparatus $2_2$.

The digital audio signal processing apparatus $2_2$ according to the example 1-2 described above generates a signal of high frequencies beyond the audible range by means of the dither generator 14, limits frequency characteristics on the basis of the characteristics produced by the BP filter characteristic producer 32 and the 1/f filter characteristic producer of the normalizer $16_2$, normalizes the power of the signal, adds the resulting signal to an oversampled PCM signal such that the signals are combined with each other in a smooth manner as shown in FIG. 13, further oversamples the addition output, and then subjects the oversampled addition output to ΔΣ modulation, whereby a 1-bit audio signal is generated. Since the 1-bit audio signal includes the signal that is beyond the frequency range of the PCM signal and whose gradient is adjusted to 1/f, it is possible to provide a natural sound such that perceived depth of the acoustic sound image is extended in a front to rear direction.

Figure 14:
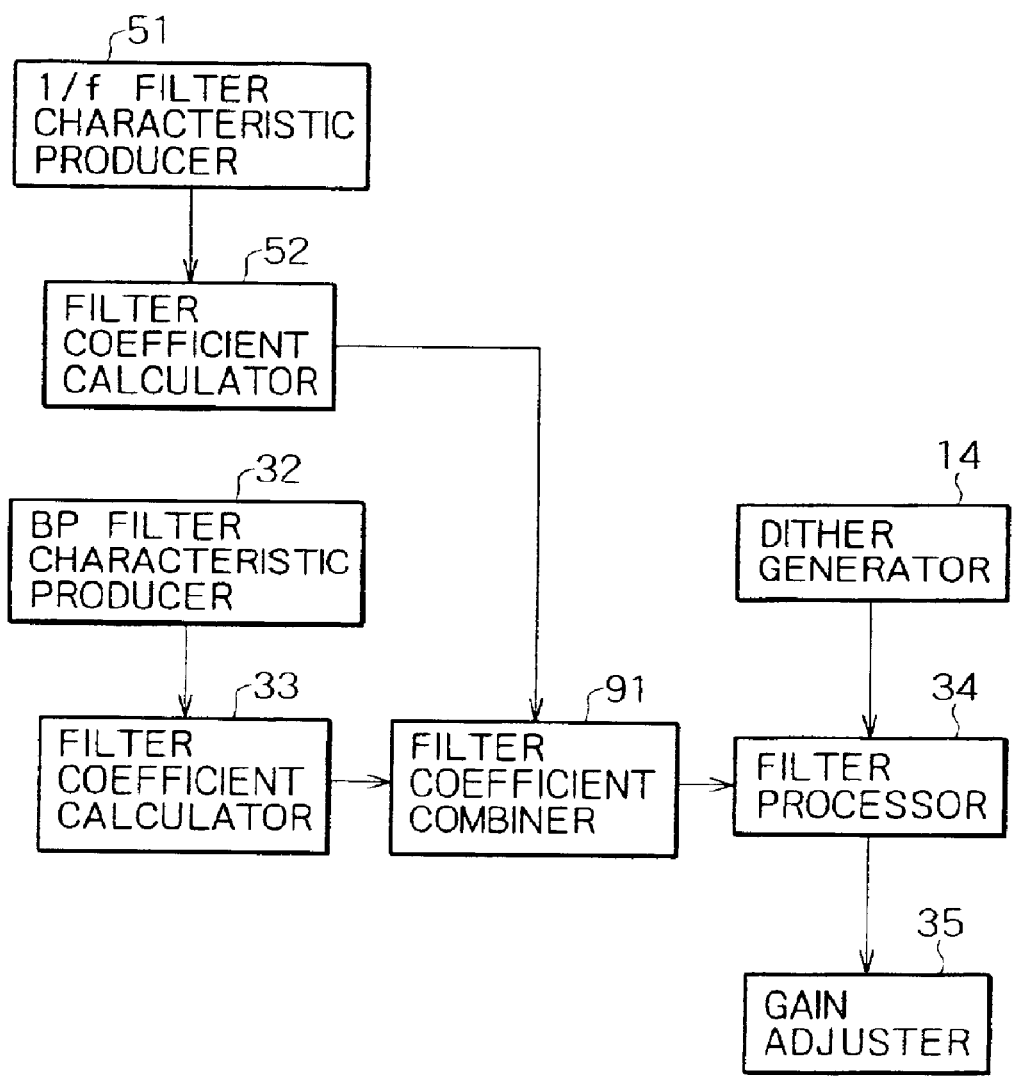
FIG. 14 is a block diagram showing a modification of main parts of the digital audio signal processing apparatus according to the example 1-2.

While the normalizer $16_2$ uses two filter processors (filter processors 53 and 34), which represents a larger circuit scale and more arithmetic processing time, the normalizer $16_2$ may use only one filter processor 34, as shown in FIG. 14.

Specifically, results of filter coefficient calculation of the filter coefficient calculator 52 and the filter coefficient calculator 33 are combined with each other by a filter coefficient combiner 91, and then the combined result is supplied to the filter processor 34. This makes it possible to reduce the circuit scale and the arithmetic processing time.

Operation of main parts of the normalizer $16_2$ when the configuration of FIG. 14 is employed is as follows. The filter coefficient combiner 91 combines the 1/f filter coefficient calculated by the filter coefficient calculator 52 with the BPF filter coefficient calculated by the filter coefficient calculator 33. The filter processor 34 subjects the dither signal from the dither generator 14 to filter processing using the combined filter coefficient from the filter coefficient combiner 91. The filter processor 34 then supplies the filter processing output to the gain adjuster 35.

Figure 15:
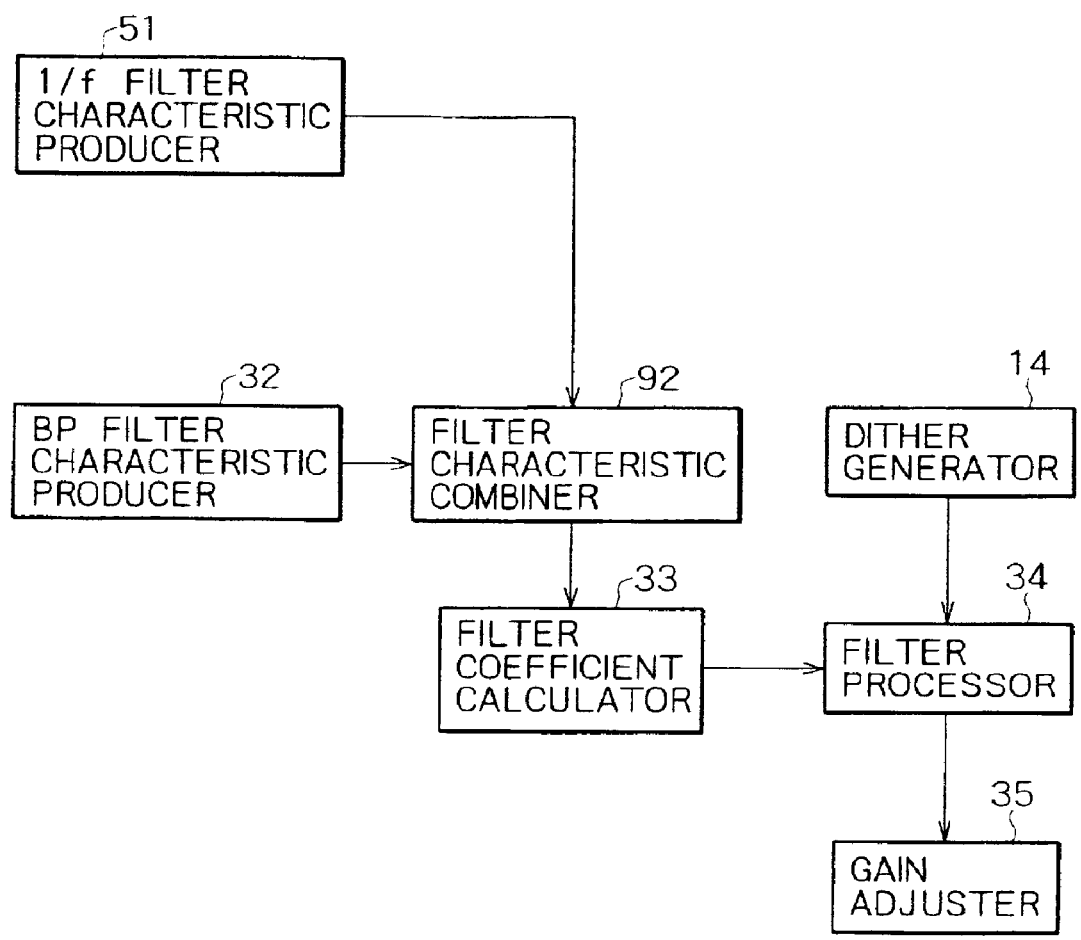
FIG. 15 is a block diagram showing another modification of main parts of the digital audio signal processing apparatus according to the example 1-2.
Figure 16:
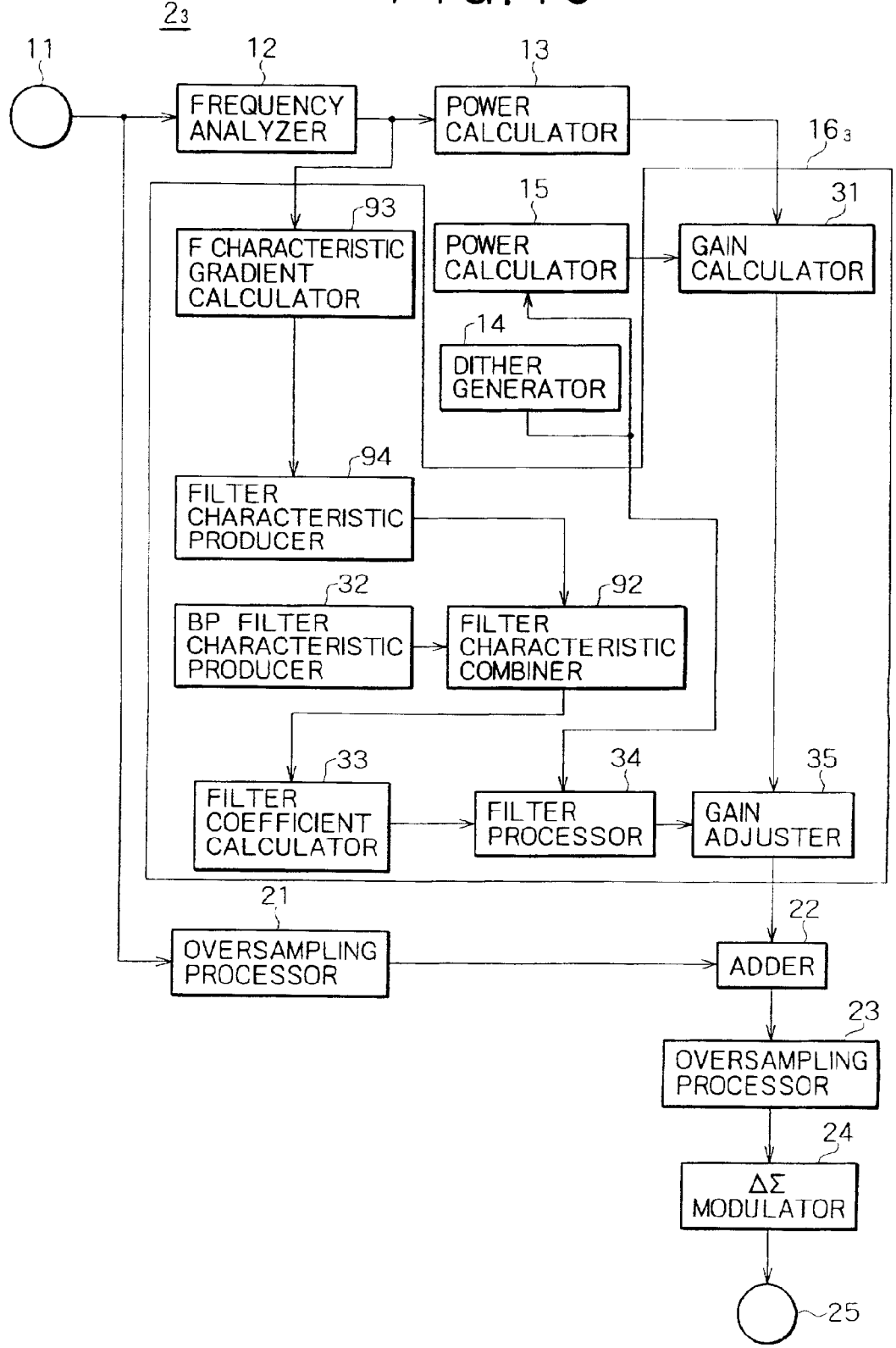
FIG. 16 is a block diagram showing a configuration of a digital audio signal processing apparatus according to a third example of the first embodiment (example 1-3)

Also, the normalizer $16_2$ may reduce the filter processors to one (filter processor 34) by combining the filter characteristic of the 1/f filter characteristic producer 51 with the filter characteristic of the BP filter characteristic producer 32 by means of a filter characteristic combiner 92, and calculating a filter coefficient in accordance with the combined filter characteristic by means of the filter coefficient calculator 33, as shown in FIG. 15.

Operation of main parts of the normalizer $16_2$ when the configuration of FIG. 15 is employed is as follows. The filter characteristic combiner 92 combines the filter characteristic of the 1/f filter characteristic producer 51 with the filter characteristic of the BP filter characteristic producer 32. The filter characteristic combiner 92 supplies the combined filter characteristic to the filter coefficient calculator 33.

The filter coefficient calculator 33 converts the combined filter characteristic into a filter coefficient to be used in the filter processor 34. The filter processor 34 subjects the dither signal from the dither generator 14 to filter processing using the filter coefficient calculated by the filter coefficient calculator 33. The filter processor 34 then supplies the filter processing output to the gain adjuster 35.

Next, a digital audio signal processing apparatus $2_3$ according to a third example of the first embodiment (hereinafter referred to as an example 1-3) will be described with reference to FIGS. 16 to 20. Differences of the example 1-3 in configuration from the foregoing example 1-1 or 1-2 will first be described. A normalizer $16_3$ of the digital audio signal processing apparatus $2_3$ according to the example 1-3 is formed by replacing the 1/f filter characteristic producer 51 in the configuration of the main parts shown in FIG. 15, or a modification of the normalizer $16_2$ shown in FIG. 10, with an F characteristic gradient calculator 93 and a filter characteristic producer 94.

Figure 3:
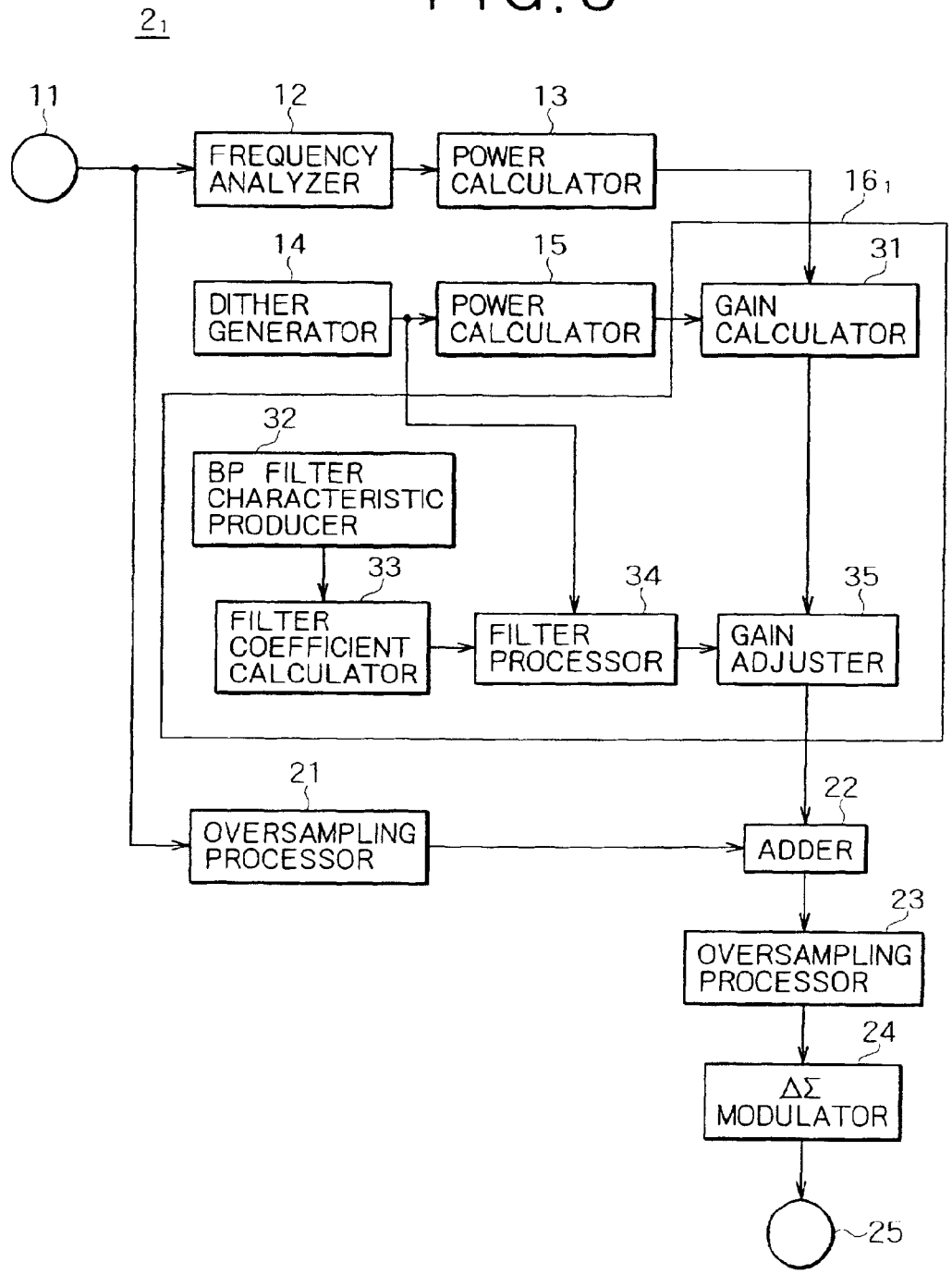
FIG. 3 is a block diagram showing a configuration of a digital audio signal processing apparatus according to a first example of the first embodiment (example 1-1)

Specifically, the normalizer $16_3$ of the digital audio signal processing apparatus $2_3$ includes the gain calculator 31, the band-pass (BP) filter characteristic producer 32, the filter coefficient calculator 33, the filter processor 34, and the gain adjuster 35, which formed the normalizer $16_1$ in FIG. 3, as well as the F characteristic gradient calculator 93, the filter characteristic producer 94, and a filter characteristic combiner 92.

Figure 17:
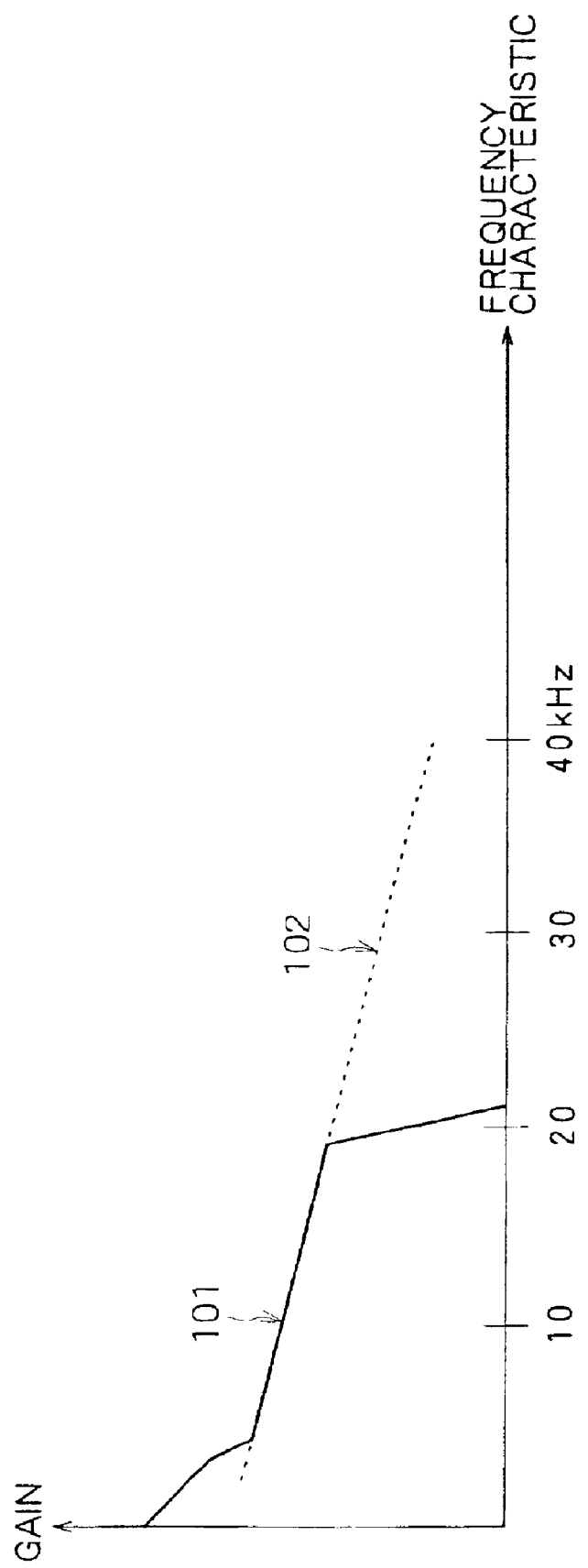
FIG. 17 is a frequency characteristic diagram of assistance in explaining gradient calculation processing of an F characteristic gradient calculator forming the digital audio signal processing apparatus according to the example 1-3.

Operation of the normalizer $16_3$ of the digital audio signal processing apparatus $2_3$ according to the example 1-3 will next be described. The F characteristic gradient calculator 93 calculates a gradient 102 of a frequency characteristic 101 in a range of 10 kHz to 20 kHz as shown in FIG. 17, for example, from a result of PCM signal frequency analysis by a frequency analyzer 12.

Figure 18:
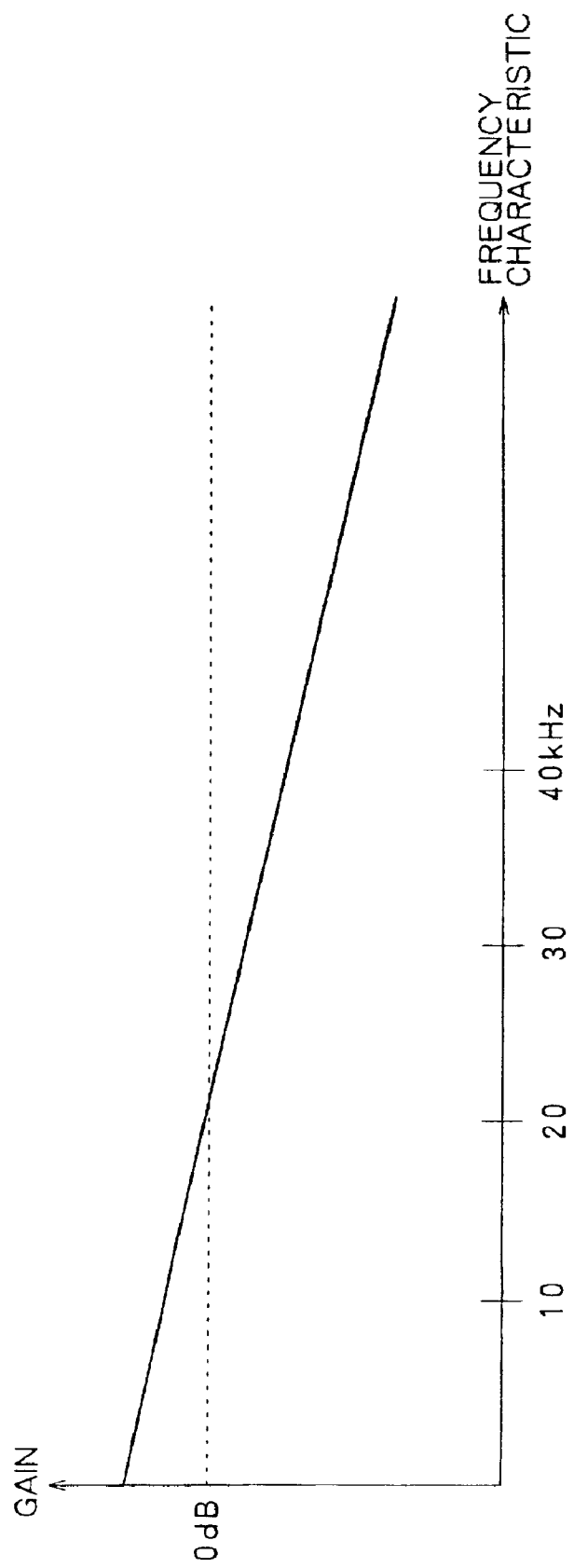
FIG. 18 is a frequency characteristic diagram showing a filter characteristic produced by a filter characteristic producer forming the digital audio signal processing apparatus according to the example 1-3.

The filter characteristic producer 94 produces a filter characteristic such that an amplitude is reduced with increasing frequency, as shown in FIG. 18, from the gradient 102 of the frequency characteristic 101, and then supplies the filter characteristic to the filter characteristic combiner 92.

The filter characteristic combiner 92 combines the filter characteristic shown in FIG. 18 generated by the filter characteristic producer 94 with the filter characteristic shown earlier in FIG. 4 generated by the BP filter characteristic producer 32, and then supplies the combined filter characteristic to the filter coefficient calculator 33.

Figure 19:
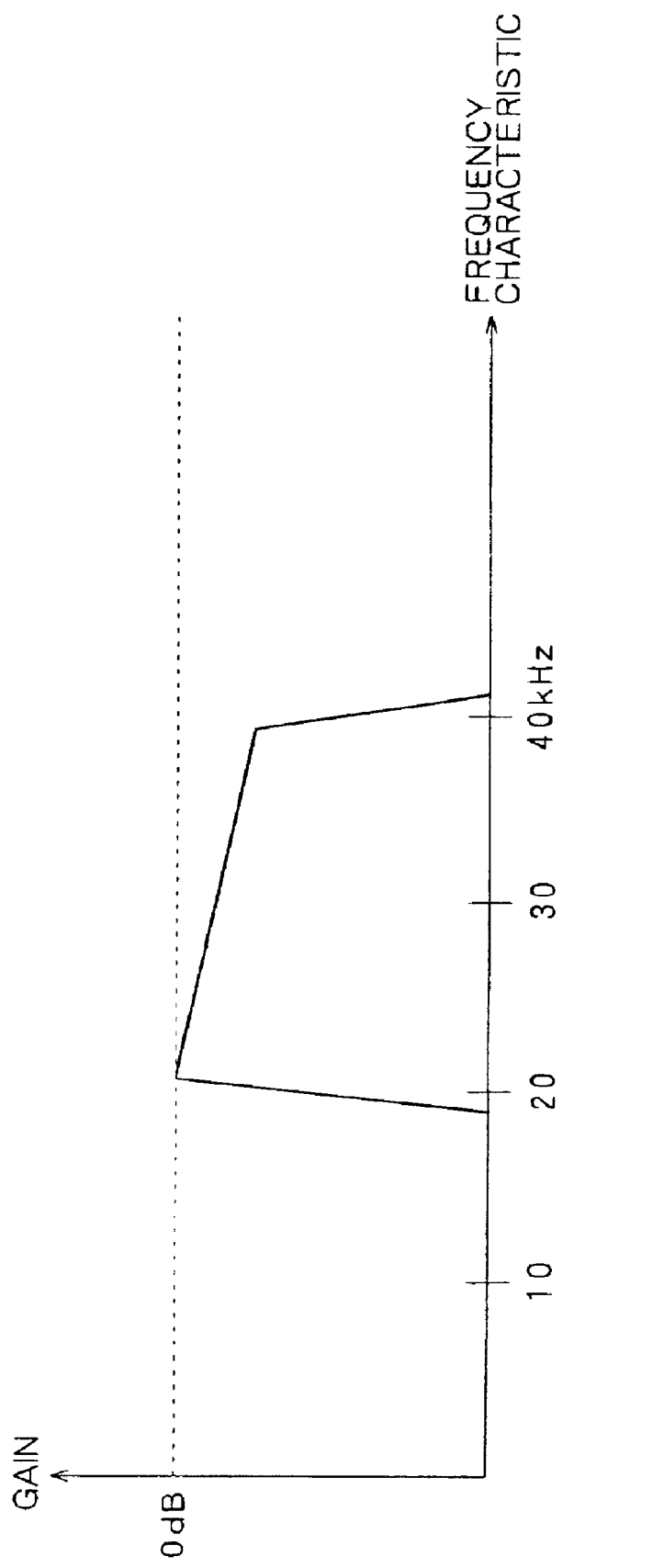
FIG. 19 is a frequency characteristic diagram showing a filter processing output of a filter processor forming the digital audio signal processing apparatus according to the example 1-3.

The filter coefficient calculator 33 converts the combined filter characteristic into a filter coefficient to be used in the filter processor 34. The filter processor 34 subjects a dither signal from a dither generator 14 to filter processing using the filter coefficient calculated by the filter coefficient calculator 33. The filter processor 34 then supplies the filter processing output as shown in FIG. 19 to the gain adjuster 35.

The gain adjuster 35 renders power of the dither signal, or the filter processing output (FIG. 19) of the filter processor 34, equal to average power of the PCM signal in a range of 18 kHz to 20 kHz by using a coefficient from the gain calculator 31, and then sends the result to an adder 22.

The adder 22 adds the dither signal whose power has been subjected to gain adjustment by the gain adjuster 35 to the PCM signal that has been subjected to 2x oversampling processing by an oversampling processor 21. Thus, in spectral terms, frequency spectra are combined with each other in a smooth manner, as shown in FIG. 20.

Specifically, the dither signal 105 resulting from power adjustment by the gain adjuster 35 of the filter processing output 104 obtained by subjecting the dither signal of the dither generator 14 to the filter processing by the filter processor 34 is combined in a smooth manner with the result 103 obtained by subjecting the PCM signal inputted from an input terminal 11 to frequency analysis processing by a frequency analyzer 12.

As described above, a $\Delta\Sigma$ modulator 24 is capable of outputting a high-quality 1-bit audio signal. The high-quality 1-bit audio signal is outputted via an output terminal 25 as an output of the digital audio signal processing apparatus $2_3$.

Figure 20:
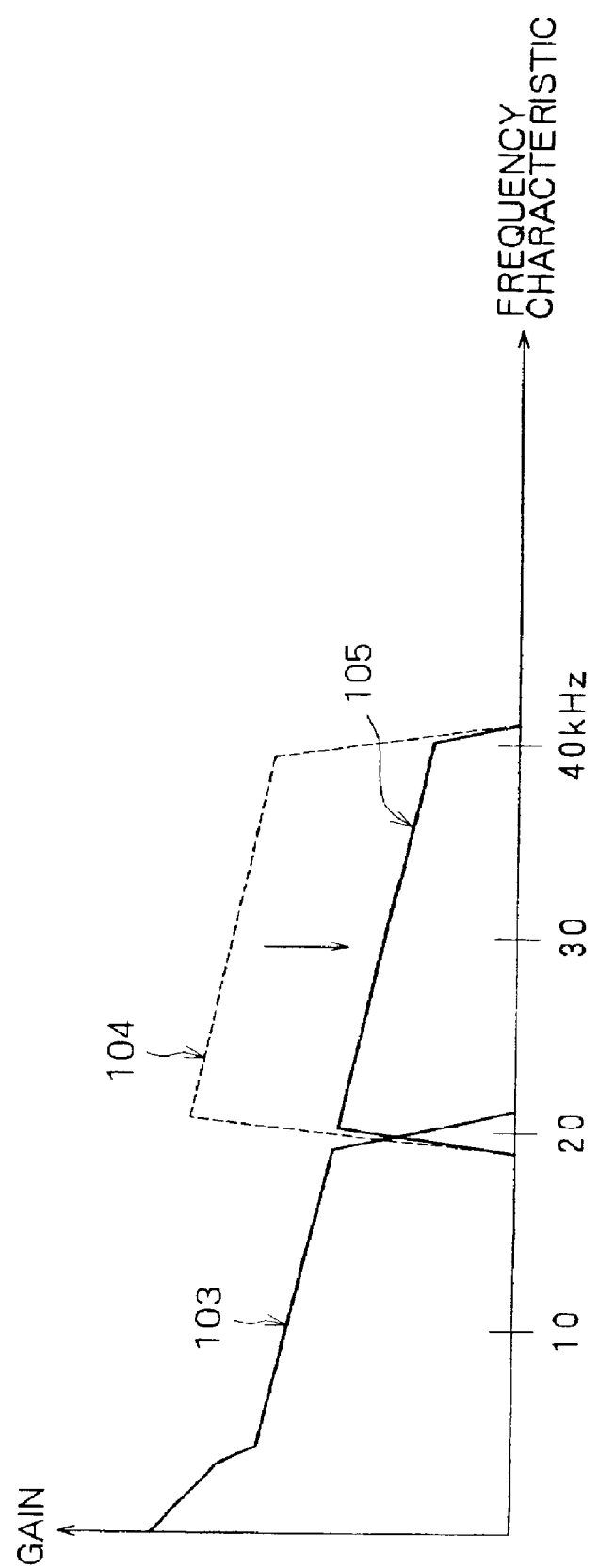
FIG. 20 is a frequency characteristic diagram showing, in the form of frequency spectra, an addition output of an adder forming the digital audio signal processing apparatus according to the example 1-3.

The digital audio signal processing apparatus $2_3$ according to the example 1-3 described above generates a signal of high frequencies beyond the audible range by means of the dither generator 14, limits frequency characteristics by means of the BP filter characteristic producer 32, the F characteristic gradient calculator 93, and the filter characteristic producer 94 of the normalizer $16_3$, normalizes the power of the signal, adds the resulting signal to an oversampled PCM signal such that the signals are combined with each other in a smooth manner as shown in FIG. 20, further oversamples the addition output, and then subjects the oversampled addition output to $\Delta\Sigma$ modulation, whereby a 1-bit audio signal is generated. Since the 1-bit audio signal includes the signal that is beyond the frequency range of the PCM signal and whose gradient is calculated by the F characteristic gradient calculator 93, it is possible to provide a natural sound such that perceived depth of the acoustic sound image is extended in a front to rear direction.

As is clear from the above descriptions of the examples 1-1, 1-2, and 1-3, the digital audio signal processing apparatus 2 according to the first embodiment generates a signal of high frequencies beyond the audible range by means of the dither generator 14, adds the signal to an oversampled PCM signal, further oversamples the addition output, and then subjects the oversampled addition output to $\Delta\Sigma$ modulation, whereby a 1-bit audio signal is generated. The examples provide different gradients or ranges for the signal of high frequencies beyond the audible range to be added to the oversampled PCM signal, by means of the filter processors within the normalizers $16_1$, $16_2$, and $16_3$, and further adjust the power of the signal- Each of the examples extends perceived depth of the acoustic sound image in a front to rear direction and also extends perceived stereo sound in a left to right direction, thus resulting in an improved separation of sounds. The examples reproduce even a subtle sound, making it possible to perceive even a background noise in a hall, for example, and thus provide a better atmosphere. In addition, a result obtained by a measurement shows that the brain under the measurement generates an alpha wave, which indicates increased comfortability.

A second embodiment will next be described. The second embodiment is also a digital audio signal processing apparatus 110 included in a high-speed 1-bit audio signal generating system 1 as shown in FIG. 1.

Figure 21:
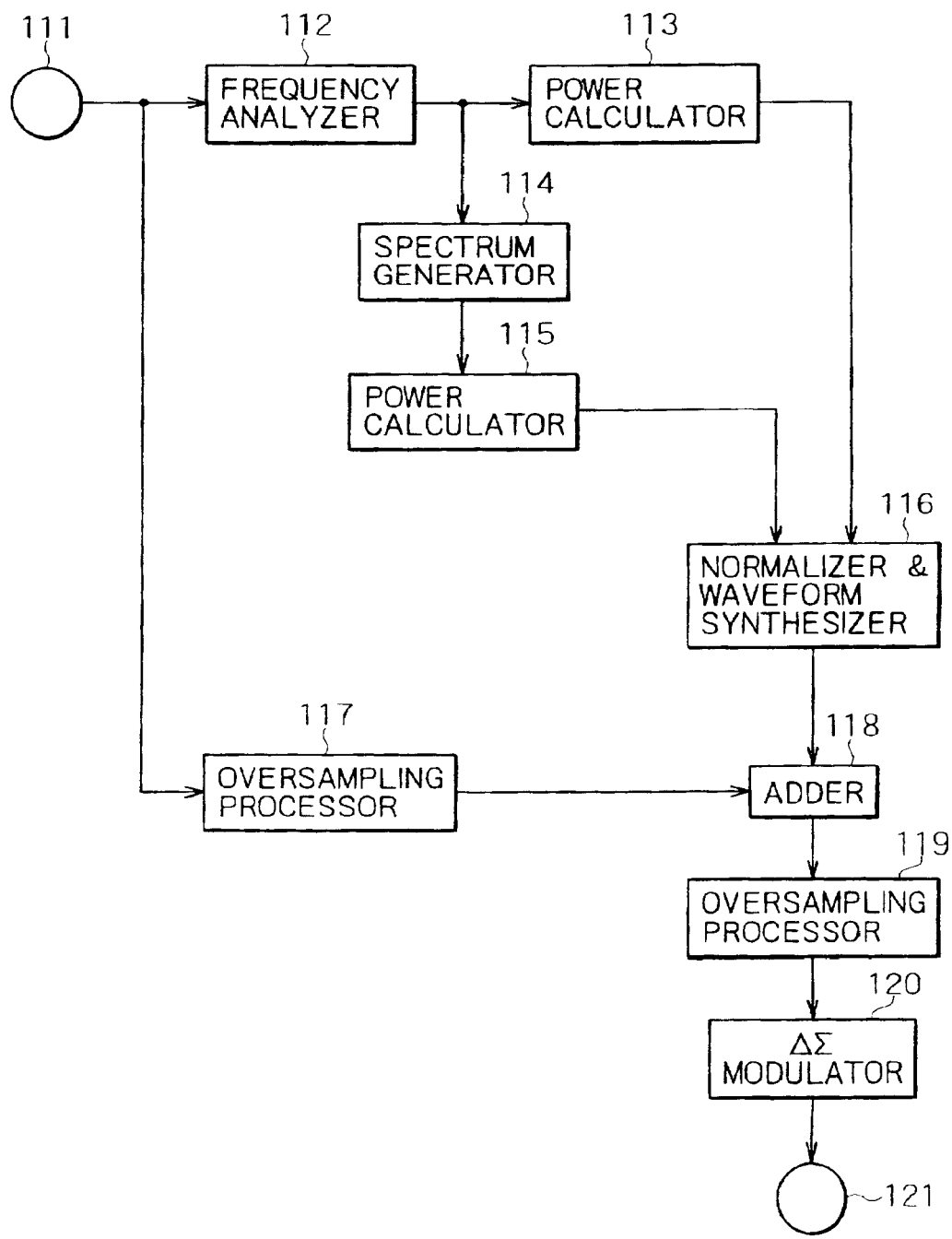
FIG. 21 is a block diagram showing a configuration of a digital audio signal processing apparatus according to a second embodiment.

A configuration of the digital audio signal processing apparatus 110 is shown in FIG. 21. The digital audio signal processing apparatus 110 includes: a frequency analyzer 112 for subjecting a PCM signal inputted from an input terminal 111 to frequency analysis processing; and a power calculator 113 for calculating an average noise level of a predetermined range of the PCM signal from a result of the frequency analysis of the frequency analyzer 112.

The digital audio signal processing apparatus 110 further includes: a spectrum generator 114 for generating a spectrum of a signal of high frequencies beyond an audible range, which signal is to be added to the PCM signal; a power calculator 115 for calculating power of the spectrum of the signal of high frequencies beyond the audible range generated by the spectrum generator 114; and a normalizer and waveform synthesizer 116 for normalizing the power of the spectrum calculated by the power calculator 115 and synthesizing the spectrum into a temporal waveform signal.

The digital audio signal processing apparatus 110 further includes: an oversampling processor 117 for oversampling the PCM signal at a sampling frequency of m (m is a positive integer $\geq 2$)×fs (Hz); an adder 118 for adding the PCM signal oversampled by the oversampling processor 117 to the signal of high frequencies beyond the audible range normalized and synthesized into a waveform by the normalizer and waveform synthesizer 116; an oversampling processor 119 for oversampling an addition output of the adder 118 at a sampling frequency of n (n is a positive integer $\geq 2$)×fs (Hz); and a $\Delta\Sigma$ modulator 120 for converting the multi-bit digital signal oversampled by the oversampling processor 119 into a 1-bit digital signal, and outputting the 1-bit digital signal from an output terminal 121.

The frequency analyzer 112 subjects the PCM signal inputted from the input terminal 111 to frequency analysis processing in a range of DC to 22.05 kHz using a fast Fourier transformation FFT, for example, and then supplies a result of the frequency analysis to the power calculator 113.

The power calculator 113 calculates an average power in a range of 18 kHz to 20 kHz, for example, from the result of the frequency analysis supplied by the frequency analyzer 112. The average power calculated by the power calculator 113 is sent to the normalizer and waveform synthesizer 116.

The spectrum generator 114 generates the spectrum of the signal of high frequencies beyond the audible range, or a frequency range of the PCM signal, which signal of high frequencies is to be added to the PCM signal, from the result of the frequency analysis supplied by the frequency analyzer 112 such that the signal of high frequencies is correlated with the PCM signal. Configuration and operation of the spectrum generator 114 will be described later in detail.

The power calculator 115 calculates the power of the spectrum generated by the spectrum generator 114 in a range of 23 kHz to 25 kHz, for example. The power of the spectrum calculated by the power calculator 115 is sent to the normalizer and waveform synthesizer 116.

The normalizer and waveform synthesizer 116 normalizes the power of the spectrum calculated by the power calculator 115 on the basis of the average power calculated by the power calculator 113, and supplies an output obtained by restoring the spectrum to a temporal waveform signal to the adder 118. Configuration and operation of the normalizer and waveform synthesizer 116 will also be described later in detail.

The oversampling processor 117 oversamples the PCM signal with a quantization frequency of 44.1 kHz and a quantization word length of 16 bits, which signal is inputted from the input terminal 111, at a sampling frequency of 2×44.1 kHz, and then supplies an output of the oversampling processing to the adder 118.

The adder 118 adds the normalized temporal waveform signal output from the normalizer and waveform synthesizer 116 to the oversampling output from the oversampling processor 117, and then supplies the addition output to the oversampling processor 119.

The oversampling processor 119 oversamples the addition output at a sampling frequency of 32×44.1 kHz. Thus, an oversampling output from the oversampling processor 119 is an output of 64× oversampling of the PCM signal with the quantization frequency of 44.1 kHz and the quantization word length of 16 bits. The 64× oversampling output is sent to the $\Delta\Sigma$ modulator 120 to be subjected to delta sigma modulation processing and thereby converted into a 1-bit audio signal. The 1-bit audio signal is then supplied to the output terminal 121.

The digital audio signal processing apparatus 110 according to the second embodiment may be classified into several examples by forming the spectrum generator 114 and the normalizer and waveform synthesizer 116 in different manners. The examples will be described in the following.

Figure 22:
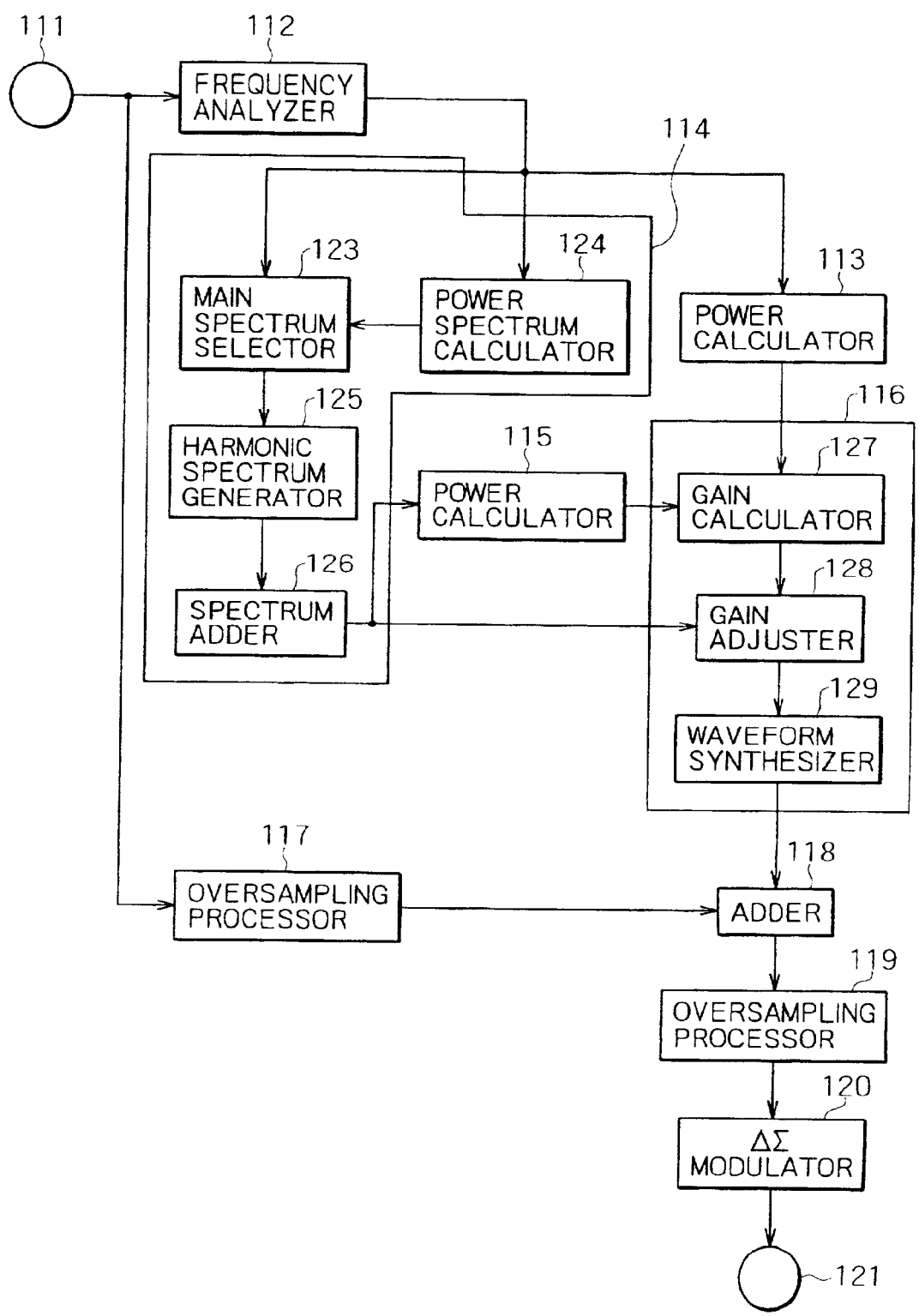
FIG. 22 is a block diagram showing a configuration of a digital audio signal processing apparatus according to a first example of the second embodiment (example 2-1)

To begin with, a digital audio signal processing apparatus $110_1$ according to a first example of the second embodiment (hereinafter referred to as an example 2-1) will be described with reference to FIGS. 22 to 26. A spectrum generator 114 of the digital audio signal processing apparatus $110_1$ according to the example 2-1 includes a main spectrum selector 123, a power spectrum calculator 124, a harmonic spectrum generator 125, and a spectrum adder 126, as shown in FIG. 22.

Figure 23:
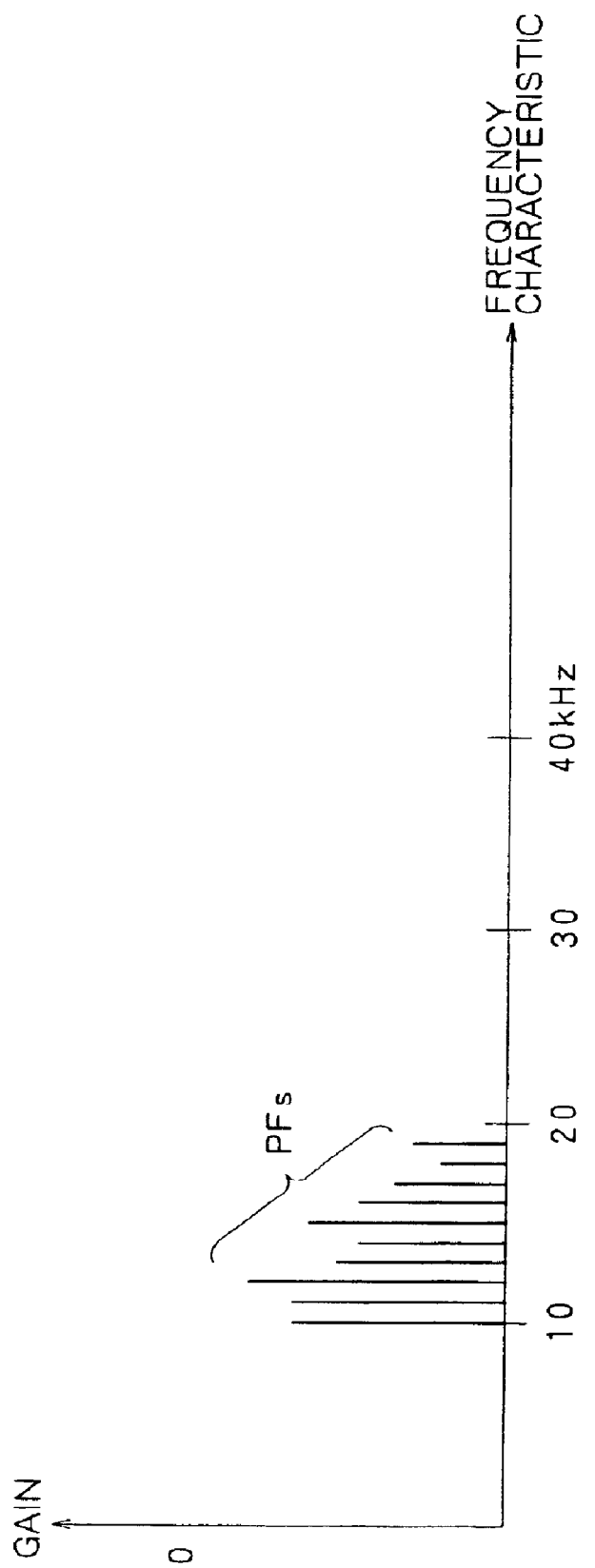
FIG. 23 is a frequency characteristic diagram showing a power frequency spectrum calculated by a power spectrum calculator forming the digital audio signal processing apparatus according to the example 2-1.

The power spectrum calculator 124 calculates a power frequency spectrum PFs in a range of 10 kHz to 20 kHz as shown in FIG. 23, for example, from a result of frequency analysis by a frequency analyzer 112, and then supplies the power frequency spectrum PFs to the main spectrum selector 123. In this case, the spectrum shown is simplified for description.

The main spectrum selector 123 selects frequency spectrum lines having a large power value in order on the basis of the result of frequency analysis by the frequency analyzer 112 and the power frequency spectrum PFs from the power spectrum calculator 124. For example, the main spectrum selector 123 selects top four: (1), (2), (3), and (4) shown in FIG. 24.

Figure 24:
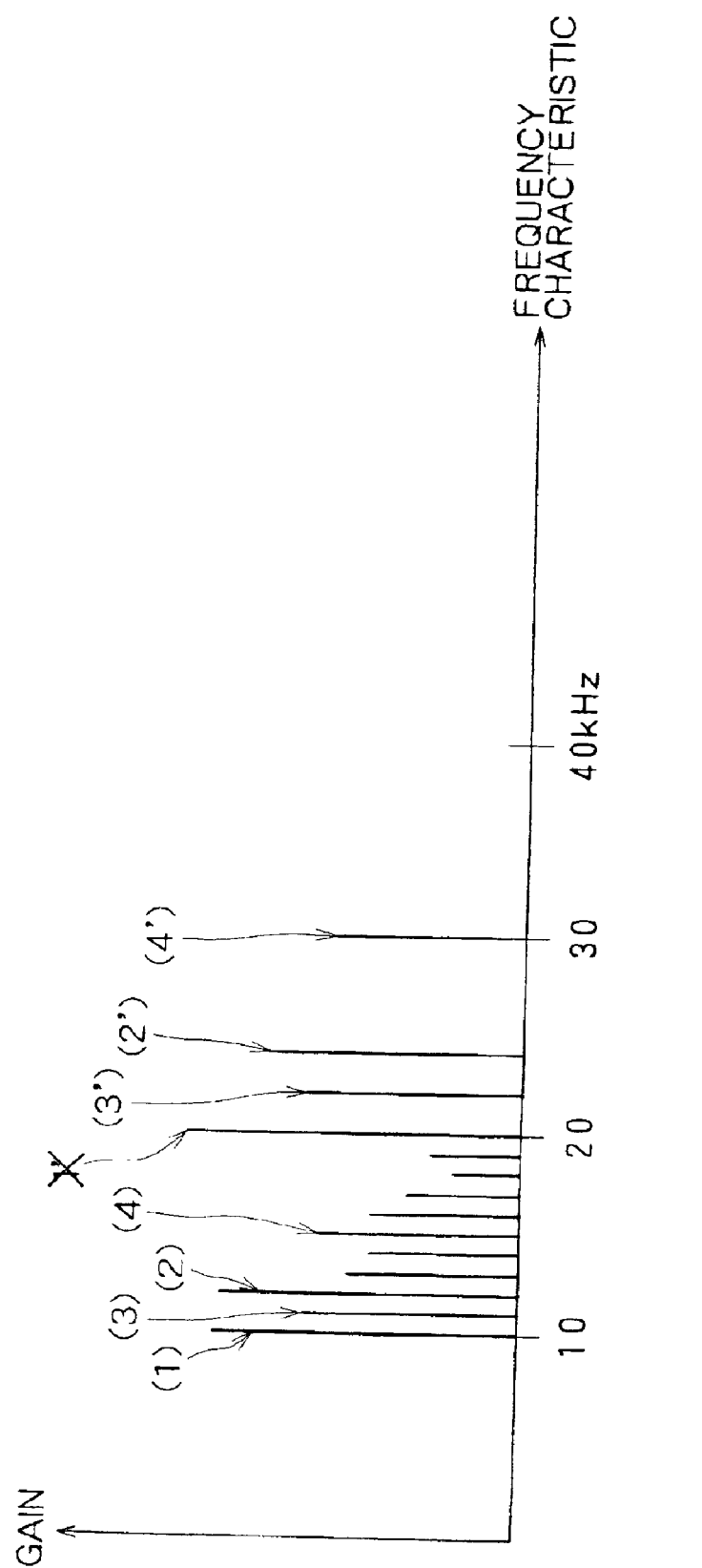
FIG. 24 is a frequency characteristic diagram showing a power frequency spectrum selected by a main spectrum selector forming the digital audio signal processing apparatus according to the example 2-1.
Figure 25:
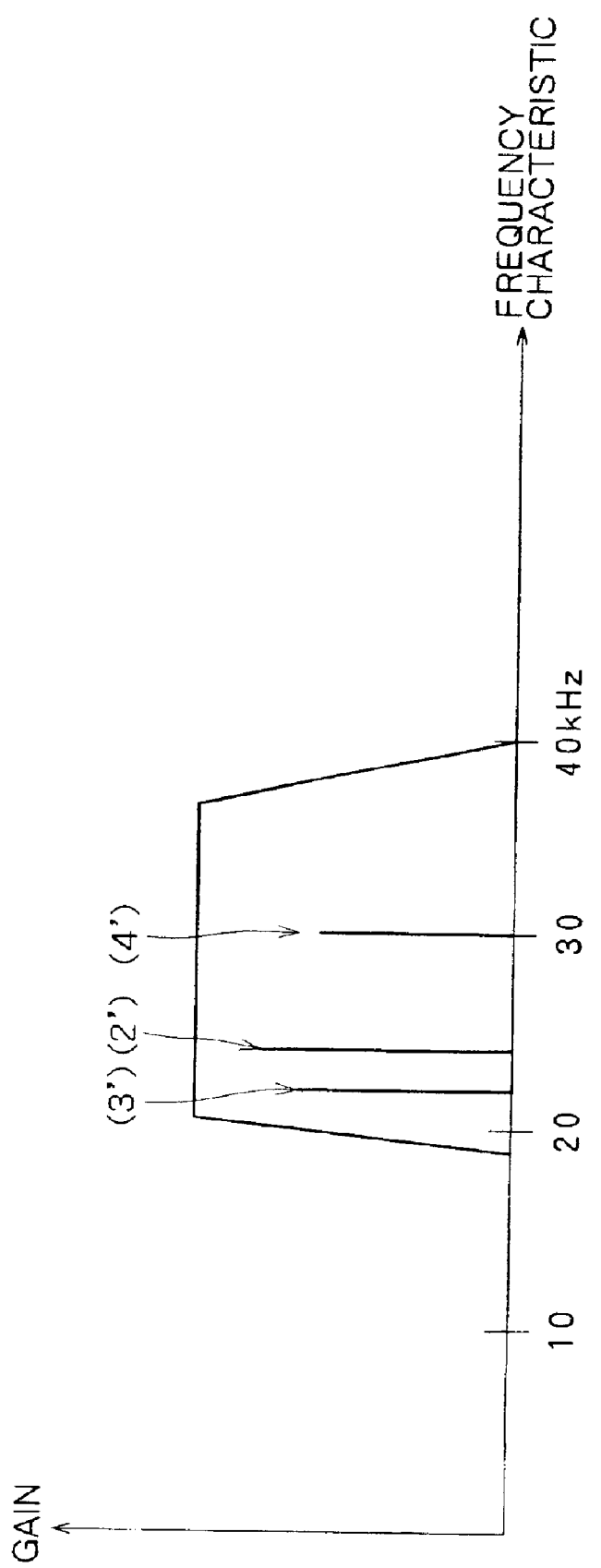
FIG. 25 is a frequency characteristic diagram showing a harmonic spectrum generated by a harmonic spectrum generator forming the digital audio signal processing apparatus according to the example 2-1.

The harmonic spectrum generator 125 calculates spectrum lines (1'), (2'), (3'), and (4') being 2n (n=1, 2, 3 . . . ) multiples of the frequency spectrum lines (1), (2), (3), and (4) selected by the main spectrum selector 123, as shown in FIG. 24, and then selects spectrum lines having a frequency in a range of more than 20 kHz to 40 kHz. Thus, since the spectrum line (1') is at 20 kHz and therefore does not exceed a selection condition of 20 kHz, the spectrum line (1') is not selected. As shown in FIG. 25, the spectrum lines (2'), (3'), and (4') are selected.

Incidentally, the limit of 40 kHz or less is derived from a sampling theorem when the oversampling processor 117 performs 2× oversampling.

The spectrum calculated by the harmonic spectrum generator 125 is supplied to the spectrum adder 126. The spectrum adder 126 adds the spectrum lines calculated by the harmonic spectrum generator 125 to their respective frequencies. The spectrum added by the spectrum adder 126 is supplied to a power calculator 115 and a normalizer and waveform synthesizer 116.

The power calculator 115 calculates the power of the spectrum from the spectrum adder 126 in a range of 23 kHz to 25 kHz, for example. The power of the spectrum calculated by the power calculator 115 is sent to the normalizer and waveform synthesizer 116.

The normalizer and waveform synthesizer 116 of the digital audio signal processing apparatus $110_1$ according to the example 2-1 includes a gain calculator 127, a gain adjuster 128, and a waveform synthesizer 129, as shown in FIG. 22.

The gain calculator 127 calculates a coefficient that renders the power of the spectrum in the range of 23 kHz to 25 kHz calculated by the power calculator 115 equal to the average power of a PCM signal in a range of 18 kHz to 20 kHz, which average power has been calculated by a power calculator 113. The coefficient calculated by the gain calculator 127 is sent to the gain adjuster 128.

The gain adjuster 128 adjusts the power of the spectrum calculated by the spectrum adder 126 by using the coefficient from the gain calculator 127, and then supplies the power-adjusted spectrum to the waveform synthesizer 129.

The waveform synthesizer 129 subjects the spectrum whose power has been adjusted by the gain adjuster 128 to inverse FFT processing, for example, to thereby convert the frequency spectrum into a temporal waveform, and then supplies the temporal waveform to the adder 118.

The adder 118 adds the temporal waveform generated by the waveform synthesizer 129 of the normalizer and waveform synthesizer 116 to the PCM signal that has been subjected to 2x oversampling processing by the oversampling processor 117. Thus, the frequency spectra are combined with each other, as shown in FIG. 26.

Figure 26:
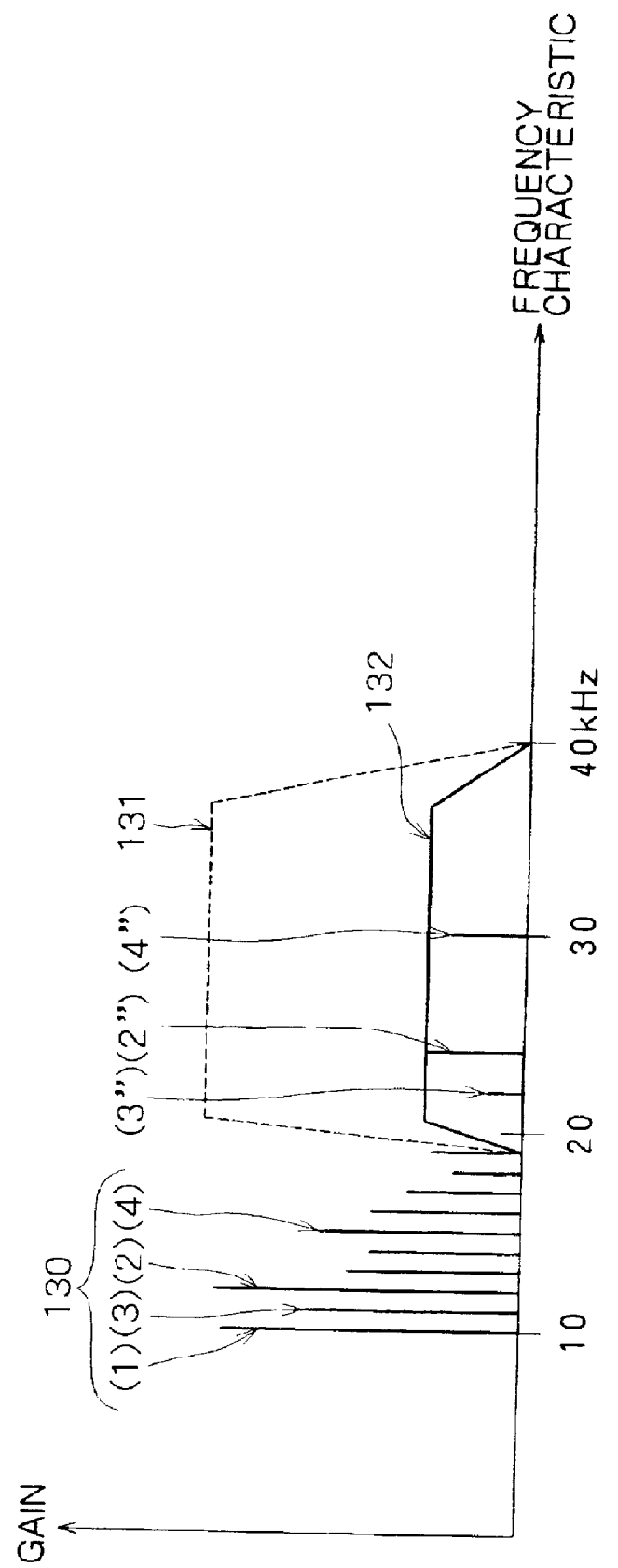
FIG. 26 is a frequency characteristic diagram showing, in the form of frequency spectra, an addition output of an adder forming the digital audio signal processing apparatus according to the example 2-1.

Specifically, in terms of the frequency spectra, as shown in FIG. 26, the spectrum 132 resulting from power adjustment by the gain adjuster 128 of the spectrum ((2"), (3"), and (4")) 131 generated by the spectrum adder 126 is combined with the power frequency spectrum ((1), (2), (3), and (4)) 130 obtained by subjecting the PCM signal inputted from an input terminal 111 to frequency analysis processing by the frequency analyzer 112.

The addition output of the adder 118 whose frequency characteristics are shown in FIG. 26 is then oversampled by an oversampling processor 119 at a sampling frequency of 32×44.1 kHz. Thus, a $\Delta\Sigma$ modulator 120 is supplied with an output of 64x oversampling of the PCM signal with the frequency characteristics shown in FIG. 26 and a sampling frequency of 44.1 kHz.

The $\Delta\Sigma$ modulator 120 employs the fundamental configuration shown in FIG. 6. In practice, the $\Delta\Sigma$ modulator 120 employs a fifth-order configuration as shown in FIG. 7, and is capable of outputting a high-quality 1-bit audio signal. The high-quality 1-bit audio signal is outputted via an output terminal 121 as an output of the digital audio signal processing apparatus $110_1$.

The digital audio signal processing apparatus $110_1$ according to the example 2-1 described above generates a signal of high frequencies beyond the audible range not included in an original PCM signal by calculating harmonics of the original PCM signal, normalizes the signal and synthesizes a waveform by means of the normalizer and waveform synthesizer 116, adds the resulting signal to an oversampled PCM signal such that the signals are combined with each other in a smooth manner as shown in FIG. 26, further oversamples the addition output, and then subjects the oversampled addition output to $\Delta\Sigma$ modulation, whereby a 1-bit audio signal is generated. Since the 1-bit audio signal includes the signal that is beyond the frequency range of the PCM signal and is correlated with the PCM signal, it is possible to provide a natural sound such that perceived depth of the acoustic sound image is extended in a front to rear direction.

While the oversampling processor 117 in the digital audio signal processing apparatus $110_1$ according to the example 2-1 performs 2x oversampling processing and the oversampling processor 119 performs 32x oversampling processing, the oversampling processor 117 may perform 4x oversampling processing and the oversampling processor 119 may perform 16x oversampling processing. Alternatively, the oversampling processor 117 may perform 8x oversampling processing and the oversampling processor 119 may also perform 8x oversampling processing.

Figure 27:
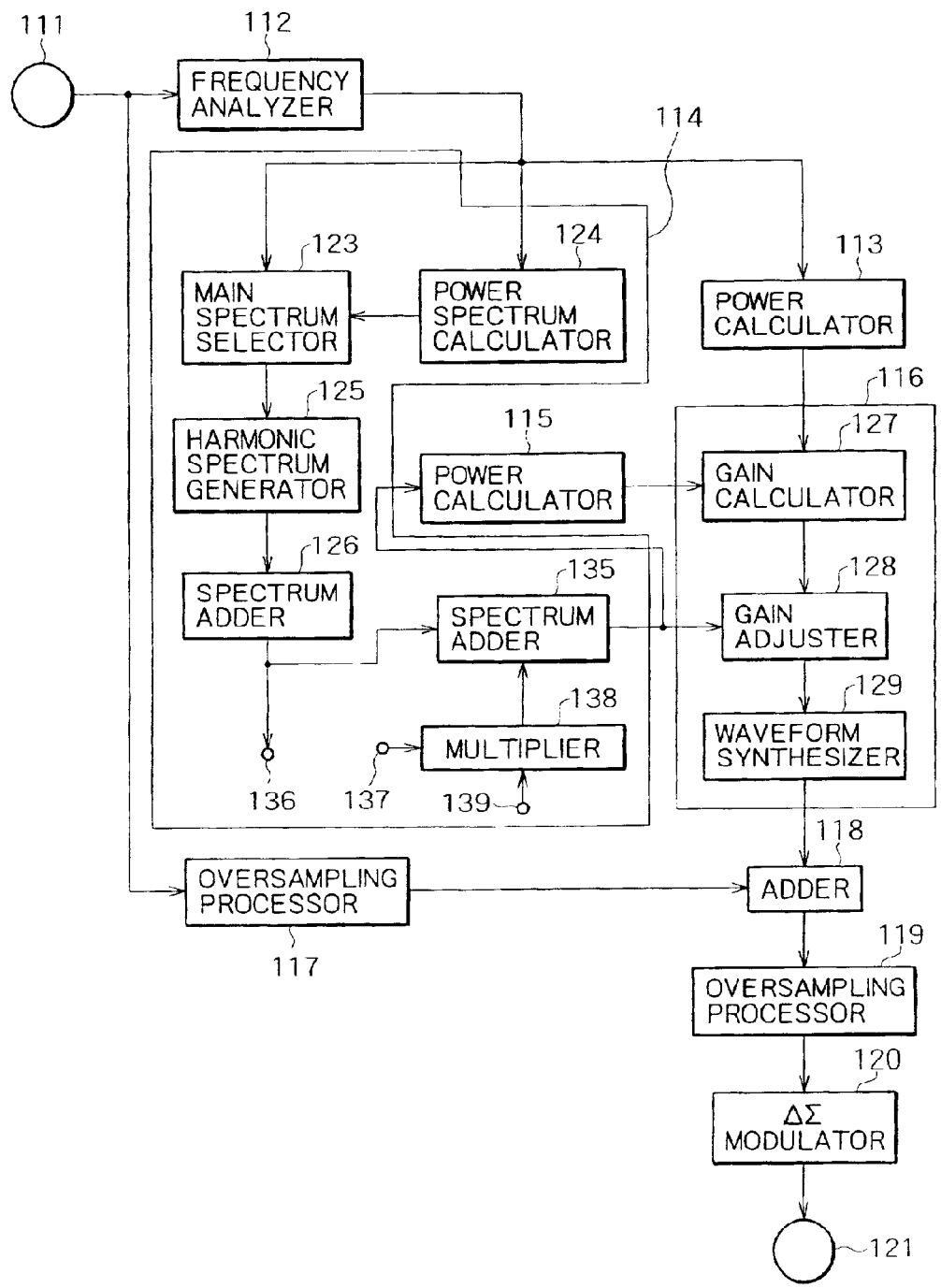
FIG. 27 is a block diagram showing a configuration of a digital audio signal processing apparatus according to a second example of the second embodiment (example 2-2)

A digital audio signal processing apparatus $110_2$ according to a second example of the second embodiment (hereinafter referred to as an example 2-2) will next be described with reference to FIGS. 27 and 28. The digital audio signal processing apparatus $110_2$ according to the example 2-2 is formed by newly adding a spectrum adder 135, a multiplier 138, an output terminal 136, an input terminal 139, and an input terminal 137 for a combining coefficient k to the spectrum generator 114 of the digital audio signal processing apparatus $110_1$ according to the example 2-1. Supposing that the digital audio signal processing apparatus $110_2$ is on one channel ch1, the digital audio signal processing apparatus $110_2$ can combine spectrum information generated on the other channel ch2, and control a degree of separation between the channels of high-frequency signals to be added to PCM signals by controlling a combining ratio.

A spectrum added by a spectrum adder 126 is supplied to the spectrum adder 135 and the output terminal 136.

Figure 28:
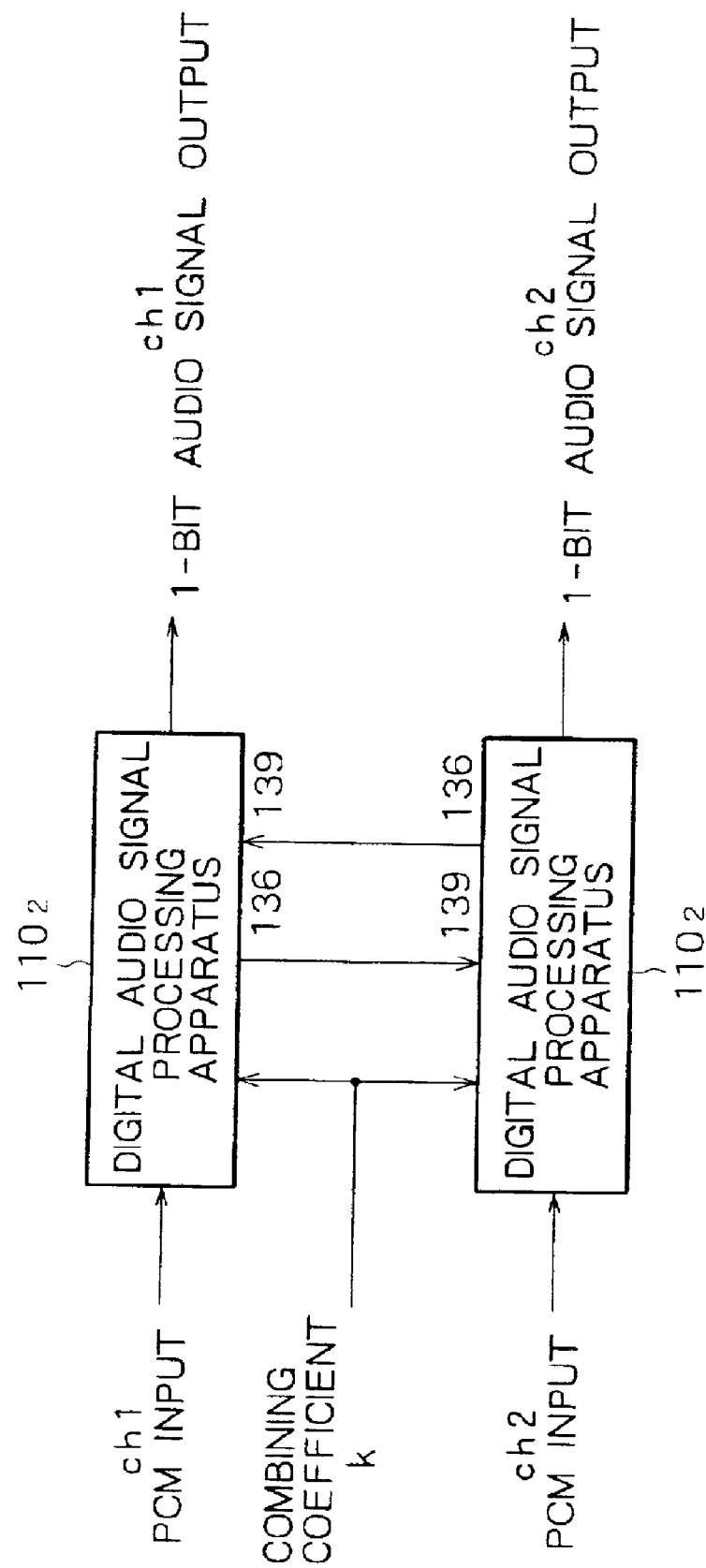
FIG. 28 is a block diagram of a system for outputting a ch1 and a ch2 1-bit audio signal using two digital audio signal processing apparatus according to the example 2- 2.

The output terminal 136 supplies the spectrum from the spectrum adder 126 to the other channel ch2, as shown in FIG. 28.

The input terminal 139 connected to the multiplier 138 is to receive a spectrum generated on the other channel ch2, as shown in FIG. 28.

The combining coefficient k supplied to the input terminal 137 connected to the multiplier 138 represents an adding ratio when the spectrum of the other channel ch2 is added. For example, letting y=ch1+k*ch2, k=0 when no spectrum of the other channel ch2 is added, while k=1 when 50% of the spectrum of the other channel ch2 is added.

The multiplier 138 multiplies the spectrum supplied from the other channel ch2 to the input terminal 139 by the combining coefficient k, and then supplies the result to the spectrum adder 135.

The spectrum adder 135 further adds the result of the multiplication of the multiplier 138 to the result of addition from the spectrum adder 126, and then supplies the result to a power calculator 115 and a gain adjuster 128.

The power calculator 115 calculates the power of the spectrum from the spectrum adder 135 in a range of 23 kHz to 25 kHz, for example. The power of the spectrum calculated by the power calculator 115 is sent to a gain calculator 127 of a normalizer and waveform synthesizer 116.

The gain adjuster 128 adjusts the power of the spectrum calculated by the spectrum adder 135 by using a coefficient from the gain calculator 127, and then supplies the power-adjusted spectrum to a waveform synthesizer 129.

Operations of the waveform synthesizer 129, an adder 118, an oversampling processor 119, and a $\Delta\Sigma$ modulator 120 are the same as in FIG. 22, and therefore their description will be omitted.

Thus, when the digital audio signal processing apparatus $110_2$ according to the example 2-2 is on the one channel ch1, the digital audio signal processing apparatus $110_2$ can combine spectrum information generated on the other channel ch2, and control a degree of separation between the channels of high-frequency signals to be added to PCM signals by controlling the combining ratio. Therefore, when the digital audio signal processing apparatus $110_2$ is connected to a speaker, a headphone or the like, it is possible to control perceived breadth of the sound field.

While the example 2-2 illustrates a case of two channels, it is possible to make a provision for more than two channels by adding spectrum adders 135 and multipliers 138 corresponding in number with the other channels.

Also, while the combining coefficient k is a fixed value, the combining coefficient k may be varied depending on the spectrum of an input signal, using a result of frequency analysis by a frequency analyzer 112.

Figure 29:
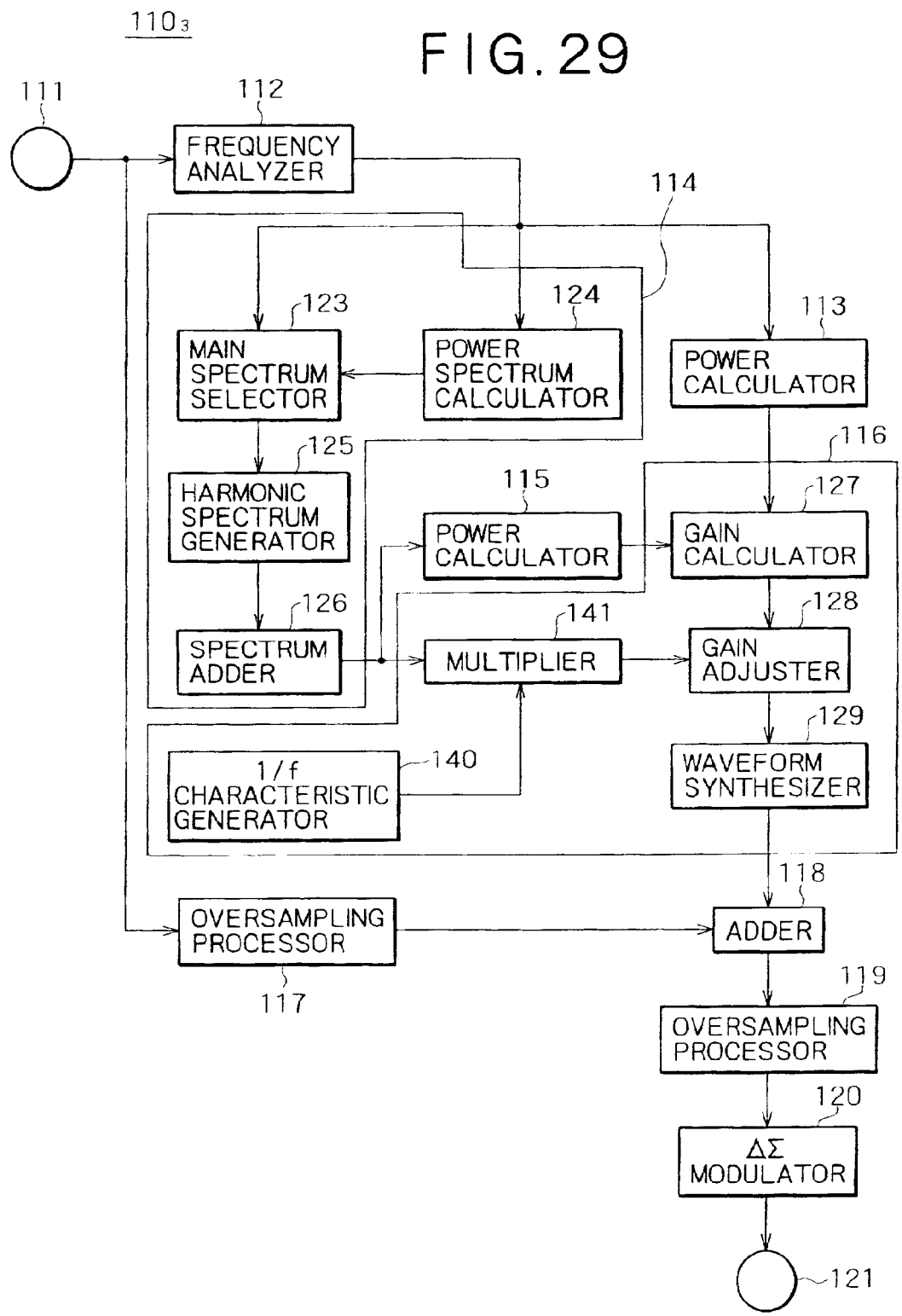
FIG. 29 is a block diagram showing a configuration of a digital audio signal processing apparatus according to a third example of the second embodiment (example 2-3)

A digital audio signal processing apparatus $110_3$ according to a third example of the second embodiment (hereinafter referred to as an example 2-3) will next be described with reference to FIGS. 29 and 32. The digital audio signal processing apparatus $110_3$ according to the example 2-3 is formed by newly adding a 1/f characteristic producer 140 and a multiplier 141 to the normalizer and waveform synthesizer 116 of the digital audio signal processing apparatus $110_1$ according to the example 2-1.

Figure 30:
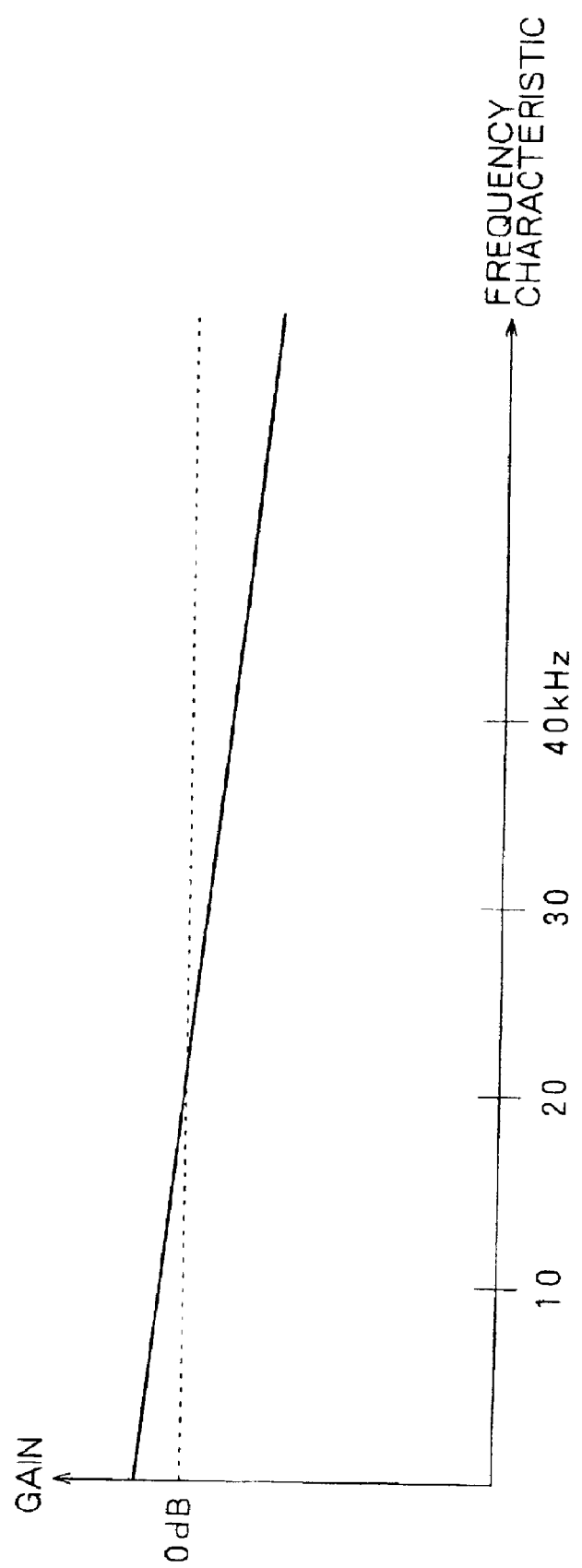
FIG. 30 is a frequency characteristic diagram showing a 1/f filter characteristic produced by a 1/f filter characteristic producer forming the digital audio signal processing apparatus according to the example 2-3.

The 1/f characteristic producer 140 produces a 1/f characteristic such that an amplitude [GAIN] is reduced with increasing frequency, and amplitudes at 20 kHz before and after processing are equal to each other, as shown in FIG. 30.

Figure 31:
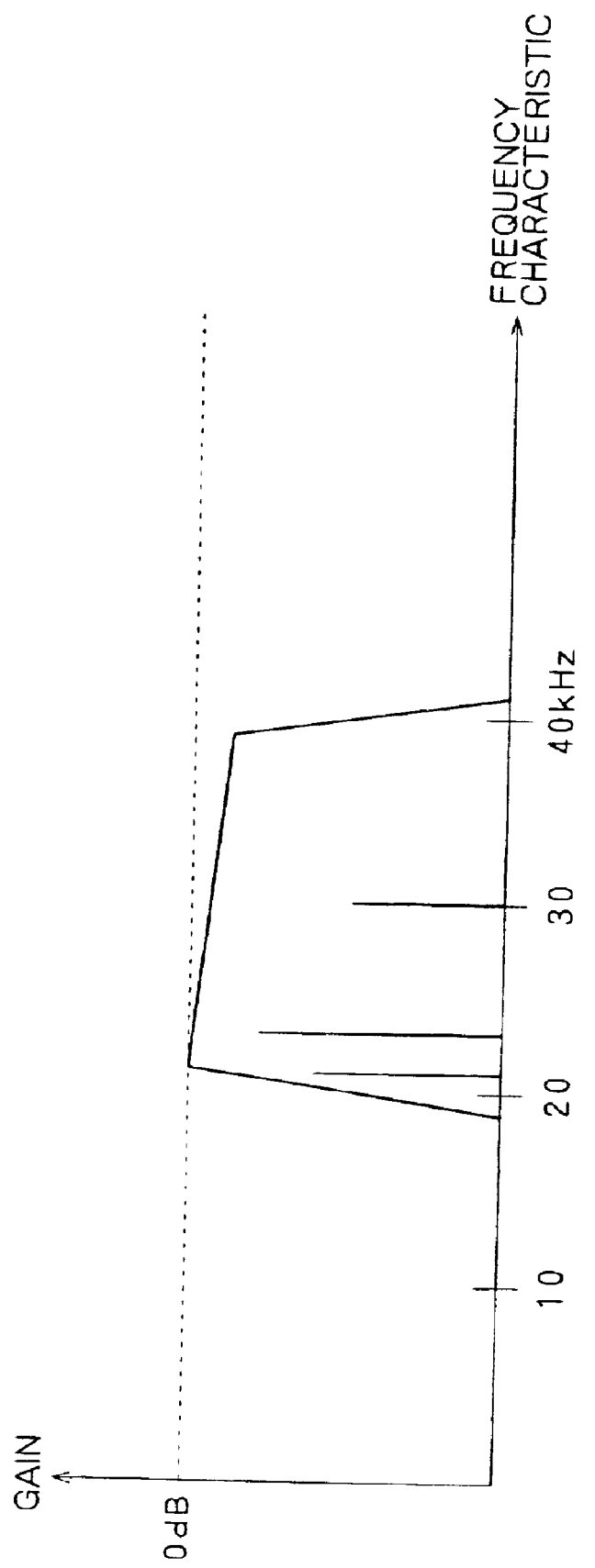
FIG. 31 is a frequency characteristic diagram showing a spectrum output of a multiplier forming the digital audio signal processing apparatus according to the example 2-3.

The multiplier 141 multiplies a spectrum generated by a spectrum adder 126 by the 1/f characteristic, and then supplies the result to a gain adjuster 128. The spectrum output of the multiplier 141 in this case is shown in FIG. 31.

The gain adjuster 128 adjusts power of the spectrum output of the multiplier 141 by using a coefficient from a gain calculator 127, and then supplies the power-adjusted spectrum to a waveform synthesizer 129.

An adder 118 adds a temporal waveform generated by the waveform synthesizer 129 of the normalizer and waveform synthesizer 116 to a PCM signal that has been subjected to 2x oversampling processing by an oversampling processor 117. Thus, the frequency spectra are combined with each other, as shown in FIG. 32.

Figure 32:
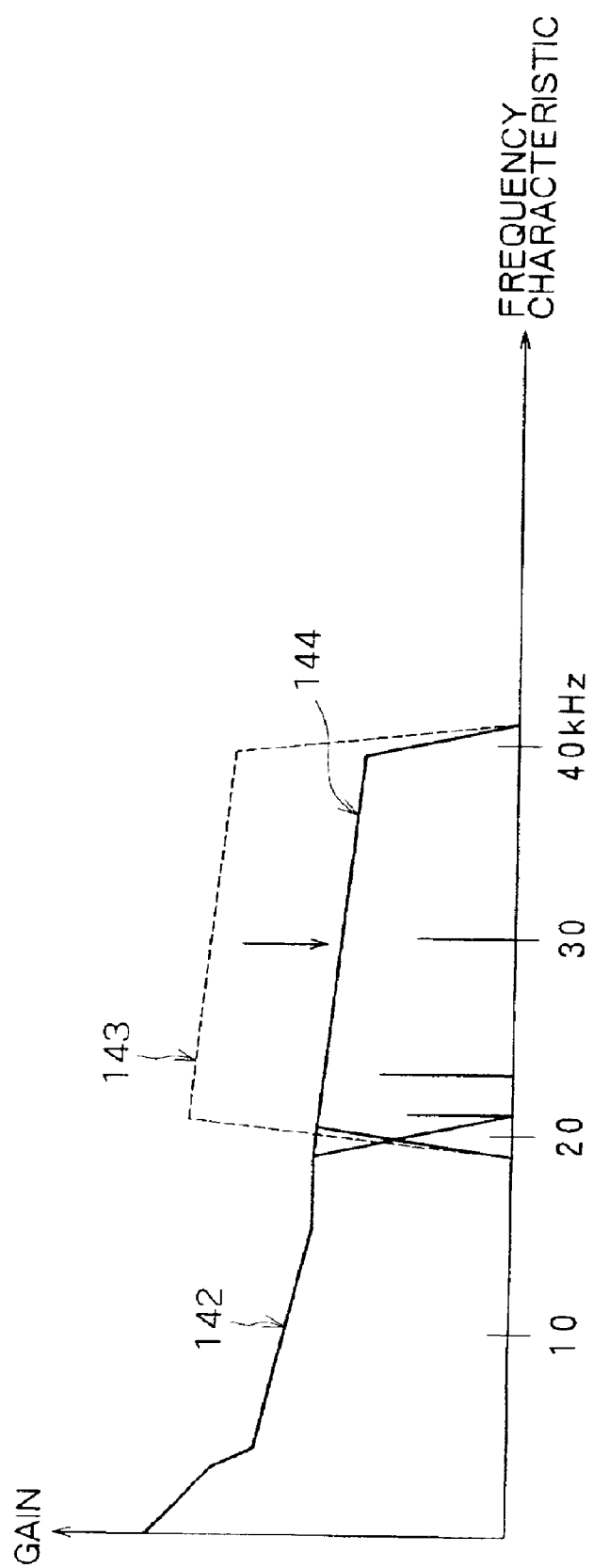
FIG. 32 is a frequency characteristic diagram showing, in the form of frequency spectra, an addition output of an adder forming the digital audio signal processing apparatus according to the example 2-3.
Figure 33:
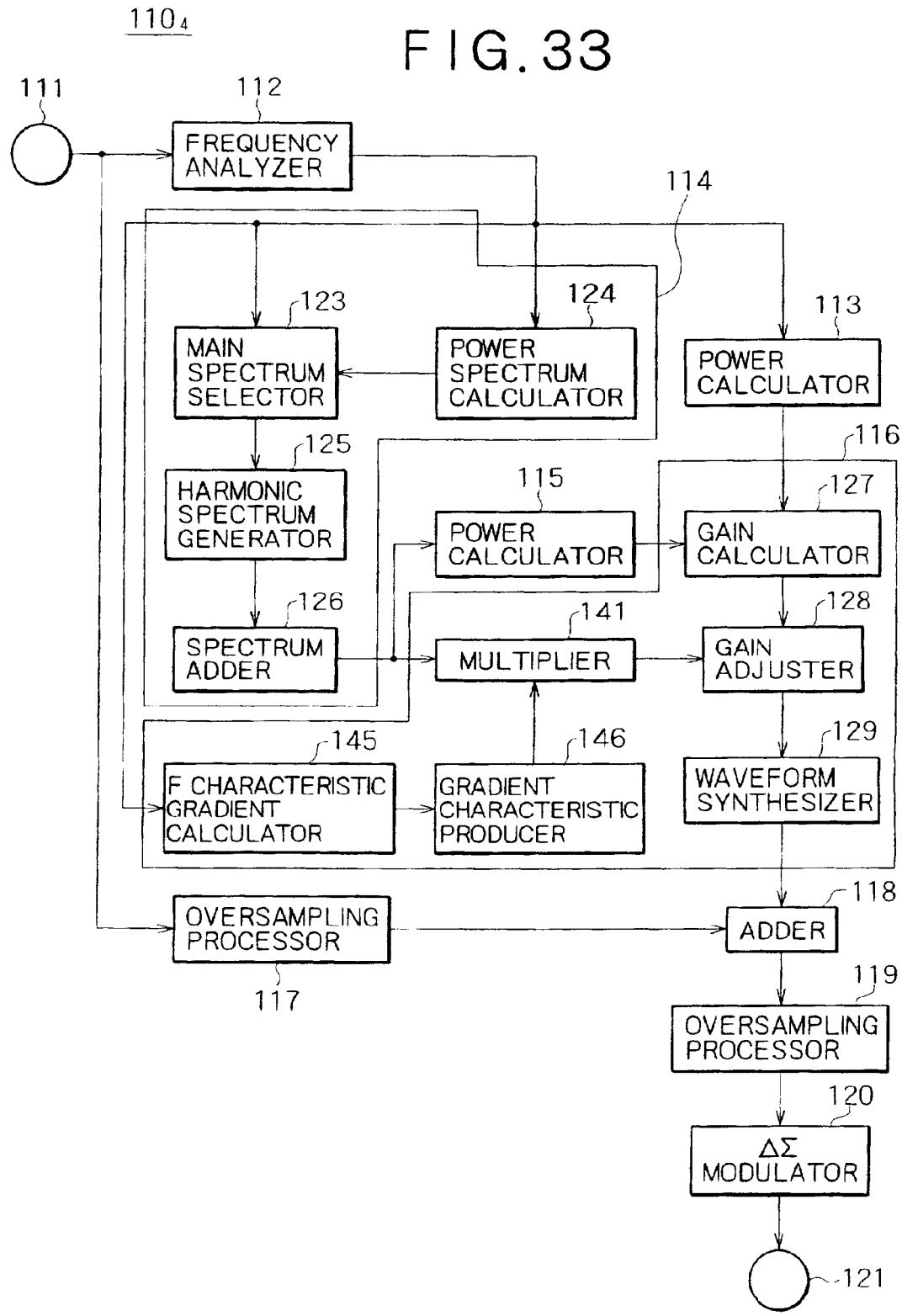
FIG. 33 is a block diagram showing a configuration of a digital audio signal processing apparatus according to a fourth example of the second embodiment (example 2-4)

Specifically, in terms of the frequency spectra, as shown in FIG. 32, the spectrum 144 resulting from power adjustment by the gain adjuster 128 of the output 143 obtained by subjecting the spectrum generated by the spectrum adder 126 to processing by the multiplier 141 is combined with a result 142 obtained by subjecting the PCM signal inputted from an input terminal 111 to frequency analysis processing by a frequency analyzer 112.

The addition output of the adder 118 whose frequency characteristics are shown in FIG. 32 is then oversampled by an oversampling processor 119 at a sampling frequency of 32×44.1 kHz. Thus, a ΔΣ modulator 120 is supplied with an output of 64x oversampling of the PCM signal with the frequency characteristics shown in FIG. 32 and a sampling frequency of 44.1 kHz.

As described above, the ΔΣ modulator 120 is capable of outputting a high-quality 1-bit audio signal. The high-quality 1-bit audio signal is outputted via an output terminal 121 as an output of the digital audio signal processing apparatus $110_3$.

The digital audio signal processing apparatus $110_3$ according to the example 2-3 described above generates a spectrum of a signal of high frequencies beyond the audible range not included in an original PCM signal by calculating harmonics of the original PCM signal, limits a frequency characteristic according to a 1/f characteristic, normalizes power of the spectrum and synthesizes a waveform by means of the normalizer and waveform synthesizer 116, adds the resulting signal to an oversampled PCM signal such that the signals are combined with each other in a smooth manner as shown in FIG. 32, further oversamples the addition output, and then subjects the oversampled addition output to ΔΣ modulation, whereby a 1-bit audio signal is generated.

Thus, since the 1-bit audio signal includes the gradient-adjusted signal that is beyond the frequency range of the PCM signal and is correlated with the PCM signal, it is possible to provide a natural sound such that perceived depth of the acoustic sound image is extended in a front to rear direction.

Furthermore, a spectrum adder 135, a multiplier 138, an output terminal 136, an input terminal 139, and an input terminal 137 for a combining coefficient k as described above in the example 2-2 may be newly added to the spectrum generator 114 of the digital audio signal processing apparatus $110_3$ to combine spectrum information generated on another channel ch2, and control a degree of separation between the channels of high-frequency signals to be added to PCM signals by controlling a combining ratio.

Next, a digital audio signal processing apparatus $110_4$ according to a fourth example of the second embodiment (hereinafter referred to as an example 2-4) will be described with reference to FIGS. 33 to 37. Differences of the example 2-4 in configuration from the foregoing example 2-1 or 2-3 will first be described. The digital audio signal processing apparatus $110_4$ according to the example 2-4 is formed by replacing the 1/f characteristic producer 140 included in the normalizer and waveform synthesizer 116 of the digital audio signal processing apparatus $110_3$ according to the example 2-3 with an F characteristic gradient calculator 145 and a gradient characteristic producer 146.

Specifically, the normalizer and waveform synthesizer 116 of the digital audio signal processing apparatus $110_4$ includes the gain calculator 127, the gain adjuster 128, and the waveform synthesizer 129, which formed the normalizer and waveform synthesizer 116 in FIG. 22, as well as the F characteristic gradient calculator 145, the gradient characteristic producer 146, and a multiplier 141.

Figure 34:
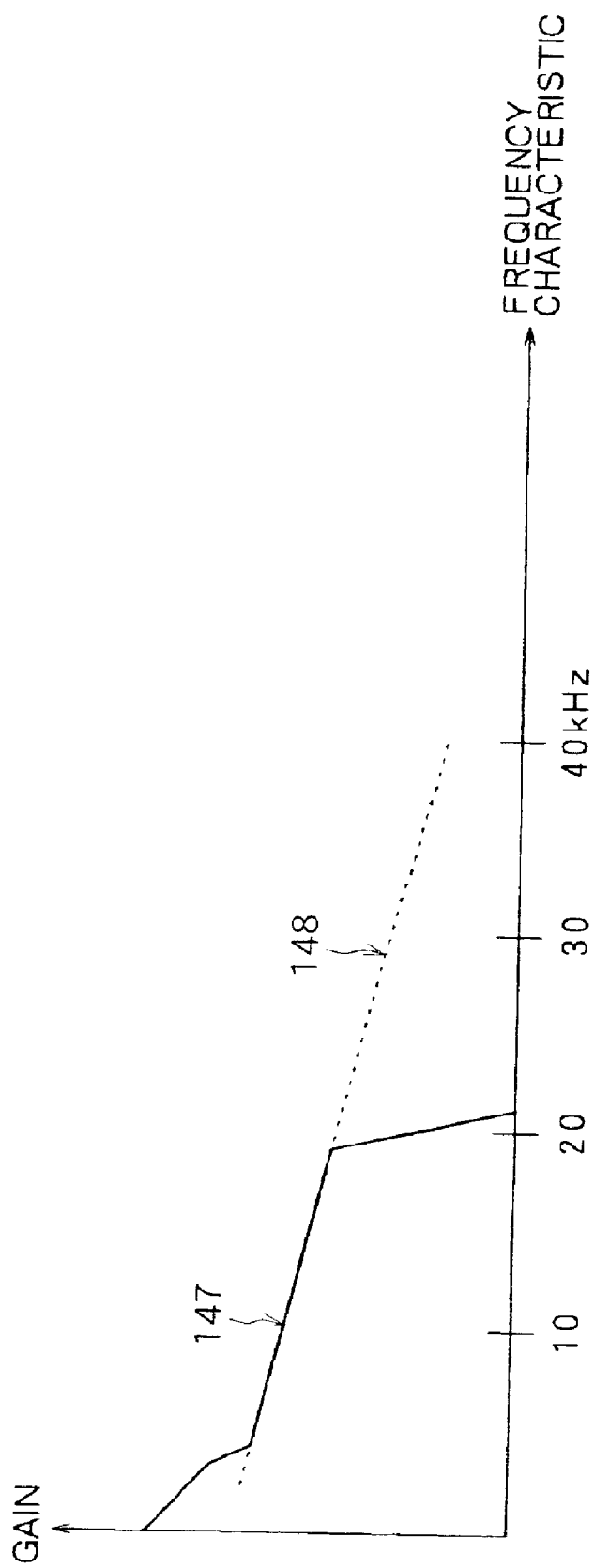
FIG. 34 is a frequency characteristic diagram of assistance in explaining gradient calculation processing of an F characteristic gradient calculator forming the digital audio signal processing apparatus according to the example 2-4.

The F characteristic gradient calculator 145 calculates a gradient 148 of a frequency characteristic 147 in a range of 10 kHz to 20 kHz as shown in FIG. 34, for example, from a result of PCM signal frequency analysis by a frequency analyzer 112.

Figure 35:
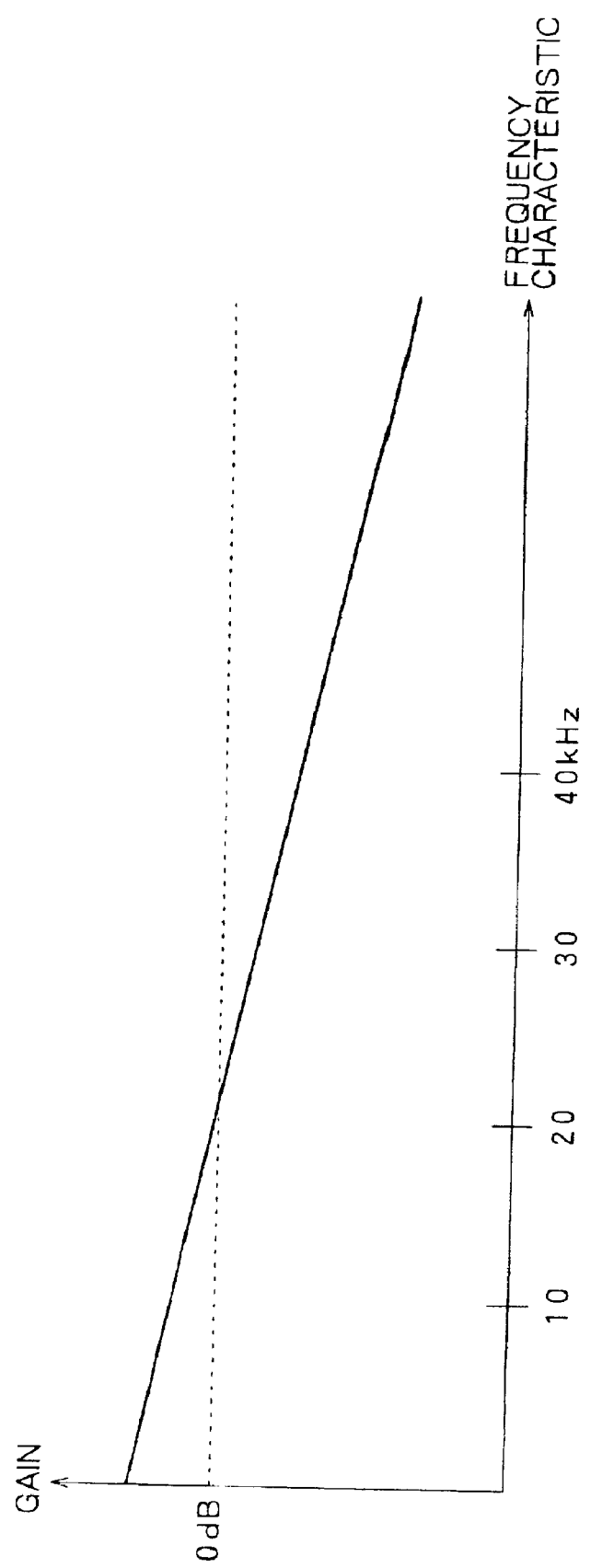
FIG. 35 is a frequency characteristic diagram showing a filter characteristic produced by a filter characteristic producer forming the digital audio signal processing apparatus according to the example 2-4.

The gradient characteristic producer 146 produces a filter characteristic such that an amplitude is reduced with increasing frequency, as shown in FIG. 35, from the gradient 148 of the frequency characteristic 147, and then supplies the filter characteristic to the multiplier 141.

Figure 36:
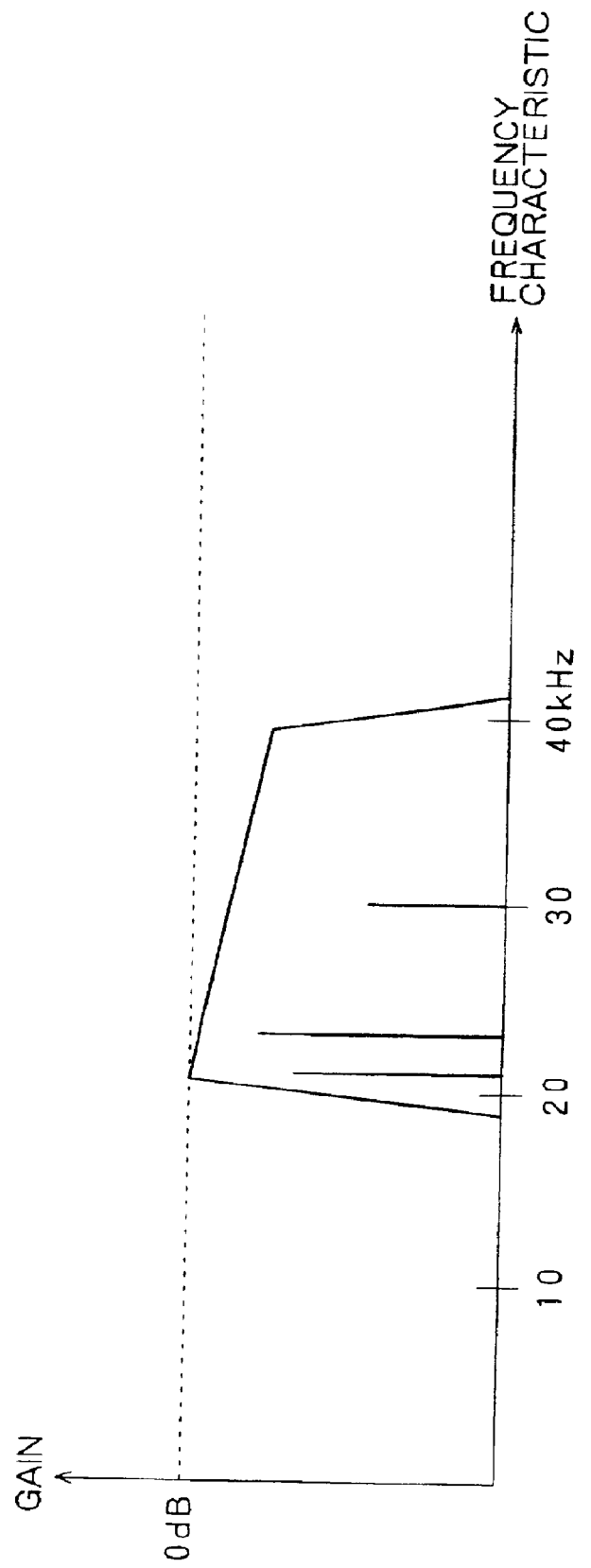
FIG. 36 is a frequency characteristic diagram showing a filter processing output of a filter processor forming the digital audio signal processing apparatus according to the example 2-4.

The multiplier 141 multiplies a spectrum generated by a spectrum adder 126 by the filter characteristic generated by the gradient characteristic producer 146, and then supplies the result to the gain adjuster 128. The spectrum output of the multiplier 141 in this case is shown in FIG. 36.

The gain adjuster 128 adjusts power of the spectrum output of the multiplier 141 by using a coefficient from the gain calculator 127, and then supplies the power-adjusted spectrum to the waveform synthesizer 129.

An adder 118 adds a temporal waveform generated by the waveform synthesizer 129 of the normalizer and waveform synthesizer 116 to a PCM signal that has been subjected to 2x oversampling processing by an oversampling processor 117. Thus, the frequency spectra are combined with each other, as shown in FIG. 37.

Figure 37:
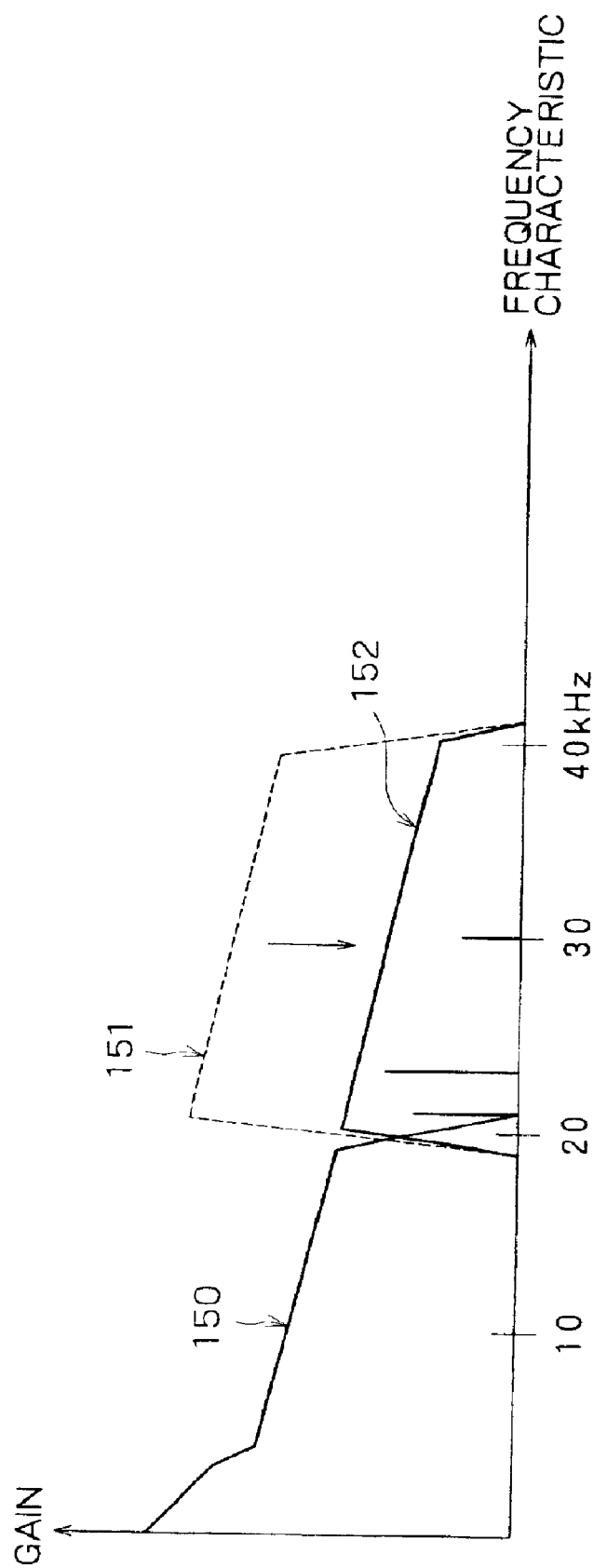
FIG. 37 is a frequency characteristic diagram showing, in the form of frequency spectra, an addition output of an adder forming the digital audio signal processing apparatus according to the example 2-4.

Specifically, in terms of the frequency spectra, as shown in FIG. 37, the spectrum 152 resulting from power adjustment by the gain adjuster 128 of the output 151 obtained by subjecting the spectrum generated by the spectrum adder 126 to processing by the multiplier 141 is combined with a result 150 obtained by subjecting the PCM signal inputted from an input terminal 111 to frequency analysis processing by the frequency analyzer 112.

The addition output of the adder 118 whose frequency characteristics are shown in FIG. 37 is then oversampled by an oversampling processor 119 at a sampling frequency of 32×44.1 kHz. Thus, a ΔΣ modulator 120 is supplied with an output of 64x oversampling of the PCM signal with the frequency characteristics shown in FIG. 37 and a sampling frequency of 44.1 kHz.

As described above, the ΔΣ modulator 120 is capable of outputting a high-quality 1-bit audio signal. The high-quality 1-bit audio signal is outputted via an output terminal 121 as an output of the digital audio signal processing apparatus 110₄.

The digital audio signal processing apparatus 110₄ according to the example 2-4 described above generates a spectrum of a signal of high frequencies beyond the audible range not included in an original PCM signal by calculating harmonics of the original PCM signal, limits the spectrum according to the gradient characteristic calculated by the F characteristic gradient calculator 145, normalizes power of the spectrum and synthesizes a temporal waveform signal by means of the normalizer and waveform synthesizer 116, adds the signal to an oversampled PCM signal such that the signals are combined with each other in a smooth manner as shown in FIG. 37, further oversamples the addition output, and then subjects the oversampled addition output to ΔΣ modulation, whereby a 1-bit audio signal is generated.

Thus, since the 1-bit audio signal includes the signal that is beyond the frequency range of the PCM signal and is correlated with the PCM signal, and whose gradient is also correlated with that of the PCM signal, it is possible to provide a natural sound such that perceived depth of the acoustic sound image is extended in a front to rear direction.

Furthermore, a spectrum adder 135, a multiplier 138, an output terminal 136, an input terminal 139, and an input terminal 137 for a combining coefficient k as described above in the example 2-2 may be newly added to the spectrum generator 114 of the digital audio signal processing apparatus 110₄ to combine spectrum information generated on another channel ch2, and control a degree of separation between the channels of high-frequency signals to be added to PCM signals by controlling a combining ratio.

Figure 38:
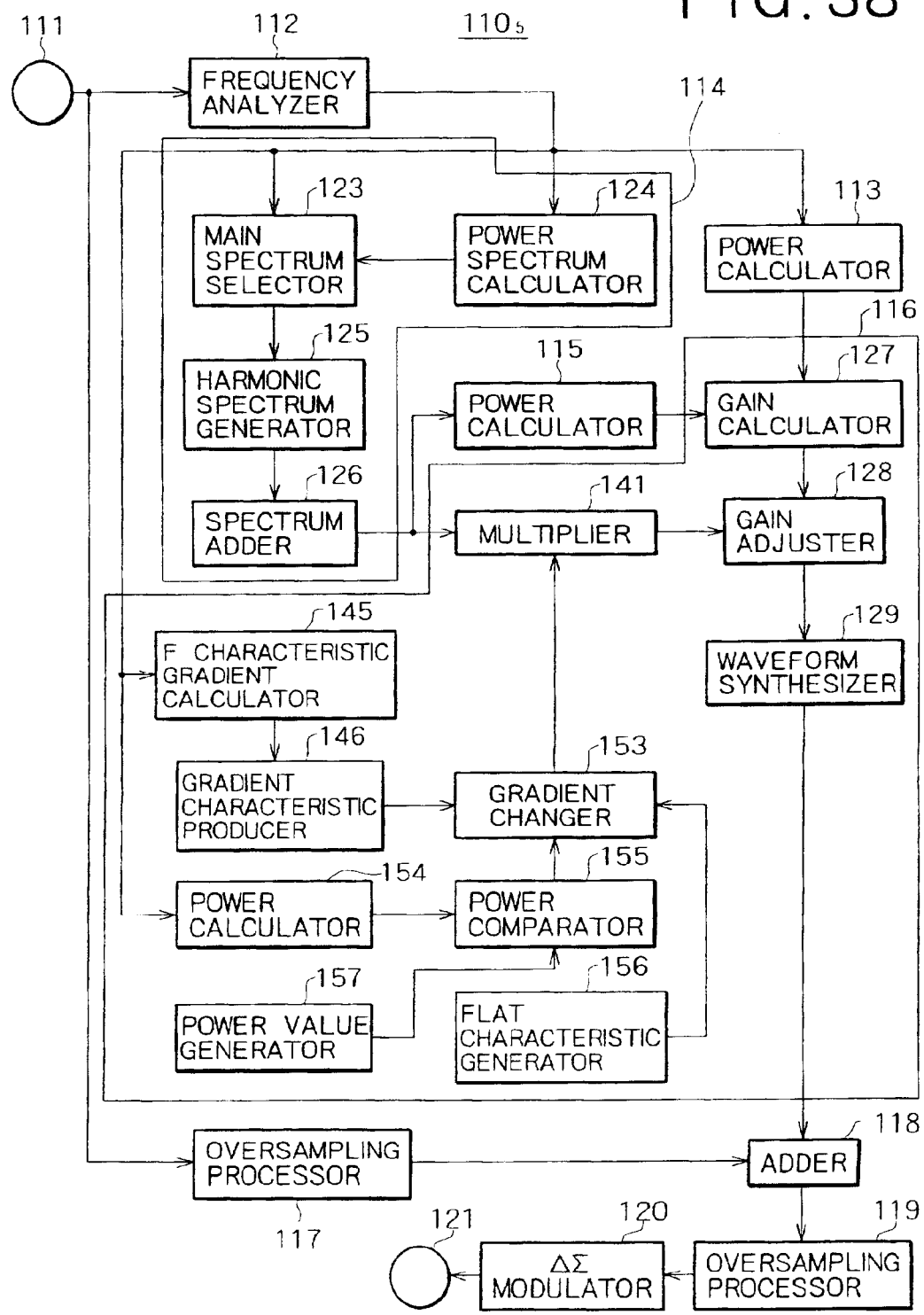
FIG. 38 is a block diagram showing a configuration of a digital audio signal processing apparatus according to a fifth example of the second embodiment (example 2-5)

A digital audio signal processing apparatus 110₅ according to a fifth example of the second embodiment (hereinafter referred to as an example 2-5) will next be described with reference to FIGS. 38 to 40. Differences of the example 2-5 in configuration from the foregoing example 2-4 will first be described. The digital audio signal processing apparatus 110₅ according to the example 2-5 is formed by newly adding a gradient changer 153, a power calculator 154, a power comparator 155, a power value generator 157, and a flat characteristic generator 156 to the normalizer and waveform synthesizer 116 of the digital audio signal processing apparatus 110₄ according to the example 2-4.

The power calculator 154 calculates a power in a range of 18 kHz to 20 kHz, for example, from an output of a result of frequency analysis by a frequency analyzer 112, and then supplies the result to the power comparator 155.

The power value generator 157 generates a power value serving as a reference for comparison by the power comparator 155. Specifically, the power value generator 157 generates −90 dB, for example, in consideration of the quantization word length of 16 bits and the signal-to-noise ratio of a PCM input.

The power comparator 155 compares the result of the power calculation by the power calculator 154 with the −90 dB from the power value generator 157, and then supplies a result of the comparison to the gradient changer 153. In this case, the power comparator 155 outputs "1" when the result of the power calculation by the power calculator 154 is greater than the −90 dB from the power value generator 157, and outputs "0" when the result of the power calculation by the power calculator 154 is not greater than the −90 dB from the power value generator 157.

Figure 39:
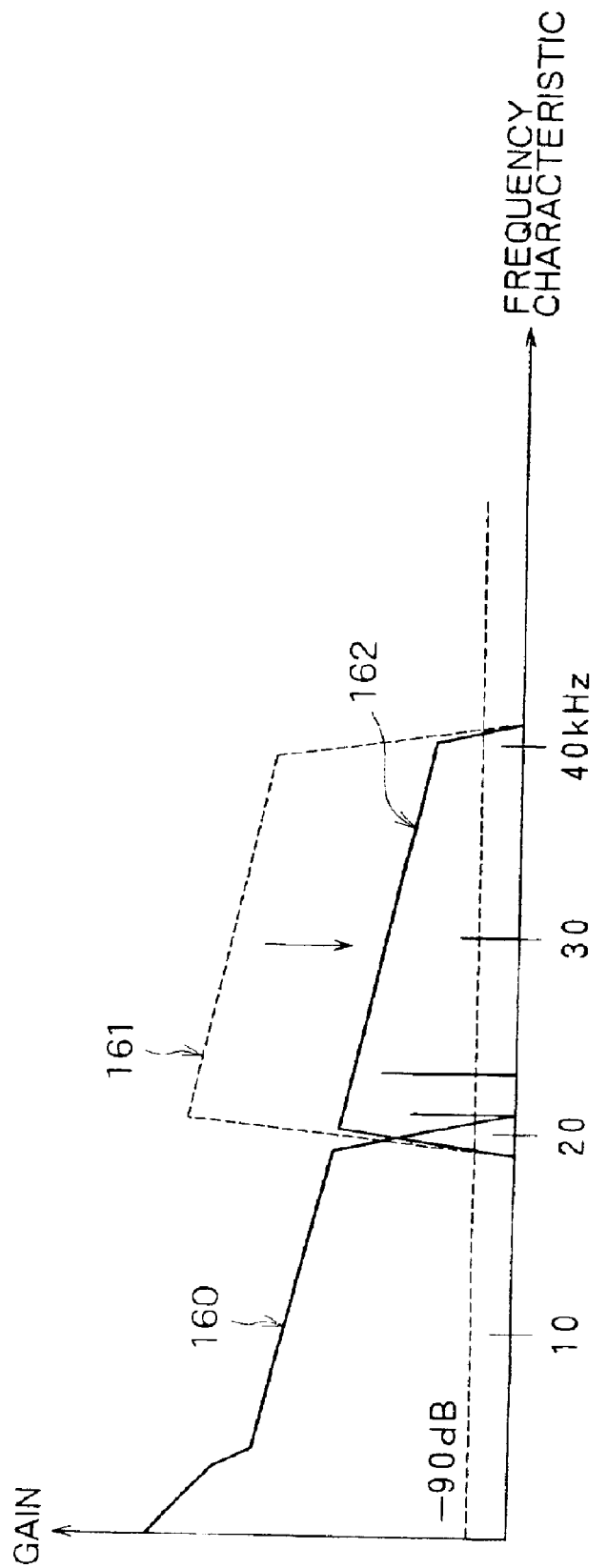
FIG. 39 is a frequency characteristic diagram showing an output of an adder when a result of comparison by a power comparator forming the digital signal processing apparatus according to the example 2-5 is "1"

When the result of the comparison by the power comparator 155 is "1", the gradient changer 153 supplies a gradient characteristic 161 produced by a gradient characteristic producer 146 as shown in FIG. 39 to a multiplier 141.

The multiplier 141 multiplies a spectrum generated by a spectrum adder 126 by the filter characteristic generated by the gradient characteristic producer 146, and then supplies the result to a gain adjuster 128.

The gain adjuster 128 adjusts power of the spectrum output of the multiplier 141 by using a coefficient from a gain calculator 127, and then supplies the power-adjusted spectrum to a waveform synthesizer 129.

An adder 118 adds a temporal waveform generated by the waveform synthesizer 129 of a normalizer and waveform synthesizer 116 to a PCM signal that has been subjected to 2x oversampling processing by an oversampling processor 117. Thus, the frequency spectra are combined with each other, as shown in FIG. 39.

Specifically, in terms of the frequency spectra, as shown in FIG. 39, the spectrum 162 resulting from power adjustment by the gain adjuster 128 of the output 161 obtained by subjecting the spectrum generated by the spectrum adder 126 to processing by the multiplier 141 is combined with a result 160 obtained by subjecting the PCM signal inputted from an input terminal 111 to frequency analysis processing by the frequency analyzer 112.

Figure 40:
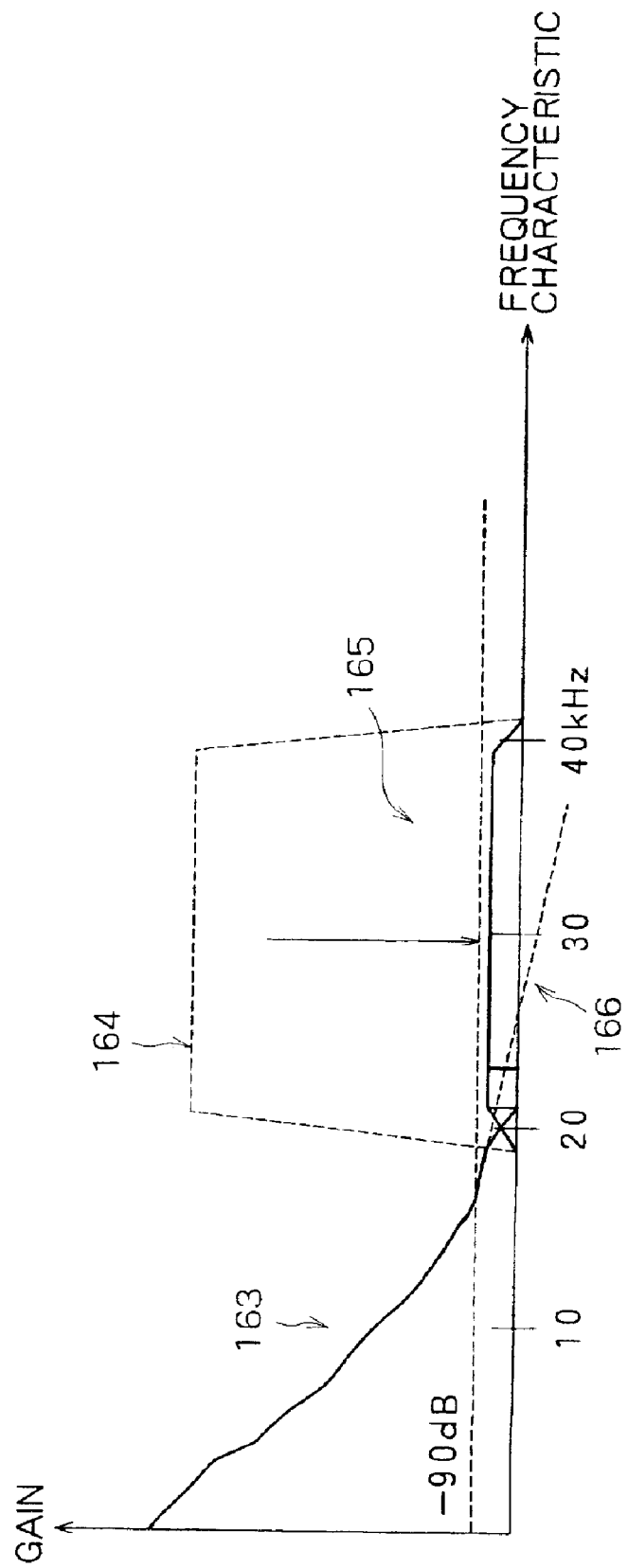
FIG. 40 is a frequency characteristic diagram showing an output of the adder when a result of comparison by the power comparator forming the digital signal processing apparatus according to the example 2-5 is "0"

When the result of the comparison by the power comparator 155 is "0", the gradient changer 153 supplies an output of the flat characteristic generator 156 as shown in FIG. 40 to the multiplier 141.

The multiplier 141 multiplies the spectrum generated by the spectrum adder 126 by the filter characteristic generated by the flat characteristic generator 156, and then supplies the result to the gain adjuster 128.

The gain adjuster 128 adjusts power of the spectrum output of the multiplier 141 by using the coefficient from the gain calculator 127, and then supplies the power-adjusted spectrum to the waveform synthesizer 129.

The adder 118 adds a temporal waveform generated by the waveform synthesizer 129 of the normalizer and waveform synthesizer 116 to the PCM signal that has been subjected to 2x oversampling processing by the oversampling processor 117. Thus, the frequency spectra are combined with each other, as shown in FIG. 40.

Specifically, in terms of the frequency spectra, as shown in FIG. 40, the spectrum 165 resulting from power adjustment by the gain adjuster 128 of the output 164 obtained by subjecting the spectrum generated by the spectrum adder 126 to processing by the multiplier 141 is combined with a result 163 obtained by subjecting the PCM signal inputted from the input terminal 111 to frequency analysis processing by the frequency analyzer 112.

For comparison, FIG. 40 shows a spectrum 166 from the gain adjuster 128 when the change of the gradient based on the power comparison by the power comparator 155 is not made.

The addition output of the adder 118 whose frequency characteristics are shown in FIG. 39 and FIG. 40 is then oversampled by an oversampling processor 119 at a sampling frequency of 32×44.1 kHz. Thus, a ΔΣ modulator 120 is supplied with an output of 64x oversampling of the PCM signal with the frequency characteristics shown in FIG. 39 and FIG. 40 and a sampling frequency of 44.1 kHz.

As described above, the ΔΣ modulator 120 is capable of outputting a high-quality 1-bit audio signal. The high-quality 1-bit audio signal is outputted via an output terminal 121 as an output of the digital audio signal processing apparatus $110_5$.

The digital audio signal processing apparatus $110_5$ according to the example 2-5 described above generates a spectrum of a signal of high frequencies beyond the audible range not included in an original PCM signal by calculating harmonics of the original PCM signal, converts the spectrum into a spectrum reflecting consideration of the dynamic range of the input signal, normalizes power of the spectrum and synthesizes the spectrum into a temporal waveform signal by means of the normalizer and waveform synthesizer 116, adds the signal to an oversampled PCM signal such that the signals are combined with each other in a smooth manner as shown in FIG. 39 and FIG. 40, further oversamples the addition output, and then subjects the oversampled addition output to ΔΣ modulation, whereby a 1-bit audio signal is generated.

Thus, since the 1-bit audio signal includes the signal exceeding the frequency range of the PCM signal, correlated with the PCM signal, having a gradient correlated with that of the PCM signal, and further reflecting consideration of the dynamic range of the input signal, it is possible to provide a natural sound such that perceived depth of the acoustic sound image is extended in a front to rear direction.

Furthermore, a spectrum adder 135, a multiplier 138, an output terminal 136, an input terminal 139, and an input terminal 137 for a combining coefficient k as described above in the example 2-2 may be newly added to the spectrum generator 114 of the digital audio signal processing apparatus $110_5$ to combine spectrum information generated on another channel ch2, and control a degree of separation between the channels of high-frequency signals to be added to PCM signals by controlling a combining ratio.

Figure 41:
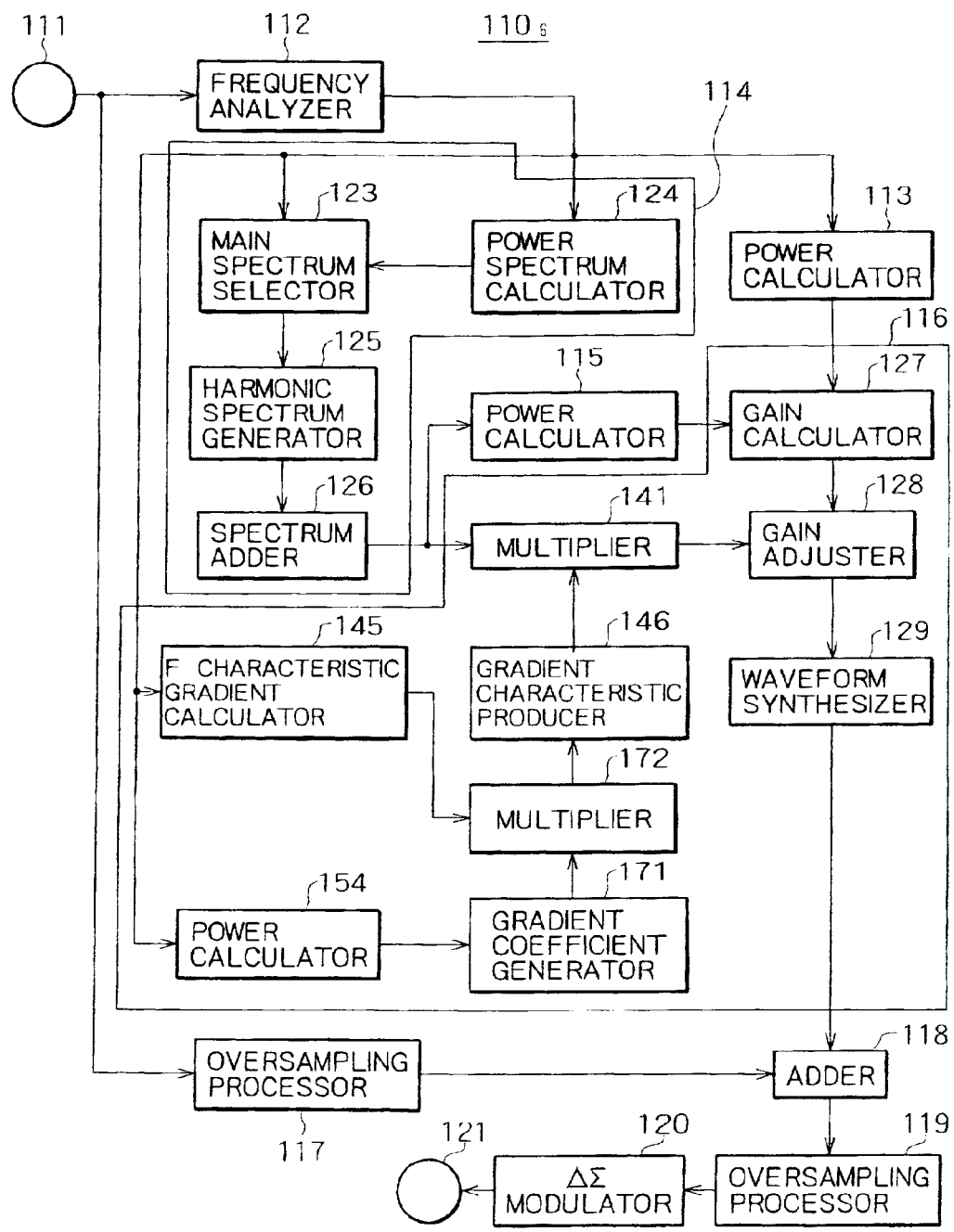
FIG. 41 is a block diagram showing a configuration of a digital audio signal processing apparatus according to a sixth example of the second embodiment (example 2-6)

A digital audio signal processing apparatus $110_6$ according to a sixth example of the second embodiment (hereinafter referred to as an example 2-6) will next be described with reference to FIGS. 41 to 43. Differences of the example 2-6 in configuration from the foregoing example 2-4 will first be described. The digital audio signal processing apparatus $110_6$ according to the example 2-6 is formed by newly adding a power calculator 154, a gradient coefficient generator 171, and a multiplier 172 to the normalizer and waveform synthesizer 116 of the digital audio signal processing apparatus $110_4$ according to the example 2-4.

The power calculator 154 calculates a power in a range of 18 kHz to 20 kHz, for example, from an output of a result of frequency analysis by a frequency analyzer 112, and then supplies the power value to the gradient coefficient generator 171.

The gradient coefficient generator 171 outputs a continuous value in a range of "0" to "1" as a gradient coefficient based on the power value from the power calculator 154. When the power value is small, the gradient coefficient generator 171 outputs a value closer to "0", whereas when the power value is large, the gradient coefficient generator 171 outputs a value closer to "1." The gradient coefficient generator 171 then supplies the output to the multiplier 172.

The multiplier 172 multiplies an F characteristic gradient value calculated by an F characteristic gradient calculator 145 by the above gradient coefficient, and then supplies the multiplication output to a gradient characteristic producer 146.

The gradient characteristic producer 146 produces a gradient characteristic corresponding to the multiplication output from the multiplier 172, and then supplies the gradient characteristic to a multiplier 141.

When the power value of the power calculator 154 is large, the gradient coefficient generator 171 generates a gradient coefficient close to "1." Then, the multiplier 172 outputs the gradient generated by the F characteristic gradient calculator 145 as it is to the gradient characteristic producer 146.

The gradient characteristic producer 146 produces a filter characteristic (gradient characteristic) corresponding to the gradient, and then supplies the filter characteristic to the multiplier 141.

The multiplier 141 multiplies a spectrum generated by a spectrum adder 126 by the filter characteristic generated by the gradient characteristic producer 146, and then supplies the result to a gain adjuster 128.

The gain adjuster 128 adjusts power of the spectrum output of the multiplier 141 by using a coefficient from a gain calculator 127, and then supplies the power-adjusted spectrum to a waveform synthesizer 129.

An adder 118 adds a temporal waveform generated by the waveform synthesizer 129 of a normalizer and waveform synthesizer 116 to a PCM signal that has been subjected to 2x oversampling processing by an oversampling processor 117. Thus, the frequency spectra are combined with each other, as shown in FIG. 42.

Figure 42:
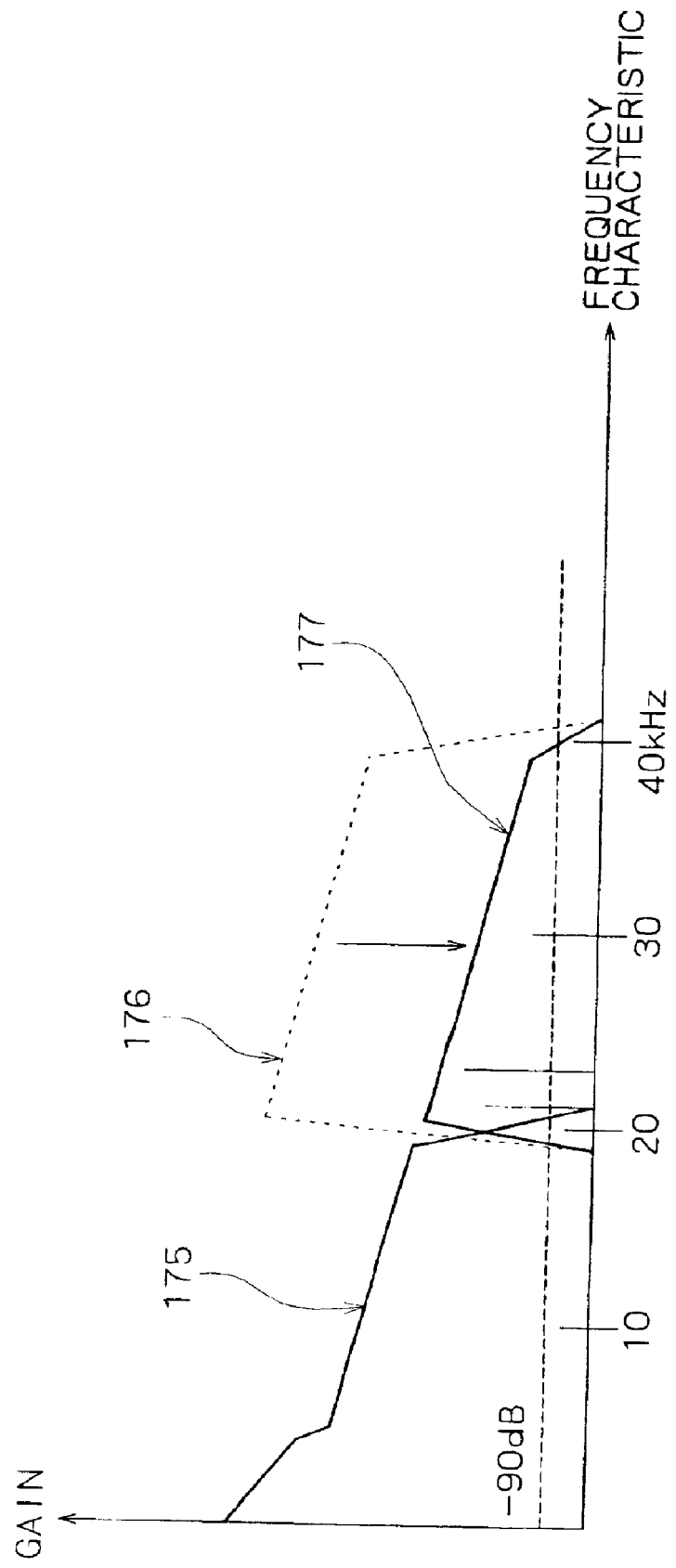
FIG. 42 is a frequency characteristic diagram showing an output of an adder when a gradient coefficient generator generates a coefficient close to "1" in correspondence with a power value of a power calculator forming the digital signal processing apparatus according to the example 2-6.

Specifically, in terms of the frequency spectra, as shown in FIG. 42, the spectrum 177 resulting from power adjustment by the gain adjuster 128 of the output 176 obtained by subjecting the spectrum generated by the spectrum adder 126 to processing by the multiplier 141 is combined with a result 175 obtained by subjecting the PCM signal inputted from an input terminal 111 to frequency analysis processing by the frequency analyzer 112.

When the power value of the power calculator 154 is small, the gradient coefficient generator 171 generates a gradient coefficient close to "0." Then, the multiplier 172 multiplies the gradient generated by the F characteristic gradient calculator 145 by a value close to 0, whereby the gradient characteristic producer 146 produces a near flat frequency characteristic.

The multiplier 141 multiplies the spectrum generated by the spectrum adder 126 by the near flat frequency characteristic generated by the gradient characteristic producer 146, and then supplies the result to the gain adjuster 128.

The gain adjuster 128 adjusts power of the spectrum output of the multiplier 141 by using the coefficient from the gain calculator 127, and then supplies the power-adjusted spectrum to the waveform synthesizer 129.

The adder 118 adds a temporal waveform generated by the waveform synthesizer 129 of the normalizer and waveform synthesizer 116 to the PCM signal that has been subjected to 2x oversampling processing by the oversampling processor 117. Thus, the frequency spectra are combined with each other, as shown in FIG. 43.

Figure 43:
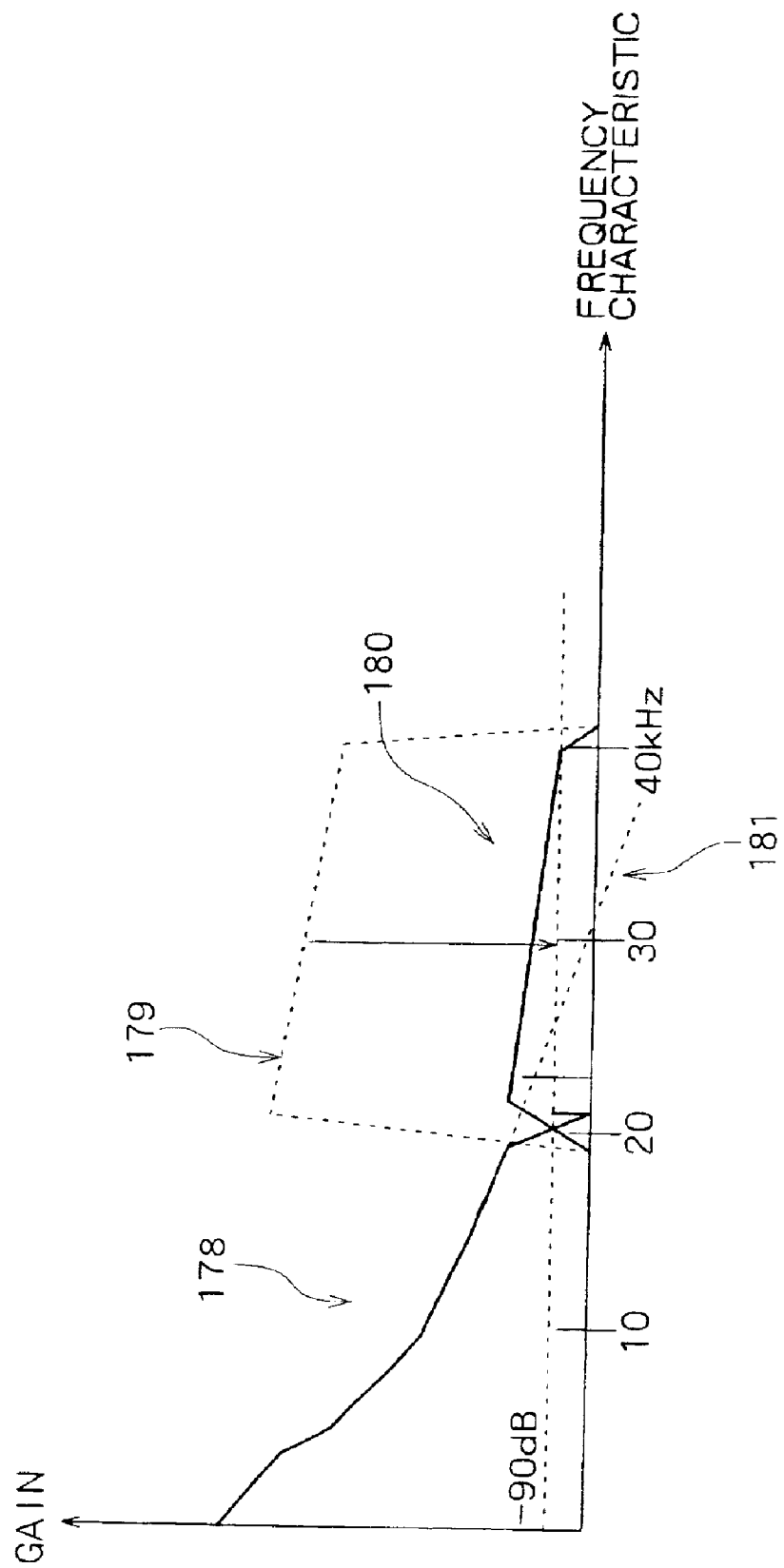
FIG. 43 is a frequency characteristic diagram showing an output of the adder when the gradient coefficient generator generates a coefficient close to "0" in correspondence with a power value of the power calculator forming the digital signal processing apparatus according to the example 2-6.

Specifically, in terms of the frequency spectra, as shown in FIG. 43, the spectrum 180 resulting from power adjustment by the gain adjuster 128 of the output 179 obtained by subjecting the spectrum generated by the spectrum adder 126 to processing by the multiplier 141 is combined with a result 178 obtained by subjecting the PCM signal inputted from the input terminal 111 to frequency analysis processing by the frequency analyzer 112.

For comparison, FIG. 43 shows a spectrum 181 from the gain adjuster 128 when the gradient coefficient generated by the gradient coefficient generator 171 is not used.

The addition output of the adder 118 whose frequency characteristics are shown in FIG. 42 and FIG. 43 is then oversampled by an oversampling processor 119 at a sampling frequency of 32×44.1 kHz. Thus, a ΔΣ modulator 120 is supplied with an output of 64x oversampling of the PCM signal with the frequency characteristics shown in FIG. 42 and FIG. 43 and a sampling frequency of 44.1 kHz.

As described above, the ΔΣ modulator 120 is capable of outputting a high-quality 1-bit audio signal. The high-quality 1-bit audio signal is outputted via an output terminal 121 as an output of the digital audio signal processing apparatus $110_6$.

The digital audio signal processing apparatus $110_6$ according to the example 2-6 described above generates a spectrum of a signal of high frequencies beyond the audible range not included in an original PCM signal by calculating harmonics of the original PCM signal, limits the spectrum to a spectrum reflecting consideration of the frequency characteristic and the dynamic range of the input signal, normalizes power of the spectrum and synthesizes the spectrum into a temporal waveform signal by means of the normalizer and waveform synthesizer 116, adds the signal to an oversampled PCM signal such that the signals are combined with each other in a smooth manner as shown in FIG. 42 and FIG. 43, further oversamples the addition output, and then subjects the oversampled addition output to ΔΣ modulation, whereby a 1-bit audio signal is generated.

Thus, since the 1-bit audio signal includes the signal exceeding the frequency range of the PCM signal, correlated with the PCM signal, having a gradient correlated with that of the PCM signal, and further reflecting consideration of the frequency characteristic and the dynamic range of the input signal, it is possible to provide a natural sound such that perceived depth of the acoustic sound image is extended in a front to rear direction.

Furthermore, a spectrum adder 135, a multiplier 138, an output terminal 136, an input terminal 139, and an input terminal 137 for a combining coefficient k as described above in the example 2-2 may be newly added to the spectrum generator 114 of the digital audio signal processing apparatus $110_6$ to combine spectrum information generated on another channel ch2, and control a degree of separation between the channels of high-frequency signals to be added to PCM signals by controlling a combining ratio.

As is clear from the above descriptions of the examples 2-1, 2-2, 2-3, 2-4, 2-5, and 2-6, the digital audio signal processing apparatus 110 according to the second embodiment generates a signal of high frequencies beyond the audible range such that the signal is correlated with an input signal, by means of the spectrum generator 114 and the normalizer and waveform synthesizer 116, adds the signal to an oversampled PCM signal, further oversamples the addition output, and then subjects the oversampled addition output to ΔΣ modulation, whereby a 1-bit audio signal is generated.

Thus, the second embodiment can generate a 1-bit audio signal such that perceived depth of the acoustic sound image is extended in a front to rear direction and also perceived stereo sound is extended in a left to right direction, thus resulting in an improved separation of sounds. In addition, the 1-bit audio signal reproduces even a subtle sound, making it possible to perceive even a background noise in a hall, for example, and thus provides a better atmosphere. Moreover, by combining the signals of high frequencies with each other on a right and a left channel, it is possible to control effects of the signals of high frequencies. Furthermore, a result obtained by a measurement shows that the brain under the measurement generates an alpha wave, which indicates increased comfortability.

A third embodiment will next be described. The third embodiment is also a digital audio signal processing apparatus 190 included in a high-speed 1-bit audio signal generating system 1 as shown in FIG. 1.

Figure 44:
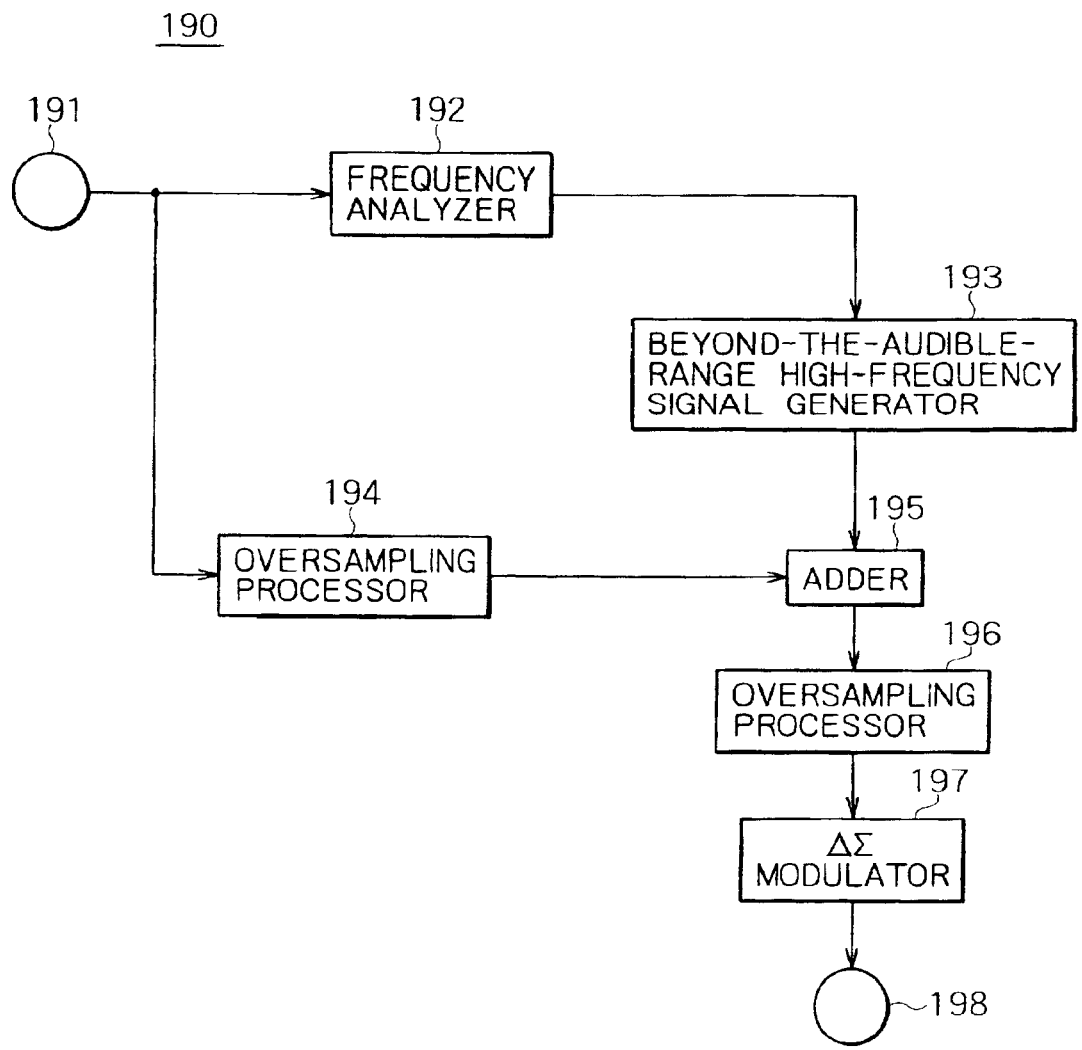
FIG. 44 is a block diagram showing a configuration of a digital audio signal processing apparatus according to a third embodiment.

A configuration of the digital audio signal processing apparatus 190 is shown in FIG. 44. The digital audio signal processing apparatus 190 includes: a frequency analyzer 192 for subjecting a PCM signal inputted from an input terminal 191 to frequency analysis processing; and a beyond-the-audible-range high-frequency signal generator 193 for generating a signal to be added to the PCM signal, from a result of the frequency analysis of the frequency analyzer 192.

The digital audio signal processing apparatus 190 further includes: an oversampling processor 194 for oversampling the PCM signal at a sampling frequency of m×fs; an adder 195 for adding the PCM signal oversampled by the oversampling processor 194 to the signal of high frequencies beyond the audible range generated by the beyond-the-audible-range high-frequency signal generator 193; an oversampling processor 196 for oversampling an addition output of the adder 195 at a sampling frequency of n×fs; and a ΔΣ modulator 197 for converting the multi-bit digital signal oversampled by the oversampling processor 196 into a 1-bit digital signal, and outputting the 1-bit digital signal from an output terminal 198.

The frequency analyzer 192 subjects the PCM signal inputted from the input terminal 191 to frequency analysis processing in a range of DC to 22.05 kHz using a fast Fourier transformation FFT, for example, and then supplies a result of the frequency analysis to the beyond-the-audible-range high-frequency signal generator 193.

The beyond-the-audible-range high-frequency signal generator 193 generates the signal of high frequencies beyond the audible range which signal is to be added to the PCM signal such that the signal is correlated with the PCM signal, and then supplies the signal to the adder 195.

The oversampling processor 194 oversamples the PCM signal with a quantization frequency of 44.1 kHz and a quantization word length of 16 bits, which signal is inputted from the input terminal 191, at a sampling frequency of 2×44.1 kHz, and then supplies an output of the oversampling processing to the adder 195.

The adder 195 adds the signal of high frequencies beyond the audible range from the beyond-the-audible-range high-frequency signal generator 193 to the oversampling output from the oversampling processor 194, and then supplies the addition output to the oversampling processor 196.

The oversampling processor 196 oversamples the addition output at a sampling frequency of 32×44.1 kHz. Thus, an oversampling output from the oversampling processor 196 is an output of 64x oversampling of the PCM signal with the quantization frequency of 44.1 kHz and the quantization word length of 16 bits. The 64x oversampling output is sent to the ΔΣ modulator 197 to be subjected to delta sigma modulation processing and thereby converted into a 1-bit audio signal. The 1-bit audio signal is then supplied to the output terminal 198.

Figure 45:
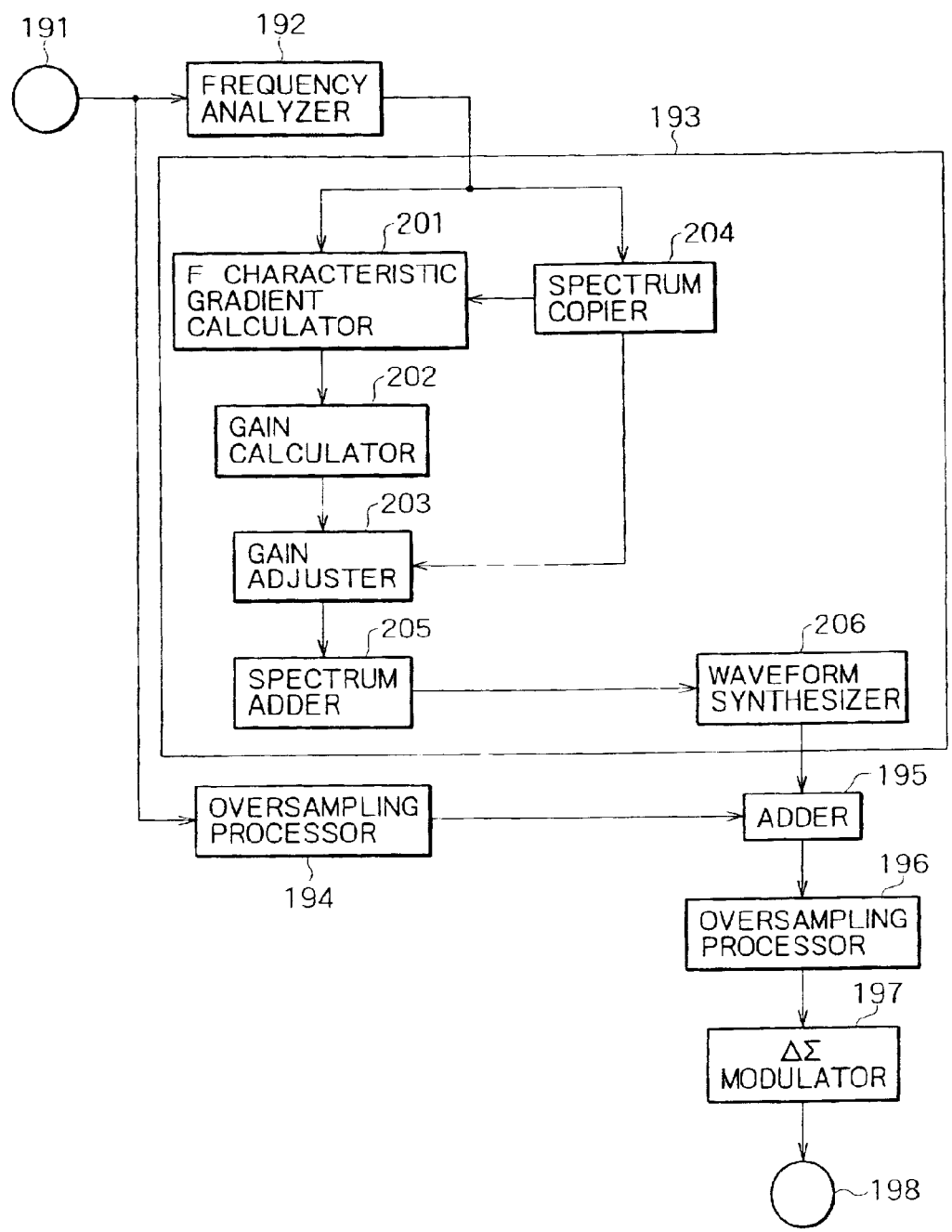
FIG. 45 is a block diagram showing a configuration of a digital audio signal processing apparatus according to a first example of the third embodiment (example 3-1)

The beyond-the-audible-range high-frequency signal generator 193 of the digital audio signal processing apparatus 190 according to the third embodiment has a configuration as shown in FIG. 45. A concrete example ($190_1$) of the digital audio signal processing apparatus 190 having the beyond-the-audible-range high-frequency signal generator 193 of the configuration shown in FIG. 45 will be described below as an example 3-1.

As shown in FIG. 45, the beyond-the-audible-range high-frequency signal generator 193 of the digital audio signal processing apparatus $190_1$ according to the example 3-1 is formed by an F characteristic gradient calculator 201, a gain calculator 202, a gain adjuster 203, a spectrum copier 204, a spectrum adder 205, and a waveform synthesizer 206.

Figure 46:
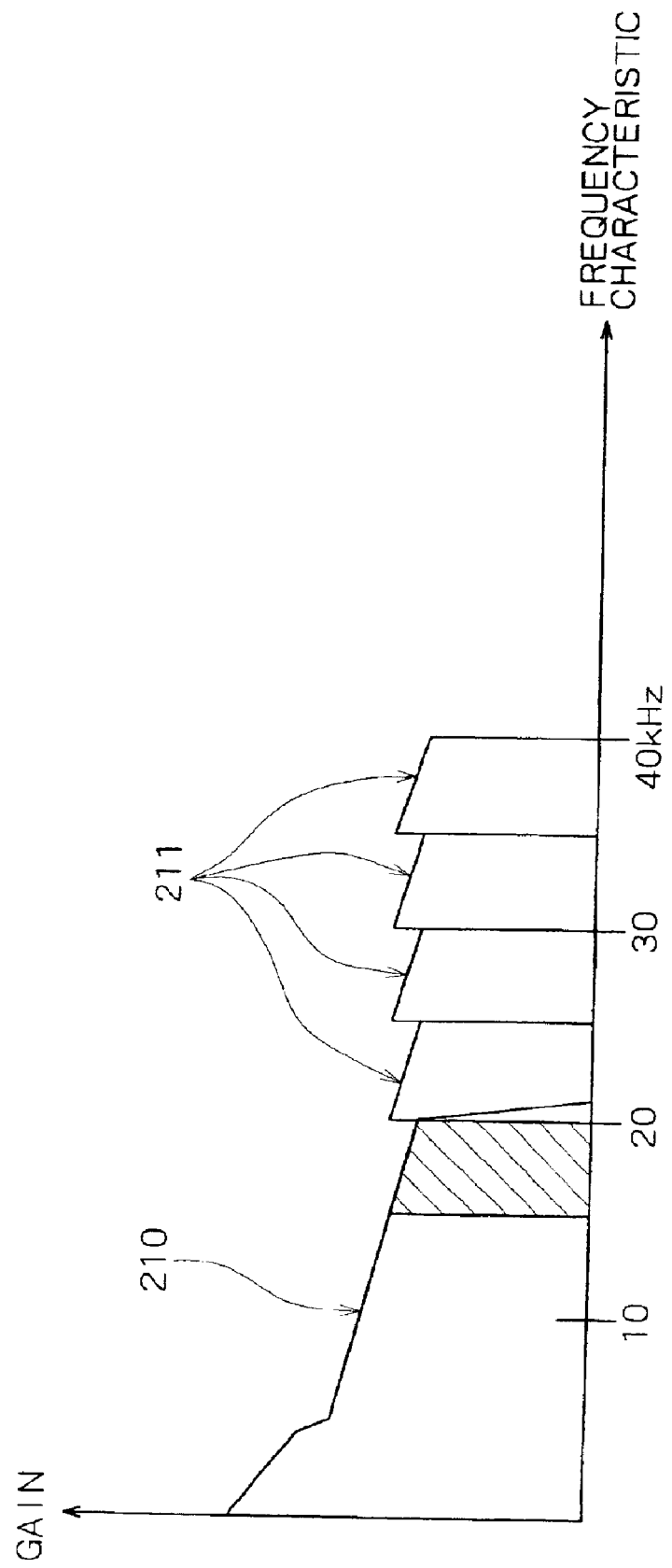
FIG. 46 is a frequency characteristic diagram of assistance in explaining processing of a spectrum copier forming the digital audio signal processing apparatus according to the example 3-1.

The spectrum copier 204 copies a spectrum in a range of 15 kHz to 20 kHz (indicated by hatch lines in FIG. 46), for example, from a result 210 of frequency analysis shown in FIG. 46 from a frequency analyzer 192. The spectrum copier 204 outputs the copy to each of ranges of 20 kHz to 25 kHz, 25 kHz to 30 kHz, 30 kHz to 35 kHz, and 35 kHz to 40 kHz to thereby create a spectrum 211 formed by each of the blocks, and then supplies the spectrum 211 to the gain adjuster 203.

Figure 47:
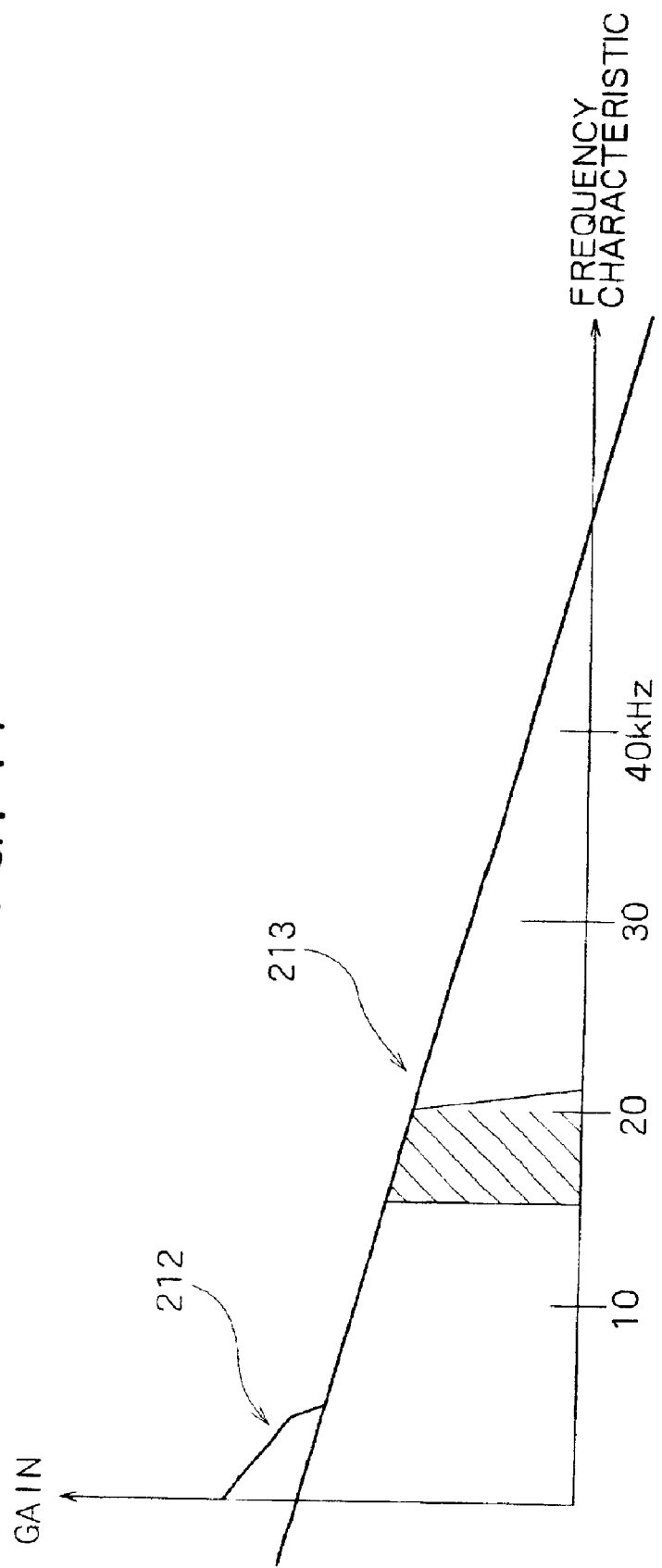
FIG. 47 is a frequency characteristic diagram of assistance in explaining gradient calculation processing of an F characteristic gradient calculator forming the digital audio signal processing apparatus according to the example 3-1.

As shown in FIG. 47, the F characteristic gradient calculator 201 calculates a gradient 213 of the spectrum (hatch lines) in the range of 15 kHz to 20 kHz copied by the spectrum copier 204, from the result 212 of frequency analysis of the frequency analyzer 192, and then supplies the gradient to the gain calculator 202.

Figure 48:
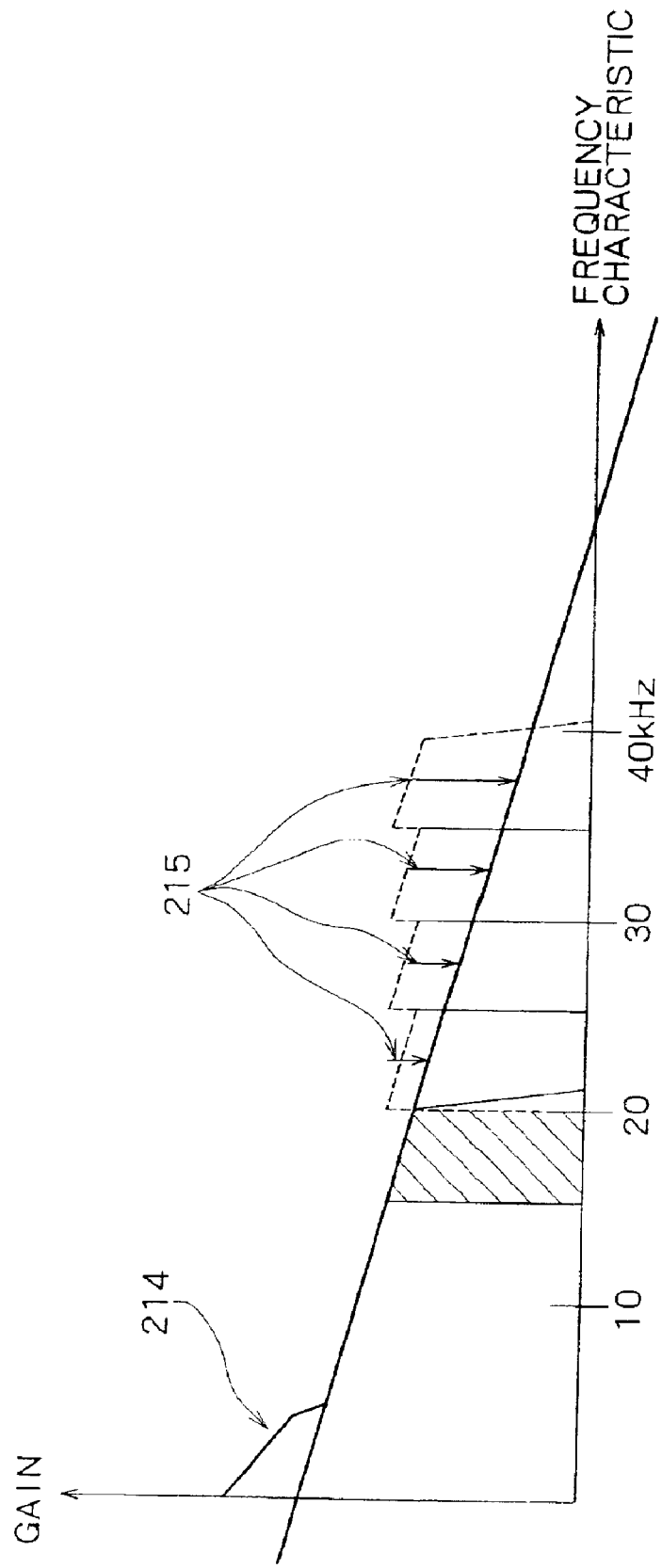
FIG. 48 is a frequency characteristic diagram of assistance in explaining gain calculation processing of a gain calculator forming the digital audio signal processing apparatus according to the example 3-1.

As shown in FIG. 48, the gain calculator 202 calculates a gain 215 corresponding to the spectrum 211 of each of the blocks generated by the copying by the spectrum copier 204, from the gradient calculated from the frequency analysis result 214 by the F characteristic gradient calculator 201, and then supplies the gain to the gain adjuster 203.

Figure 49:
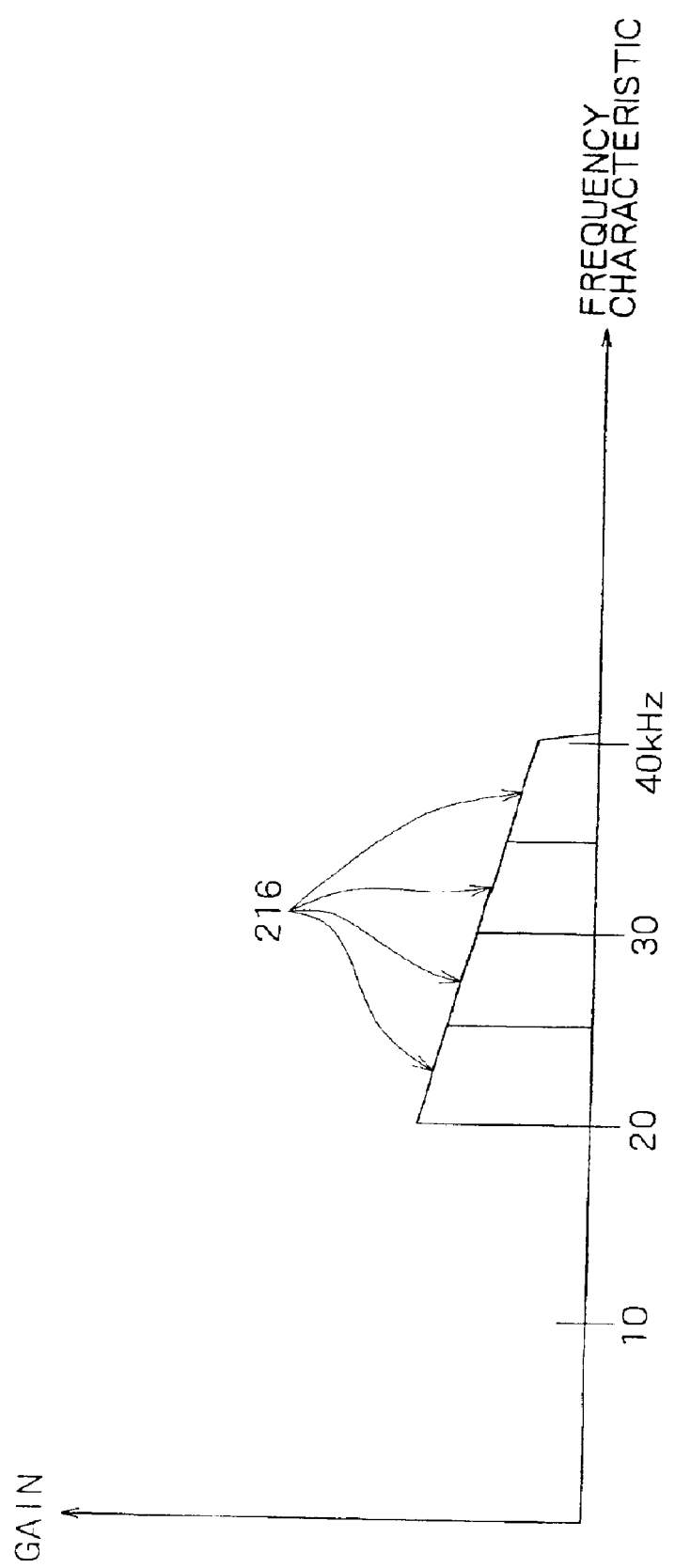
FIG. 49 is a frequency characteristic diagram of assistance in explaining gain adjustment processing of a gain adjuster forming the digital audio signal processing apparatus according to the example 3-1.

The gain adjuster 203 adjusts the gain of each of the blocks generated by the spectrum copier 204 on the basis of the gain 215 calculated by the gain calculator 202 to thereby generate a gain-adjusted spectrum 216 of each of the blocks, as shown in FIG. 49, and then supplies the spectrum 216 to the spectrum adder 205.

The spectrum adder 205 adds the spectrum 216 of each of the blocks to the corresponding frequency range, and then supplies the result to the waveform synthesizer 206.

The waveform synthesizer 206 subjects the spectrum generated by the spectrum adder 205 to inverse FFT processing, for example, to thereby convert the frequency spectrum into a temporal waveform, and then supplies the temporal waveform to an adder 195.

The adder 195 adds the temporal waveform generated by the waveform synthesizer 206 of the beyond-the-audible-range high-frequency signal generator 193 to a PCM signal that has been subjected to 2x oversampling processing by an oversampling processor 194. Thus, the frequency spectra 217 are combined with each other, as shown in FIG. 50.

Figure 50:
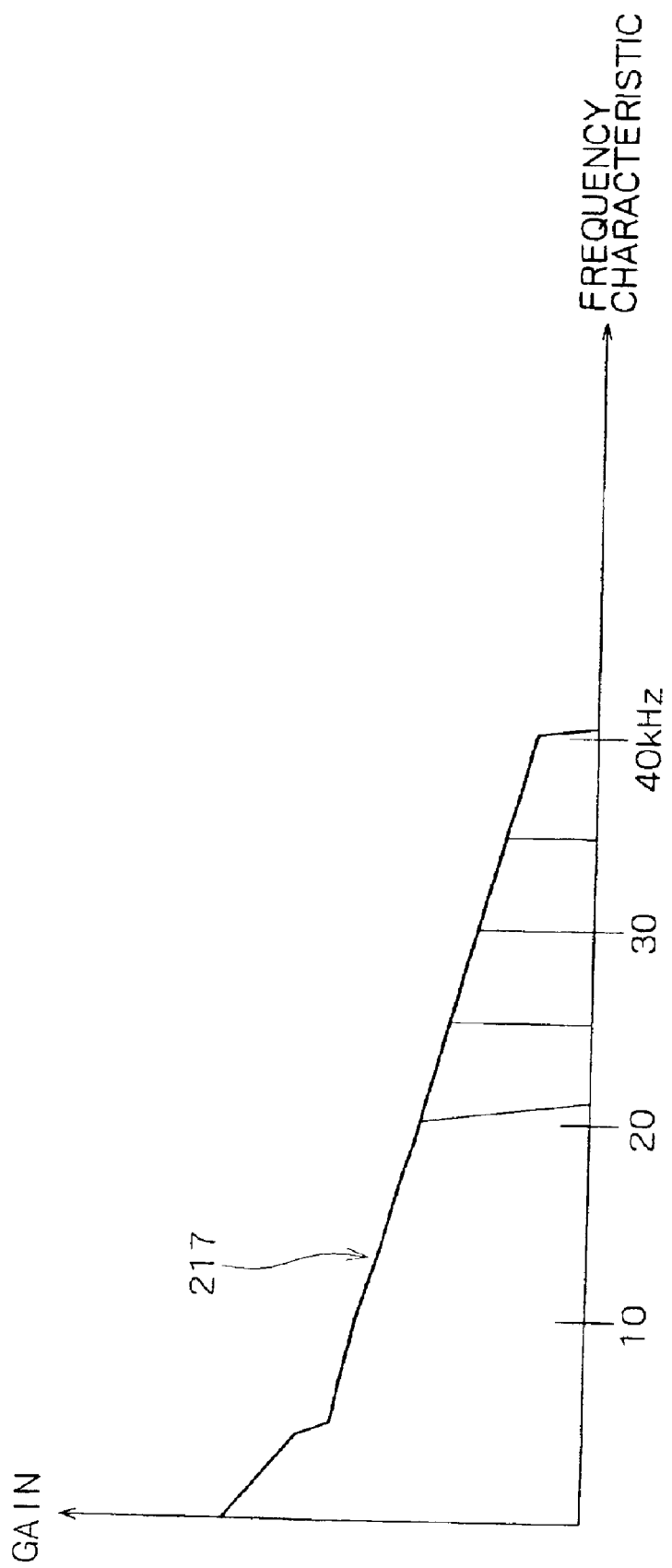
FIG. 50 is a frequency characteristic diagram showing an addition output of an adder forming the digital audio signal processing apparatus according to the example 3-1.

Specifically, in terms of the frequency spectra, as shown in FIG. 50, the spectrum of each of the blocks generated by the waveform synthesizer 206 is combined with the PCM signal inputted from an input terminal 191.

The addition output of the adder 195 whose frequency characteristics 217 are shown in FIG. 50 is then oversampled by an oversampling processor 196 at a sampling frequency of 32×44.1 kHz. Thus, a ΔΣ modulator 197 is supplied with an output of 64x oversampling of the PCM signal with the frequency characteristics shown in FIG. 50 and a sampling frequency of 44.1 kHz.

The ΔΣ modulator 197 employs the fundamental configuration shown in FIG. 6. In practice, the ΔΣ modulator 197 employs a fifth-order configuration as shown in FIG. 7, and is capable of outputting a high-quality 1-bit audio signal. The high-quality 1-bit audio signal is outputted via an output terminal 198 as an output of the digital audio signal processing apparatus $190_1$.

The digital audio signal processing apparatus $190_1$ according to the example 3-1 described above generates a signal of high frequencies beyond the audible range not included in an original PCM signal on the basis of a gradient calculated from the f characteristic of the original PCM signal, adds the signal to an oversampled PCM signal such that the signals are combined with each other in a smooth manner as shown in FIG. 50, further oversamples the addition output, and then subjects the oversampled addition output to ΔΣ modulation, whereby a 1-bit audio signal is generated. Since the 1-bit audio signal includes the signal that is beyond the frequency range of the PCM signal and is correlated with the PCM signal, it is possible to provide a natural sound such that perceived depth of the acoustic sound image is extended in a front to rear direction.

While the oversampling processor 194 in the digital audio signal processing apparatus $190_1$ according to the example 3-1 performs 2x oversampling processing and the oversampling processor 196 performs 32x oversampling processing, the oversampling processor 194 may perform 4x oversampling processing and the oversampling processor 196 may perform 16x oversampling processing. Alternatively, the oversampling processor 194 may perform 8x oversampling processing and the oversampling processor 196 may also perform 8x oversampling processing.

Furthermore, a spectrum adder 135, a multiplier 138, an output terminal 136, an input terminal 139, and an input terminal 137 for a combining coefficient k as described above in the example 2-2 may be newly added to the beyond-the-audible-range high-frequency signal generator 193 of the digital audio signal processing apparatus $190_1$ to combine spectrum information generated on another channel ch2, and control a degree of separation between the channels of high-frequency signals to be added to PCM signals by controlling a combining ratio.

Thus, as is clear from the description of the example 3-1, the digital audio signal processing apparatus 190 according to the third embodiment includes the beyond-the-audible-range high-frequency signal generator 193 to copy a result of frequency analysis of an original PCM signal and thereby generate a signal of high frequencies beyond the audible range not included in the PCM signal, adds the signal to the original PCM signal, and then performs ΔΣ modulation.

Thus, the third embodiment can generate a 1-bit audio signal such that perceived depth of the acoustic sound image is extended in a front to rear direction and also perceived stereo sound is extended in a left to right direction, thus resulting in an improved separation of sounds. In addition, the 1-bit audio signal reproduces even a subtle sound, making it possible to perceive even a background noise in a hall, for example, and thus provides a better atmosphere. Moreover, by combining the signals of high frequencies with each other on a right and a left channel, it is possible to control effects of the signals of high frequencies. Furthermore, a result obtained by a measurement shows that the brain under the measurement generates an alpha wave, which indicates increased comfortability.

While a preferred embodiment of the present invention has been described using specific terms, such description is for illustrative purposes only, and it is to be understood that changes and variations may be made without departing from the spirit or scope of the following claims.

What is claimed is:

1. A digital signal processing apparatus for converting a first digital signal having a sampling frequency of fs (Hz)

and a plurality of bits as quantization bits into a second digital signal having a sampling frequency of m×n×fs and one bit as a quantization bit wherein m and n are positive integers larger or equal to two, said digital signal processing apparatus comprising:

frequency analyzing means for subjecting said first digital signal inputted thereto to frequency analysis processing;

first noise level calculating means for calculating an average noise level of a predetermined range of said first digital signal based on a result of the frequency analysis obtained by said frequency analyzing means;

dither generating means for generating a dither signal of high frequencies beyond the audible range;

second noise level calculating means for calculating a noise level of the dither signal generated by said dither generating means;

normalizing means for normalizing the noise level calculated by said second noise level calculating means based on the average noise level calculated by said first noise level calculating means;

first oversampling means for oversampling said first digital signal at a sampling frequency of m (m is the positive integer $\geq 2$)×fs (Hz);

adding means for adding the multi-bit digital signal oversampled by said first oversampling means to the dither signal having a noise level normalized by said normalizing means;

second oversampling means for oversampling an addition output of said adding means at a sampling frequency of n (n is the positive integer $\geq 2$)×fs (Hz); and delta-sum modulating means for converting a multi-bit digital signal oversampled by said second oversampling means into a 1-bit digital signal.

2. The digital signal processing apparatus as claimed in claim 1, wherein the dither signal generated by said dither generating means is sampled at a same sampling frequency as the sampling frequency of said first oversampling means.

3. The digital signal processing apparatus as claimed in claim 1, wherein a word length of the dither signal generated by said dither generating means is substantially equal to a word length of the multi-bit digital signal sampled by said first oversampling means.

4. The digital signal processing apparatus as claimed in claim 1, wherein said normalizing means comprises:

gain calculating means for calculating an equalizing coefficient for equalizing the noise level calculated by said second noise level calculating means with the average noise level calculated by said first noise level calculating means;

frequency characteristic limiting means for generating a filter coefficient for limiting a frequency characteristic of the dither signal from said dither generating means and subjecting the dither signal to frequency characteristic limiting processing using the filter coefficient; and gain adjusting means for adjusting a noise level of an output from said frequency characteristic limiting means by using said equalizing coefficient from said gain calculating means.

5. The digital signal processing apparatus as claimed in claim 4, wherein said frequency characteristic limiting means of said normalizing means generates a filter coefficient based on a band-pass filter characteristic, and subjects said dither signal to frequency characteristic limiting processing using the filter coefficient.

6. The digital signal processing apparatus as claimed in claim 5, wherein said frequency characteristic limiting means of said normalizing means further generates a 1/f filter coefficient based on a gradient filter characteristic having a gradient of 1/f (f is frequency) in addition to the filter coefficient based on said band-pass filter characteristic, and subjects said dither signal to frequency characteristic limiting processing using the two filter coefficients.

7. The digital signal processing apparatus as claimed in claim 6, wherein said frequency characteristic limiting means of said normalizing means subjects said dither signal to first frequency characteristic limiting processing using said 1/f filter coefficient, and then subjects an output of said frequency range limiting processing to second frequency characteristic limiting processing using said 1/f filter coefficient based on said band-pass filter characteristic.

8. The digital signal processing apparatus as claimed in claim 6, wherein said frequency characteristic limiting means of said normalizing means subjects said dither signal to frequency characteristic limiting processing using a combined filter coefficient obtained by combining said 1/f filter coefficient with said filter coefficient based on said band-pass filter characteristic.

9. The digital signal processing apparatus as claimed in claim 4, wherein said frequency characteristic limiting means of said normalizing means calculates a combined filter characteristic obtained by combining a band-pass filter characteristic with a 1/f filter characteristic, and subjects said dither signal to frequency characteristic limiting processing using the combined filter coefficient.

10. The digital signal processing apparatus as claimed in claim 4, wherein said frequency characteristic limiting means of said normalizing means comprises:

band-pass filter characteristic producing means for producing a band-pass filter characteristic;

frequency characteristic gradient calculating means for calculating a gradient of a frequency characteristic of said first digital signal based on the result of the frequency analysis obtained by said frequency analyzing means; and a filter characteristic- producing means for producing a filter characteristic based on the gradient calculated by said frequency characteristic gradient calculating means, whereby said frequency characteristic limiting means of said normalizing means generates a filter coefficient obtained by combining the band-pass filter characteristic with the filter characteristic based on said gradient, and then subjects said dither signal to frequency characteristic limiting processing using the filter coefficient.

11. A digital signal processing method for converting a first digital signal having a sampling frequency of fs (Hz) and a plurality of bits as quantization bits into a second digital signal having a sampling frequency of m×n×fs and one bit as a quantization bit wherein m and n are positive integers larger or equal to two, said digital signal processing method comprising:

a frequency analyzing step for subjecting said first digital signal to frequency analysis processing;

a first noise level calculating step for calculating an average noise level of a predetermined range of said first digital signal based on a result of the frequency analysis obtained by said frequency analyzing step;

a second noise level calculating step for calculating a noise level of a dither signal generated by a dither generating means, wherein said dither signal is a signal of high frequencies beyond the audible range;

a normalizing step for normalizing the noise level calculated by said second noise level calculating step based on the average noise level calculated by said first noise level calculating step;

a first oversampling step for oversampling said first digital signal at a sampling frequency of in (m is the positive integer ≧2)×fs (Hz);

an adding step for adding the multi-bit digital signal oversampled by said first oversampling step to the dither signal having a noise level normalized by said normalizing step;

a second oversampling step for oversampling an addition output of said adding step at a sampling frequency of n (n is the positive integer ≧2)×fs (Hz); and a delta-sum modulating step for converting a multi-bit digital signal oversampled by said second oversampling step into a 1-bit digital signal.

12. A digital signal processing apparatus for converting a first digital signal having a sampling frequency of fs (Hz) and a plurality of bits as quantization bits into a second digital signal having a sampling frequency of m×n×fs and one bit as a quantization bit wherein m and n are positive integers larger or equal to two, said digital signal processing apparatus comprising:

frequency analyzing means for subjecting said first digital signal inputted thereto to frequency analysis processing;

first noise level calculating means for calculating an average noise level of a predetermined range of said first digital signal based on a result of the frequency analysis obtained by said frequency analyzing means;

spectrum generating means for generating a spectrum of a signal of high frequencies beyond the audible range based on the result of the frequency analysis obtained by said frequency analyzing means;

second noise level calculating means for calculating a noise level of the spectrum generated by said spectrum generating means;

normalizing and waveform synthesizing means for normalizing the noise level of the spectrum calculated by said second noise level calculating means based of the average noise level calculated by said first noise level calculating means and for synthesizing a temporal waveform signal based on the spectrum;

first oversampling means for oversampling said first digital signal at a sampling frequency of m (m is the positive integer ≧2)×fs (Hz);

adding means for adding the multi-bit digital signal oversampled by said first oversampling means to the signal of high frequencies beyond the audible range, the signal of high frequencies beyond the audible range having the noise level normalized by said normalizing and waveform synthesizing means and being synthesized into a waveform by said normalizing and waveform synthesizing means;

second oversampling means for oversampling an addition output of said adding means at a sampling frequency of n (n is the positive integer ≧2)×fs (Hz); and delta-sum modulating means for converting a multi-bit digital signal oversampled by said second oversampling means into a 1-bit digital signal.

13. The digital signal processing apparatus as claimed in claim 12, wherein said spectrum generating means comprises:

spectrum calculating means for calculating a spectrum of a noise level in a predetermined range from the result of the frequency analysis obtained by said frequency analyzing means;

spectrum selecting means for selecting a spectrum line having a high noise level from the result of the frequency analysis and the spectrum calculated by said spectrum calculating means;

harmonic spectrum generating means for generating a harmonic spectrum of the spectrum line having the high noise level selected by said spectrum selecting means; and spectrum adding means for adding a spectrum based on the harmonic spectrum generated by said harmonic spectrum generating means.

14. The digital signal processing apparatus as claimed in claim 12, wherein said normalizing and waveform synthesizing means comprises:

gain calculating means for calculating an equalizing coefficient for equalizing the noise level calculated by said second noise level calculating means with the average noise level calculated by said first noise level calculating means;

gain adjusting means for adjusting the noise level of the spectrum of the signal of high frequencies beyond the audible range from said spectrum generating means by using said equalizing coefficient calculated by said gain calculating means; and waveform synthesizing means for generating a temporal waveform signal of said spectrum whose noise level is adjusted by said gain adjusting means.

15. The digital signal processing apparatus as claimed in claim 13, wherein said spectrum adding means comprises a first spectrum adding means and said spectrum generating means further comprises:

multiplying means for multiplying a spectrum of a signal of high frequencies beyond the audible range generated by a spectrum generating means of another channel by a controllable combining coefficient; and second spectrum adding means for adding the spectrum from said first spectrum adding means to an output of said multiplying means and thereby generating a spectrum for controlling a degree of separation between at least two channels.

16. The digital signal processing apparatus as claimed in claim 14, wherein said normalizing and waveform synthesizing means further comprises:

gradient filter characteristic producing means for producing a gradient filter characteristic having a gradient of 1/f (f is frequency); and multiplying means for multiplying the spectrum from said spectrum generating means by said gradient filter characteristic and supplying an output of the multiplication to said gain adjusting means.

17. The digital signal processing apparatus as claimed in claim 14, wherein said normalizing and waveform synthesizing means further comprises:

frequency characteristic gradient calculating means for calculating a gradient of a frequency characteristic in a predetermined range of said first digital signal from the result of the frequency analysis obtained by said frequency analyzing means;

gradient characteristic producing means for producing a gradient characteristic based on the gradient calculated by said frequency characteristic gradient calculating means; and multiplying means for multiplying the spectrum from said spectrum generating means by the gradient characteristic produced by said gradient characteristic producing means and supplying an output of the multiplication to said gain adjusting means.

18. The digital signal processing apparatus as claimed in claim 14, wherein said normalizing and waveform synthesizing means further comprises:

frequency characteristic gradient calculating means for calculating a gradient of a frequency characteristic in a predetermined range of said first digital signal from the result of the frequency analysis obtained by said frequency analyzing means;

gradient characteristic producing means for producing a gradient characteristic based on the gradient calculated by said frequency characteristic gradient calculating means;

flat characteristic generating means for generating a flat frequency characteristic;

third noise level calculating means for calculating a noise, level of a predetermined range of said first digital signal based on the result of the frequency analysis obtained by said frequency analyzing means;

characteristic selecting means for selecting between the gradient characteristic from said gradient characteristic producing means and the flat characteristic from said flat characteristic generating means based on the noise level calculated by said third noise level calculating means; and multiplying means for multiplying the spectrum from said spectrum generating means by a characteristic selected by said characteristic selecting means and supplying an output of the multiplication to said gain adjusting means.

19. The digital signal processing apparatus as claimed in claim 14, wherein said normalizing and waveform synthesizing means further comprises:

frequency characteristic gradient calculating means for calculating a gradient of a frequency characteristic in a predetermined range of said first digital signal from the result of the frequency analysis obtained by said frequency analyzing means;

third noise level calculating means for calculating a noise level of a predetermined range of said first digital signal based on the result of the frequency analysis obtained by said frequency analyzing means;

gradient coefficient generating means for generating a gradient coefficient based on the noise level calculated by said noise level calculating means;

first multiplying means for multiplying the gradient of the frequency characteristic calculated by said frequency characteristic gradient calculating means by the gradient coefficient generated by said gradient coefficient generating means;

gradient characteristic producing means for producing a gradient characteristic based on an output of the multiplication of said first multiplying means;

second multiplying means for multiplying the spectrum from said spectrum generating means by the gradient characteristic produced by said gradient characteristic producing means and supplying an output of the multiplication to said gain adjusting means.

20. A digital signal processing method for converting a first digital signal having a sampling frequency of fs (Hz) and a plurality of bits as quantization bits into a second digital signal having a sampling frequency of m×n×fs and one bit as a quantization bit wherein m and n are positive integers larger or equal to two, said digital signal processing method comprising:

a frequency analyzing step for subjecting laid inputted first digital signal to frequency analysis processing;

a first noise level calculating step for calculating an average noise level of a predetermined range of said first digital signal based on a result of the frequency analysis obtained by said frequency analyzing step;

a spectrum generating step for generating; a spectrum of a signal of high frequencies beyond the audible range based on the result of the frequency analysis obtained by said frequency analyzing step;

a second noise level calculating step for calculating a noise level of the spectrum generated by said spectrum generating step;

a normalizing and waveform synthesizing step for normalizing the noise level of the spectrum calculated by said second noise level calculating step based on the average noise level calculated by said first noise level calculating step and for synthesizing a temporal waveform signal based on the spectrum;

a first oversampling step for oversampling said first digital signal at a sampling frequency of m (m is the positive integer ≧2)×fs (Hz);

an adding step for adding the multi-bit digital signal oversampled by said first oversampling step to the signal of high frequencies beyond the audible range, the signal of high frequencies beyond the audible range having the noise level normalized by said normalizing and waveform synthesizing step and being synthesized into a waveform by said normalizing and waveform synthesizing step;

a second oversampling step for oversampling an addition output of said adding step at a sampling frequency of n (n is the positive integer ≧2)×fs (Hz); and a delta-sum modulating step for converting a multi-bit digital signal oversampled by said second oversampling step into a 1-bit digital signal.

21. A digital signal processing apparatus for converting a first digital signal having a sampling frequency of fs (Hz) and a plurality of bits as quantization bits into a second digital signal having a sampling frequency of m×n×fs and one bit as a quantization bit therein m and n are positive integers larger or equal to two, said digital signal processing apparatus comprising:

frequency analyzing means for subjecting said first digital signal inputted thereto to frequency analysis processing;

high-frequency signal generating means for generating a signal of high frequencies beyond an audible range based on a result of the frequency analysis obtained by said frequency analyzing means;

first oversampling means for oversampling said first digital signal at a sampling frequency of m (m is the positive integer ≧2)×fs (Hz)

adding means for adding the multi-bit digital signal oversampled by said first oversampling means to the signal of high frequencies generated by said high-frequency signal generating means;

second oversampling means for oversampling an addition output of said adding means at a sampling frequency of n (n is the positive integer ≧2)×fs (Hz); and delta-sum modulating means for converting a multi-bit digital signal oversampled by said second oversampling means into a 1-bit digital signal.

22. The digital signal processing apparatus as claimed in claim 21, wherein said high-frequency signal generating means comprises:

spectrum copying means for copying a spectrum in a predetermined range of the result of the frequency analysis obtained by said frequency analyzing means and generating a spectrum portion for forming the signal of high frequencies beyond the audible range by using the copied spectrum for a plurality of blocks of the signal;

frequency characteristic gradient calculating means for calculating a gradient of a frequency characteristic of said first digital signal from the result of the frequency analysis obtained by said frequency analyzing means;

gain calculating means for calculating a gain to be provided to said spectrum portion for forming the signal of high frequencies beyond the audible range, from the gradient calculated by said frequency characteristic gradient calculating means;

gain adjusting means for adjusting a gain of said spectrum portion for forming the signal of high frequencies beyond the audible range based on the gain calculated by said gain calculating means;

spectrum adding means for adding said spectrum portion for forming the signal of high frequencies beyond the audible range, said spectrum portion being adjusted in gain by said gain adjusting means, to each frequency; and a waveform synthesizing means for generating a temporal waveform signal as the signal of high frequencies beyond the audible range from the added spectrum from said spectrum adding means.

23. The digital signal processing apparatus as claimed in claim 21, wherein said high-frequency signal generating means comprises:

first noise level calculating means for calculating an average noise level of a predetermined range of said first digital signal based on the result of the frequency analysis obtained by said frequency analyzing means;

dither generating means for generating a dither signal, which is the signal of high frequencies beyond the audible range;

second noise level calculating means for calculating a noise level of the dither signal generated by said dither generating means; and normalizing means for normalizing the noise level calculated by said second noise level calculating means based on the average noise level calculated by said first noise level calculating means.

24. The digital signal processing apparatus as claimed in claim 21, therein said high-frequency signal generating means comprises:

first noise level calculating means for calculating an average noise level of a predetermined range of said first digital signal based on the result of the frequency analysis obtained by said frequency analyzing means;

spectrum generating means for generating a spectrum of the signal of high frequencies beyond the audible range based on the result of the frequency analysis obtained by said frequency analyzing means;

second noise level calculating means for calculating a noise level of the spectrum generated by said spectrum generating means; and normalizing and waveform synthesizing means for normalizing the noise level of the spectrum calculated by said second noise level calculating means based on the average noise level calculated by said first noise level calculating means and for synthesizing a temporal waveform signal based on the spectrum.

25. A digital signal processing method for converting a first digital signal having a sampling frequency of fs (Hz) and a plurality of bits as quantization bits into a second digital signal having a sampling frequency of m×n×fs and one bit as a quantization bit wherein m and n are positive integers larger or equal to two, said digital signal processing method comprising:

a frequency analyzing step for subjecting said first digital signal to frequency analysis processing;

a high-frequency signal generating step for generating a signal of high frequencies beyond the audible range based on a result of the frequency analysis obtained by said frequency analyzing step;

a first oversampling step for oversampling said first digital signal at a sampling frequency of m (m is the positive integer $\geq 2$)×fs (Hz);

an adding step for adding the multi-bit digital signal oversampled by said first oversampling step to he signal of high frequencies generated by said high-frequency signal generating step;

a second oversampling step for oversampling an addition output of said adding step at a sampling frequency of n (n is the positive integer $\geq 2$)×fs (Hz); and a delta-sum modulating step for converting a multi-bit digital signal oversampled by said second oversampling step into a 1-bit digital signal.

* * * * *